US012658675B2

(12) United States Patent
Arakida

(10) Patent No.: US 12,658,675 B2
(45) Date of Patent: Jun. 16, 2026

(54) SURFACE EMITTING LASER

(71) Applicant: SONY SEMICONDUCTOR SOLUTIONS CORPORATION, Kanagawa (JP)

(72) Inventor: Takahiro Arakida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 518 days.

(21) Appl. No.: 18/272,878

(22) PCT Filed: Jan. 7, 2022

(86) PCT No.: PCT/JP2022/000324
§ 371 (c)(1),
(2) Date: Jul. 18, 2023

(87) PCT Pub. No.: WO2022/158312
PCT Pub. Date: Jul. 28, 2022

(65) Prior Publication Data
US 2024/0088627 A1 Mar. 14, 2024

(30) Foreign Application Priority Data
Jan. 20, 2021 (JP) ................................. 2021-007060

(51) Int. Cl.
*H01S 5/30* (2006.01)
*H01S 5/183* (2006.01)
*H01S 5/32* (2006.01)
(52) U.S. Cl.
CPC ........ *H01S 5/3095* (2013.01); *H01S 5/18361* (2013.01); *H01S 5/3215* (2013.01)

(58) Field of Classification Search
CPC ................................................. H01S 5/18383
See application file for complete search history.

(56) References Cited

U.S. PATENT DOCUMENTS 6,487,231 B1 * 11/2002 Boucart .................. H01S 5/426
372/45.01
6,771,680 B2 * 8/2004 Bour .................... H01S 5/18366
372/87

(Continued)

FOREIGN PATENT DOCUMENTS

JP 2002009335 A 1/2002
JP 2004146833 A 5/2004

(Continued)

OTHER PUBLICATIONS

International Search Report from corresponding PCT application PCT/JP2022/000324, dated Feb. 15, 2022.

*Primary Examiner* — Deandra M Hughes
(74) *Attorney, Agent, or Firm* — K&L Gates LLP

(57) ABSTRACT

The present technology provides a surface emitting laser capable of reducing a voltage drop at a tunnel junction. The present technology provides a surface emitting laser including: first and second multilayer film reflectors (102, 112) laminated together; a plurality of active layers laminated together between the first and second multilayer film reflectors (102, 112); and a tunnel junction (107) disposed between first and second active layers (104, 110) adjacent to each other in a lamination direction among the plurality of active layers, in which the tunnel junction (107) includes an n-type semiconductor layer (107b) and a p-type semiconductor layer (107a) laminated together, and the p-type semiconductor layer (107a) includes first and second p-type semiconductor regions (107a1, 107a2) laminated together.

16 Claims, 59 Drawing Sheets

(56) References Cited

U.S. PATENT DOCUMENTS

| | | | | |
|---|---|---|---|---|
| 6,936,486 B2 * | 8/2005 | Cheng | H01S 5/18305 | 438/42 |
| 7,016,392 B2 * | 3/2006 | Tandon | H01S 5/3095 | 372/99 |
| 12,300,969 B2 * | 5/2025 | Arakida | H01S 5/18397 | |
| 2001/0043629 A1 | 11/2001 | Sun | | |
| 2001/0050934 A1 * | 12/2001 | Choquette | H01S 5/1833 | 372/50.11 |
| 2004/0076209 A1 * | 4/2004 | Bour | H01S 5/18366 | 372/45.01 |
| 2004/0095978 A1 * | 5/2004 | Cheng | H01S 5/18305 | 372/45.01 |
| 2004/0213310 A1 * | 10/2004 | Otoma | H01S 5/18358 | 372/96 |
| 2004/0218655 A1 * | 11/2004 | Tandon | H01S 5/3095 | 372/96 |
| 2005/0002430 A1 * | 1/2005 | Ryou | H01S 5/042 | 372/44.01 |
| 2006/0171437 A1 | 8/2006 | Takahashi | | |
| 2006/0285566 A1 * | 12/2006 | Ueki | H01S 5/18341 | 372/45.01 |
| 2009/0014712 A1 | 1/2009 | Suzuki | | |
| 2009/0285253 A1 | 11/2009 | Masui et al. | | |
| 2012/0020383 A1 | 1/2012 | Shimizu et al. | | |
| 2019/0140134 A1 | 5/2019 | Mann et al. | | |
| 2020/0403376 A1 * | 12/2020 | Weichmann | H01S 5/3095 | |
| 2020/0406544 A1 * | 12/2020 | Rubin Ben Haim | | G03G 15/342 |
| 2022/0416506 A1 * | 12/2022 | Yu | H01S 5/3095 | |

FOREIGN PATENT DOCUMENTS

| | | | |
|---|---|---|---|
| JP | 2004336039 A | 11/2004 | |
| JP | 2006216681 A | 8/2006 | |
| JP | 2006351798 A | 12/2006 | |
| JP | 2009277815 A | 11/2009 | |
| JP | 2012044161 A | 3/2012 | |
| WO | WO-2023153084 A1 * | 8/2023 | H01S 5/3416 |

* cited by examiner

LAMINATE GENERATION PROCESS 1

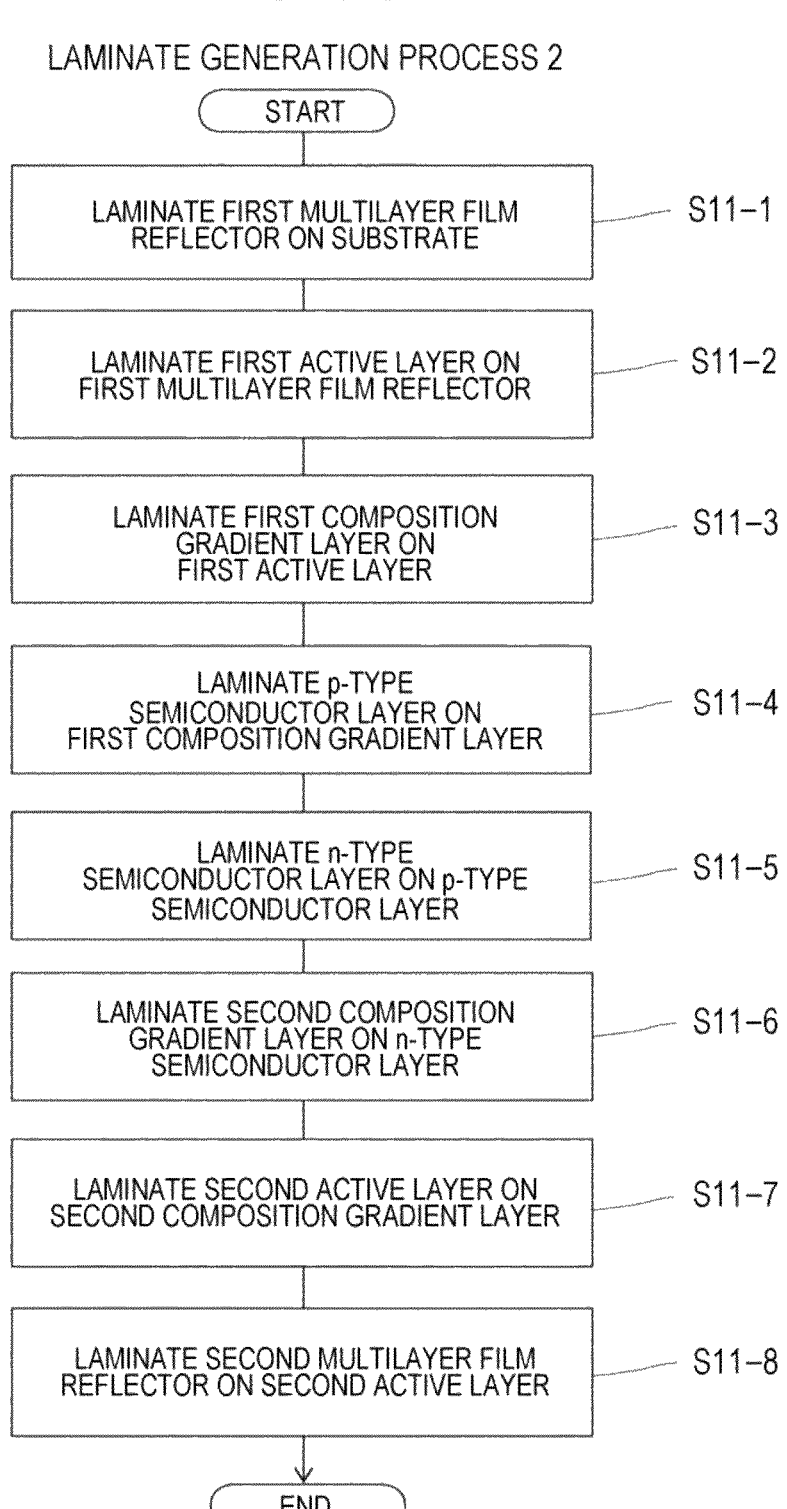

*FIG. 29*

LAMINATE GENERATION PROCESS 2

START

LAMINATE FIRST MULTILAYER FILM
REFLECTOR ON SUBSTRATE — S11-1

LAMINATE FIRST ACTIVE LAYER ON
FIRST MULTILAYER FILM REFLECTOR — S11-2

LAMINATE FIRST COMPOSITION
GRADIENT LAYER ON
FIRST ACTIVE LAYER — S11-3

LAMINATE p-TYPE
SEMICONDUCTOR LAYER ON
FIRST COMPOSITION GRADIENT LAYER — S11-4

LAMINATE n-TYPE
SEMICONDUCTOR LAYER ON p-TYPE
SEMICONDUCTOR LAYER — S11-5

LAMINATE SECOND COMPOSITION
GRADIENT LAYER ON n-TYPE
SEMICONDUCTOR LAYER — S11-6

LAMINATE SECOND ACTIVE LAYER ON
SECOND COMPOSITION GRADIENT LAYER — S11-7

LAMINATE SECOND MULTILAYER FILM
REFLECTOR ON SECOND ACTIVE LAYER — S11-8

END

FIG. 56
A
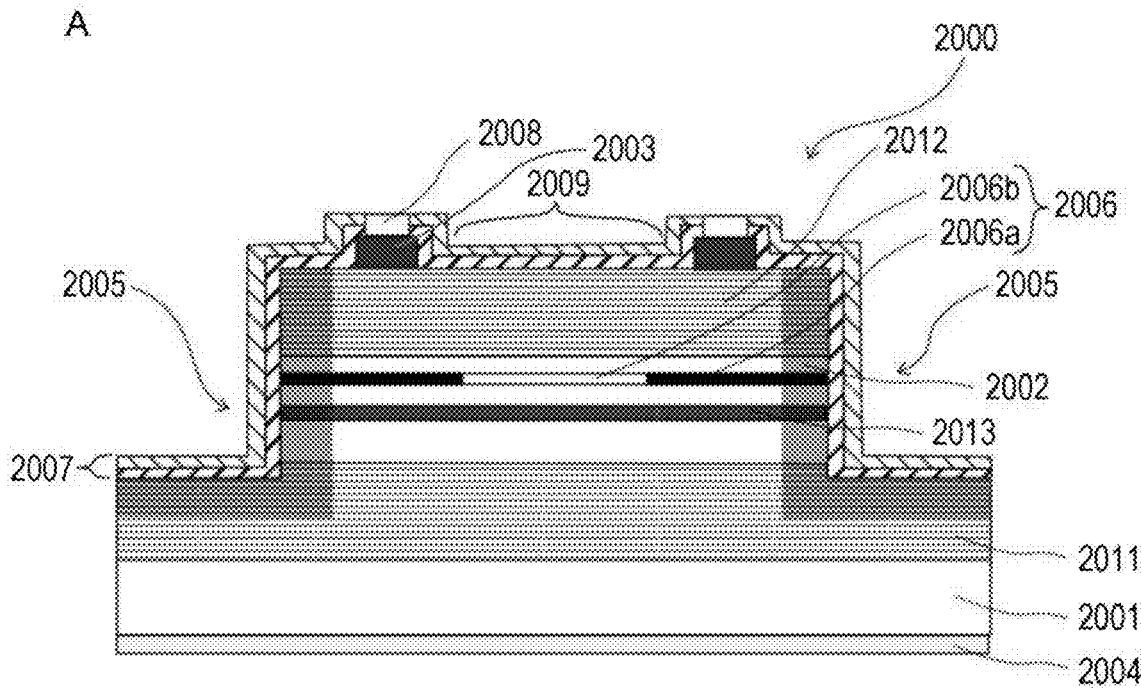
B
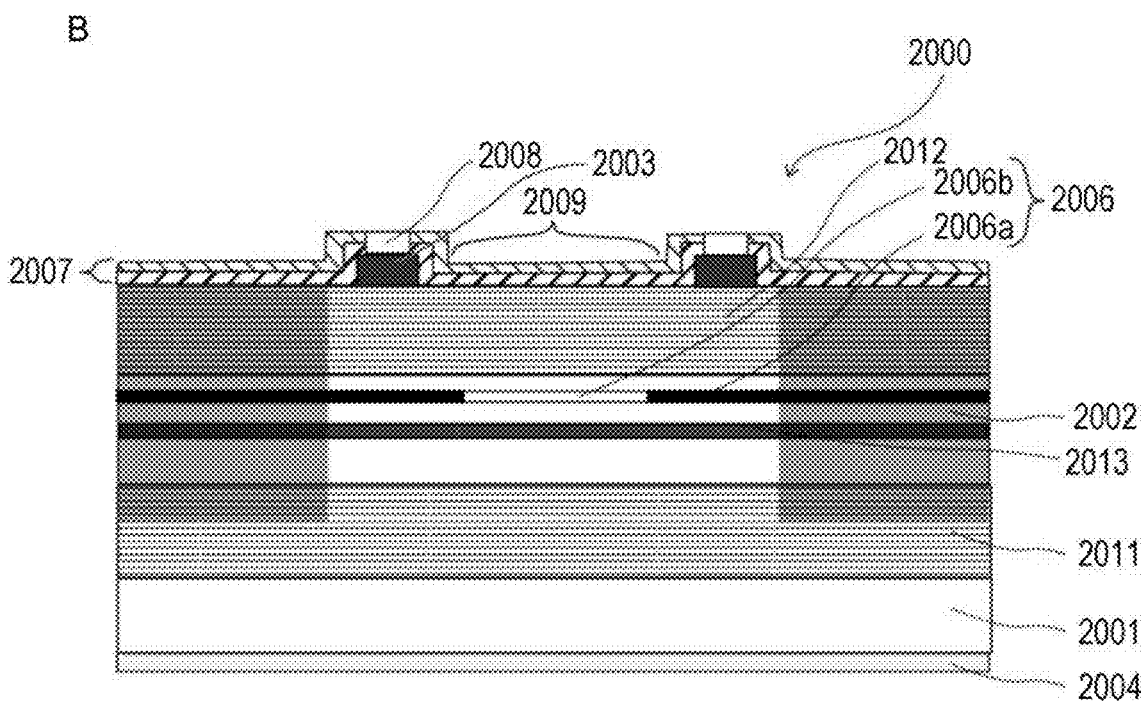

SURFACE EMITTING LASER

TECHNICAL FIELD

The technology according to the present disclosure (here-inafter also referred to as "the present technology") relates to a surface emitting laser.

BACKGROUND ART

Conventionally, a surface emitting laser in which a plurality of active layers is laminated together between first and second multilayer film reflectors is known. Some surface emitting lasers include a tunnel junction between two active layers adjacent to each other in a lamination direction (see, for example, Patent Document 1).

CITATION LIST

Patent Document

Patent Document 1: Japanese Patent Application Laid-Open No. 2006-351798

SUMMARY OF THE INVENTION

Problems to be Solved by the Invention

However, in the conventional surface emitting laser, there is room for improvement in reducing a voltage drop at the tunnel junction.

Therefore, a main object of the present technology is to provide a surface emitting laser capable of reducing a voltage drop at a tunnel junction.

Solutions to Problems

The present technology provides a surface emitting laser including:

first and second multilayer film reflectors;

a plurality of active layers laminated together between the first and second multilayer film reflectors; and a tunnel junction disposed between first and second active layers adjacent to each other in a lamination direction among the plurality of active layers, in which the tunnel junction includes an n-type semiconductor layer and a p-type semiconductor layer laminated together, and the p-type semiconductor layer includes first and second p-type semiconductor regions laminated together.

The first p-type semiconductor region may be disposed between the n-type semiconductor layer and the second p-type semiconductor region.

The first p-type semiconductor region may be in contact with the n-type semiconductor layer.

The second p-type semiconductor region may be in contact with the first p-type semiconductor region.

Carrier concentrations of the first p-type semiconductor region and the second p-type semiconductor region may be different from each other.

Band gaps of the first p-type semiconductor region and the second p-type semiconductor region may be different from each other.

A carrier concentration of the second p-type semiconductor region may be higher than a carrier concentration of the first p-type semiconductor region.

A band gap of the first p-type semiconductor region may be smaller than a band gap of the second p-type semiconductor region.

The surface emitting laser may further include a composition gradient layer disposed between the first active layer and the tunnel junction and/or between the second active layer and the tunnel junction.

A spacer layer disposed between an active layer and the composition gradient layer may be further included, the active layer having the composition gradient layer disposed between the tunnel junction and one of the first and second active layers.

The plurality of active layers may be at least three active layers including the first and second active layers, the tunnel junction may be disposed between two adjacent active layers of each set of a plurality of sets of two adjacent active layers among the plurality of active layers, and a composition gradient layer may be disposed between at least one tunnel junction among a plurality of the tunnel junctions and at least one of the two adjacent active layers sandwiching the one tunnel junction.

The first p-type semiconductor region may be formed by a GaAs compound semiconductor, an AlGaAs-based compound semiconductor, or an InGaAs-based compound semiconductor.

The second p-type semiconductor region may be formed by a GaAs compound semiconductor, an AlGaInAs-based compound semiconductor, or an AlGaAs-based compound semiconductor.

Al compositions of the first p-type semiconductor region and the second p-type semiconductor region may be different from each other.

An Al composition of the second p-type semiconductor region may be higher than an Al composition of the first p-type semiconductor region.

The first p-type semiconductor region and/or the second p-type semiconductor region may be doped with at least one of C, Zn, Mg, or Be.

BRIEF DESCRIPTION OF DRAWINGS

FIG. 5 is a second lamination step diagram of the laminate generation process 1.

FIG. 7 is a fourth lamination step diagram of the laminate generation process 1.

FIG. 10 is a seventh lamination step diagram of the laminate generation process 1.

FIG. 11 is an eighth lamination step diagram of the laminate generation process 1.

FIG. 29 is a flowchart for describing a first step (laminate generation process 2) in FIG. 28.

FIG. 30 is a fourth lamination step diagram of the laminate generation process 2.

FIG. 31 is a fifth lamination step diagram of the laminate generation process 2.

FIG. 32 is a sixth lamination step diagram of the laminate generation process 2.

FIG. 33 is a seventh lamination step diagram of the laminate generation process 2.

FIG. 34 is an eighth lamination step diagram of the laminate generation process 2.

FIG. 56A is a cross-sectional view along line X-X of FIG. 55. FIG. 56B is a cross-sectional view along line Y-Y of FIG. 55.

MODE FOR CARRYING OUT THE INVENTION

Figure 1:
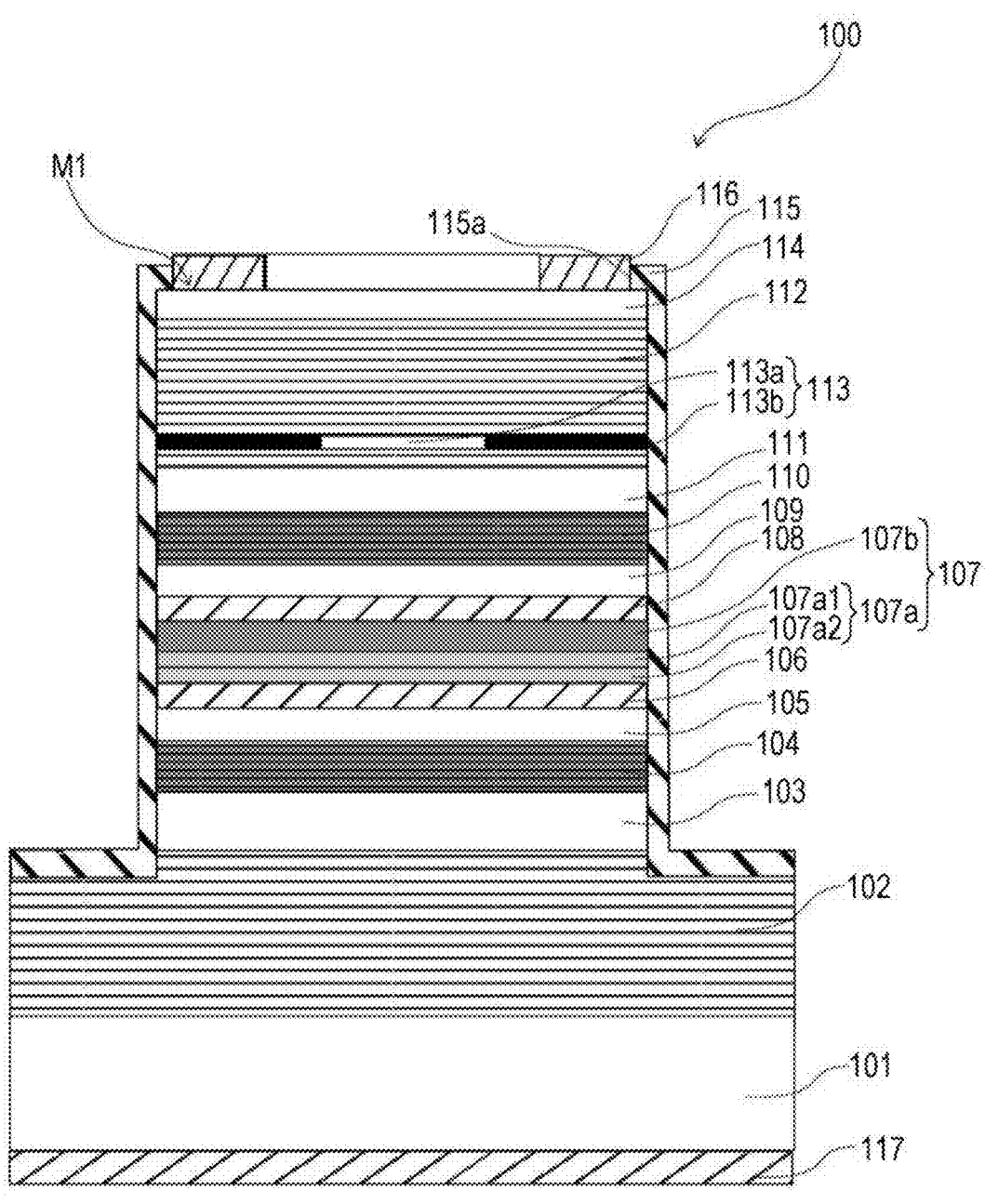
FIG. 1 is a cross-sectional view illustrating a configuration of a surface emitting laser according to a first embodiment of the present technology.

Hereinafter, preferred embodiments of the present technology will be described in detail with reference to the accompanying drawings. Note that, in the present specification and the drawings, components having substantially the same functional configuration are denoted by the same reference numerals, and redundant description will be omitted. The embodiments described below illustrate representative embodiments of the present technology, and the scope of the present technology is not to be narrowly interpreted according to these embodiments. In the present specification, even in a case where it is described that a surface emitting laser according to the present technology exhibits a plurality of effects, it is sufficient if the surface emitting laser according to the present technology exhibits at least one effect. The effects described in the present specification are merely examples and are not limiting, and other effects may be provided.

In addition, description will be given in the following order.

1. Surface Emitting Laser According to First Embodiment of Present Technology
(1) Configuration of Surface Emitting Laser
(2) Operation of Surface Emitting Laser
(3) Method for Manufacturing Surface Emitting Laser
(4) Effects of Surface Emitting Laser
2. Surface Emitting Lasers According to Modifications 1 to 8 of First Embodiment of Present Technology
3. Surface Emitting Laser According to Second Embodiment of Present Technology
(1) Configuration of Surface Emitting Laser
(2) Operation of Surface Emitting Laser
(3) Method for Manufacturing Surface Emitting Laser
(4) Effects of Surface Emitting Laser
4. Surface Emitting Lasers According to Modifications 1 to 14 of Second Embodiment of Present Technology
5. Configuration Example of Surface Emitting Laser to Which Present Technology Can Be Applied
6. Modification of Present Technology
7. Application Example to Electronic Device
8. Example in Which Surface Emitting Laser Is Applied to Distance Measuring Device
9. Example in Which Distance Measuring Device Is Mounted on Mobile Body 1. Surface Emitting Laser According to First Embodiment of Present Technology (1) Configuration of Surface Emitting Laser FIG. 1 is a cross-sectional view illustrating a configuration of a surface emitting laser 100 according to a first embodiment of the present technology. Hereinafter, for the sake of convenience, the upper part in the cross-sectional view of FIG. 1 and the like will be described as an upper side, and the lower part in the cross-sectional view of FIG. 1 and the like will be described as a lower side.

As an example, as illustrated in FIG. 1, the surface emitting laser 100 includes first and second multilayer film reflectors 102 and 112, a plurality of (for example, two) active layers 104 and 110, and a tunnel junction 107.

As an example, each component of the surface emitting laser 100 is formed on a substrate 101 (semiconductor substrate).

As an example, the first and second multilayer film reflectors 102 and 112 are laminated together on the substrate 101. Here, the second multilayer film reflector 112 is disposed above the first multilayer film reflector 102. The plurality of (for example, two) active layers 104 and 110 is laminated together between the first and second multilayer film reflectors 102 and 112. The tunnel junction 107 is disposed between the first and second active layers 104 and 110 adjacent to each other in the lamination direction (vertical direction) among the plurality of active layers 104 and 110.

In the surface emitting laser 100, as an example, the first multilayer film reflector 102, the first active layer 104, the tunnel junction 107, the second active layer 110, and the second multilayer film reflector 112 are laminated in that order from the substrate 101 side on the substrate 101.

Here, a resonator includes the first and second active layers 104 and 110 and the tunnel junction 107. Furthermore, a resonator structure includes the first multilayer film reflector 102, the resonator, and the second multilayer film reflector 112.

As an example, a mesa M1 including a part (upper portion) of the first multilayer film reflector 102, the first and second active layers 104 and 110, the tunnel junction 107, and the second multilayer film reflector 112 is formed on the substrate 101. As an example, the mesa M1 constitutes a resonator structure (excluding the other part (lower part) of the first multilayer film reflector 102). The mesa M1 has, for example, a substantially cylindrical shape, but may have another columnar shape such as a substantially elliptical columnar shape or a polygonal columnar shape. The height direction of the mesa M1 substantially coincides with the lamination direction.

As an example, the surface emitting laser 100 emits light from the top of the mesa M1. That is, as an example, the surface emitting laser 100 is a front surface emitting type surface emitting laser.

The surface emitting laser 100 further includes a first composition gradient layer 106 between the tunnel junction 107 and the first active layer 104, and a second composition gradient layer 108 between the tunnel junction 107 and the second active layer 110.

The surface emitting laser 100 further includes a first spacer layer 105 disposed between the first active layer 104 and the first composition gradient layer 106, the first active layer 104 being an active layer having the first composition gradient layer 106 disposed between the tunnel junction 107 and one of the first and second active layers 104 and 110.

The surface emitting laser 100 further includes a second spacer layer 109 disposed between the second active layer 110 and the second composition gradient layer 108, the second active layer 110 being an active layer having the second composition gradient layer 108 disposed between the tunnel junction 107 and one of the first and second active layers 104 and 110.

[Substrate]

As an example, the substrate 101 is a semiconductor substrate (for example, a GaAs substrate) of a first conductivity type (for example, n-type). A cathode electrode 117, which is an n-side electrode, is provided on the back surface (lower surface) of the substrate 101.

The cathode electrode 117 is formed by AuGe/Ni/Au, as an example.

[First Multilayer Film Reflector]

As an example, the first multilayer film reflector 102 is disposed on the substrate 101.

As an example, the first multilayer film reflector 102 is a semiconductor multilayer film reflector. The multilayer film reflector is also referred to as a distributed Bragg reflector. A semiconductor multilayer film reflector, which is a type of multilayer film reflector (distributed Bragg reflector), has low light absorption, high reflectance, and conductivity.

More specifically, as an example, the first multilayer film reflector 102 is a semiconductor multilayer film reflector of a first conductivity type (for example, n-type), and has a structure in which a plurality of types (for example, two types) of semiconductor layers having different refractive indexes are alternately laminated with an optical thickness of a 1/4 wavelength of an oscillation wavelength. Each refractive index layer of the first multilayer film reflector 102 is formed by an AlGaAs-based compound semiconductor of the first conductivity type (for example, n-type).

[First Active Layer]

As an example, the first active layer 104 is disposed on the first multilayer film reflector 102 via a first cladding layer 103 (for example, an $Al_{0.40}GaAs$ layer having a film thickness of 30 nm) formed by a non-doped AlGaAs-based compound semiconductor.

As an example, the first active layer 104 has a laminated structure in which an active region formed by a non-doped InGaAs-based compound semiconductor (for example, $In_{0.10}GaAs$) and a guide/barrier region (where both ends in the lamination direction are guide regions, and an intermediate portion in the lamination direction is a barrier region) formed by a non-doped AlGaAs-based compound semiconductor (for example, $Al_{0.10}GaAs$) are alternately laminated. Here, as an example, the first active layer 104 has two layers of guide regions, two layers of barrier regions, and three layers of active regions, and both ends in the lamination direction are guide regions.

The thickness of each active region is, for example, 7 nm. The thickness of the guide regions at both ends in the lamination direction is, for example, 10 nm. The thickness of the intermediate barrier region in the lamination direction is, for example, 8 nm.

Since the first active layer 104 has the laminated structure, it is possible to perform laser oscillation with an oscillation wavelength in a 900 nm band, for example.

[First Composition Gradient Layer]

As an example, the first composition gradient layer 106 is disposed on the first active layer 104 via the first spacer layer 105 (for example, an $Al_{0.40}GaAs$ layer having a thickness of 14 nm) formed by a non-doped AlGaAs-based compound semiconductor.

The first composition gradient layer 106 includes a semiconductor layer of a second conductivity type (for example, p-type) having a relatively high carrier concentration. As the first composition gradient layer 106, for example, an AlGaAs-based compound semiconductor doped with carbon (C) at a relatively high concentration (for example, $6\times10^{17}$ $cm^{-3}$) can be used.

In the first composition gradient layer 106, the Al composition decreases continuously (gradually) or stepwise (discontinuously) from the first active layer 104 side to the tunnel junction 107 side.

The Al composition of the first composition gradient layer 106 changes continuously or stepwise in a range of, for example, 0.05 to 0.40.

The thickness of the first composition gradient layer 106 can be, for example, 10 nm.

As an example in which the Al composition changes stepwise, the first composition gradient layer 106 may include an $Al_{0.35}GaAs$ layer having a film thickness of 3 nm, an $Al_{0.20}GaAs$ layer having a film thickness of 4 nm, and an $Al_{0.05}GaAs$ layer having a film thickness of 3 nm in that order from the first active layer 104 side to the tunnel junction 107 side.

[Tunnel Junction]

The tunnel junction 107 is disposed on the first composition gradient layer 106 as an example.

The tunnel junction 107 includes a p-type semiconductor layer 107a and an n-type semiconductor layer 107b laminated together. As an example, the p-type semiconductor layer 107a is disposed on the substrate 101 side (lower side) of the n-type semiconductor layer 107b.

(n-Type Semiconductor Layer)

As an example, the n-type semiconductor layer 107b is formed by an n-type InGaAs-based compound semiconductor having a high carrier concentration. As the n-type semiconductor layer 107b, for example, an $In_{0.10}GaAs$ layer doped with silicon (Si) at a high concentration (for example, $5\times10^{19}$ $cm^{-3}$) and having a thickness of 20 nm can be used. The InGaAs-based compound semiconductor has a band gap smaller than that of, for example, an AlGaAs-based compound semiconductor.

(p-Type Semiconductor Layer)

The p-type semiconductor layer 107a includes first and second p-type semiconductor regions 107a1 and 107a2 laminated together.

The first p-type semiconductor region 107a1 is disposed between the n-type semiconductor layer 107b and the second p-type semiconductor region 107a2. Here, as an example, the second p-type semiconductor region 107a2 is disposed on the substrate 101 side (lower side) of the first p-type semiconductor region 107a1.

As an example, the first p-type semiconductor region 107a1 is in contact with the n-type semiconductor layer 107b. As an example, the second p-type semiconductor region 107a2 is in contact with the first p-type semiconductor region 107a1.

Here, in order to reduce the voltage drop at the tunnel junction (in order to reduce the resistance), it is desirable that a band gap of a region in contact with the n-type semiconductor layer in the p-type semiconductor layer of the tunnel junction (a region forming a pn junction with the n-type semiconductor layer) be small. For example, the band gap of the first p-type semiconductor region 107a1 is preferably smaller than the band gap of the second p-type semiconductor region 107a2.

Furthermore, it is desirable that a region in contact with the n-type semiconductor layer in the p-type semiconductor layer of the tunnel junction have a high carrier concentration (doping concentration).

However, it is difficult to increase the carrier concentration while maintaining a small band gap.

Therefore, in a case where a material having a small band gap is used for a region in contact with the n-type semiconductor layer in the p-type semiconductor layer of the tunnel junction, it is desirable to increase the carrier concentration in other regions.

Specifically, as in the present technology, it is effective to configure the p-type semiconductor layer with a plurality of p-type semiconductor regions laminated together. This is so that the plurality of p-type semiconductor regions can have different characteristics.

More specifically, in a case where a material having a small band gap is used for the first p-type semiconductor region 107a1, it is preferable to use a material having a high carrier concentration for the second p-type semiconductor region 107a2. For example, the carrier concentration of the second p-type semiconductor region 107a2 is preferably higher than the carrier concentration of the first p-type semiconductor region 107a1. For example, the Al composition of the second p-type semiconductor region 107a2 is preferably higher than the Al composition of the first p-type semiconductor region 107a1. This is so that the carrier concentration can be increased as the Al composition is higher.

Incidentally, for example, in a case where an AlGaAs-based compound semiconductor or an InGaAs-based compound semiconductor containing GaAs is used for the p-type semiconductor layer, a higher level of doping is possible when the Al composition is higher, but the band gap becomes larger. Therefore, it is preferable to select a material used for each p-type semiconductor region in consideration of such a trade-off relationship.

As an example, the first p-type semiconductor region 107a1 is formed by a p-type GaAs-based compound semiconductor, an AlGaAs-based compound semiconductor, or an InGaAs-based compound semiconductor having a high carrier concentration. The first p-type semiconductor region 107a1 is preferably doped with at least one of C, Zn, Mg, or Be. As the first p-type semiconductor region 107a1, for example, a GaAs layer doped with carbon (C) at a high concentration (for example, $1\times10^{20}$ $cm^{-3}$) and having a thickness of, for example, 5 nm can be used. The GaAs layer has a band gap smaller than that of the AlGaAs layer.

As an example, the second p-type semiconductor region 107a2 is in contact with the first composition gradient layer 106.

As an example, the second p-type semiconductor region 107a2 is formed by a p-type GaAs-based compound semiconductor, an AlGaInAs-based compound semiconductor, or an AlGaAs-based compound semiconductor having a high carrier concentration. The second p-type semiconductor region 107a2 is preferably doped with at least one of C, Zn, Mg, or Be. As the second p-type semiconductor region 107a2, for example, an $Al_{0.05}GaAs$ layer doped with C at a high concentration (for example, $3 \times 10^{20}$ cm$^{-3}$) and having a thickness of, for example, 5 nm can be used.

[Second Composition Gradient Layer]

As an example, the second composition gradient layer 108 is disposed on the tunnel junction 107.

The second composition gradient layer 108 includes a semiconductor layer of a first conductivity type (for example, n-type) having a relatively high carrier concentration. Examples of the second composition gradient layer 108 include an AlGaAs-based compound semiconductor doped with Si at a relatively high concentration (for example, $6 \times 17$ cm$^{-3}$).

In the second composition gradient layer 108, the Al composition decreases continuously (gradually) or stepwise (discontinuously) from the second active layer 110 side to the tunnel junction 107 side.

The Al composition of the second composition gradient layer 108 changes continuously or stepwise in a range of, for example, 0.05 to 0.40.

The total film thickness of the second composition gradient layer 108 can be, for example, 10 nm.

As an example in which the Al composition changes stepwise, the second composition gradient layer 108 may include an $Al_{0.35}GaAs$ layer having a film thickness of 3 nm, an $Al_{0.20}GaAs$ layer having a film thickness of 4 nm, and an $Al_{0.05}GaAs$ layer having a film thickness of 3 nm in that order from the second active layer 110 side to the tunnel junction 107 side.

[Second Active Layer]

As an example, the second active layer 110 is disposed on the second composition gradient layer 108 via the second spacer layer 108 (for example, an $Al_{0.40}GaAs$ film having a film thickness of 14 nm) formed by a non-doped AlGaAs-based compound semiconductor.

As an example, the second active layer 110 has a layer configuration similar to that of the first active layer 104. That is, as an example, the second active layer 110 has a laminated structure in which an active region formed by a non-doped InGaAs-based compound semiconductor (for example, $In_{0.10}GaAs$) and a guide/barrier region (where both ends in the lamination direction are guide regions, and an intermediate portion in the lamination direction is a barrier region) formed by a non-doped AlGaAs-based compound semiconductor (for example, $Al_{0.10}GaAs$) are alternately laminated. Here, the second active layer 110 has, for example, two layers of guide regions, two layers of barrier regions, and three layers of active regions, and both ends in the lamination direction are guide regions.

The film thickness of each active region is, for example, 7 nm. The film thickness of the guide regions at both ends in the lamination direction is, for example, 10 nm. The film thickness of the intermediate barrier region in the lamination direction is, for example, 8 nm.

Since the second active layer 110 has the laminated structure, it is possible to perform laser oscillation with an oscillation wavelength in a 900 nm band, for example.

[Second Multilayer Film Reflector]

As an example, the second multilayer film reflector 112 is disposed on the second active layer 110 via a second cladding layer 111 (for example, an $Al_{0.40}GaAs$ layer having a film thickness of 30 nm) formed by a non-doped AlGaAs-based compound semiconductor.

As an example, the second multilayer film reflector 112 is a semiconductor multilayer film reflector. The multilayer film reflector is also referred to as a distributed Bragg reflector. A semiconductor multilayer film reflector, which is a type of multilayer film reflector (distributed Bragg reflector), has low light absorption, high reflectance, and conductivity.

More specifically, as an example, the second multilayer film reflector 112 is a semiconductor multilayer film reflector of a second conductivity type (for example, p-type), and has a structure in which a plurality of types (for example, two types) of semiconductor layers having different refractive indexes are alternately laminated with an optical thickness of a ¼ wavelength of an oscillation wavelength. Each refractive index layer of the second multilayer film reflector 112 is formed by an AlGaAs-based compound semiconductor of the second conductivity type (for example, p-type).

A current confinement layer 113 (oxide confinement layer) is disposed inside the second multilayer film reflector 112. As an example, the current confinement layer 113 includes a non-oxidized region 113a formed by an AlGaAs-based compound semiconductor (for example, AlGaAs, AlAs, or the like) of the second conductivity type (for example, n-type) and an oxidized region 113b formed by an oxide of an AlGaAs-based compound semiconductor (for example, $Al_2O_3$) surrounding the non-oxidized region 113a. It is preferable to use an AlGaAs film having an Al composition of 90% or more as a base material of the current confinement layer 113 (a selected oxide layer 113S to be described later).

A contact layer 114 formed by a GaAs layer of the second conductivity type (for example, p-type) is disposed on the second multilayer film reflector 112.

The mesa M1 is covered with an insulating film 115 except for a part thereof. The insulating film 115 is formed by a dielectric such as $SiO_2$, SiN, or SiON.

A contact hole 115a is formed in the insulating film 115 on the top (for example, the upper surface of the contact layer 114) of the mesa M1, and an annular anode electrode 116, which is a p-side electrode, is provided in the contact hole 115a in contact with the top of the mesa M1. As an example, the anode electrode 116 is disposed in the contact hole 115a such that the center thereof substantially coincides with the center of the current confinement layer 113 as viewed from the lamination direction. An inner diameter side of the anode electrode 116 serves as an emission port of laser light.

As an example, the anode electrode 116 is formed by Ti/Pt/Au.

(2) Operation of Surface Emitting Laser

In the surface emitting laser 100, if a voltage is applied between the anode electrode 116 and the cathode electrode 117 and a current flows into the anode electrode 116, the current is confined by the current confinement layer 113 and injected into the second active layer 110, and a current having substantially the same current value as the injected current is injected into the first active layer 104 due to a tunnel effect by the tunnel junction 107. Accordingly, when the first and second active layers 104 and 110 emit light with substantially the same emission intensity, and these light beams reciprocate while being amplified by the respective active layers between the first and second multilayer film reflectors 102 and 112 to satisfy the oscillation conditions, the light beams are emitted as laser light from the top of the mesa M1.

(3) Method for Manufacturing Surface Emitting Laser

Figure 2:
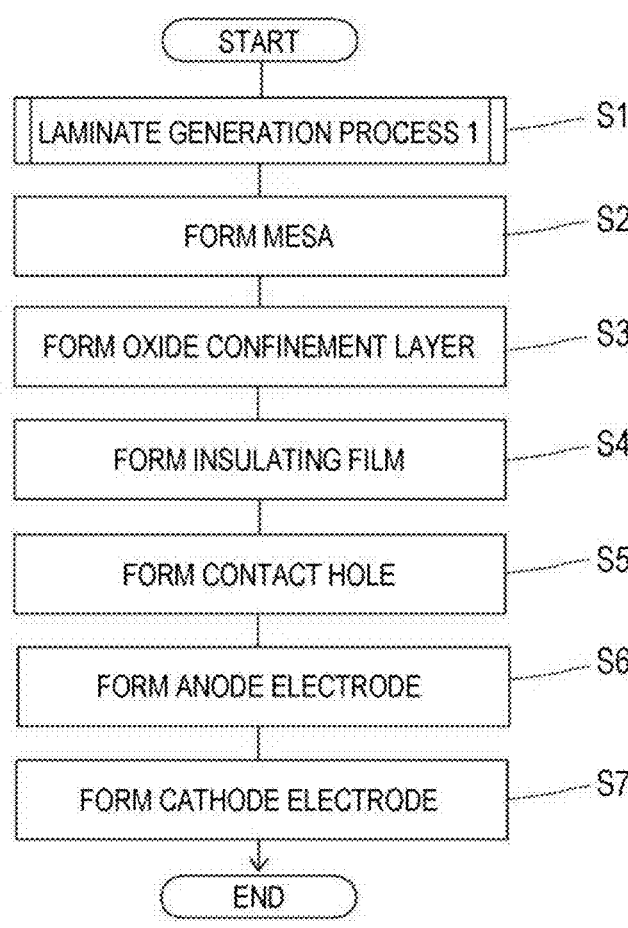
FIG. 2 is a flowchart for describing a method for manufacturing the surface emitting laser according to the first embodiment of the present technology.
Figure 3:
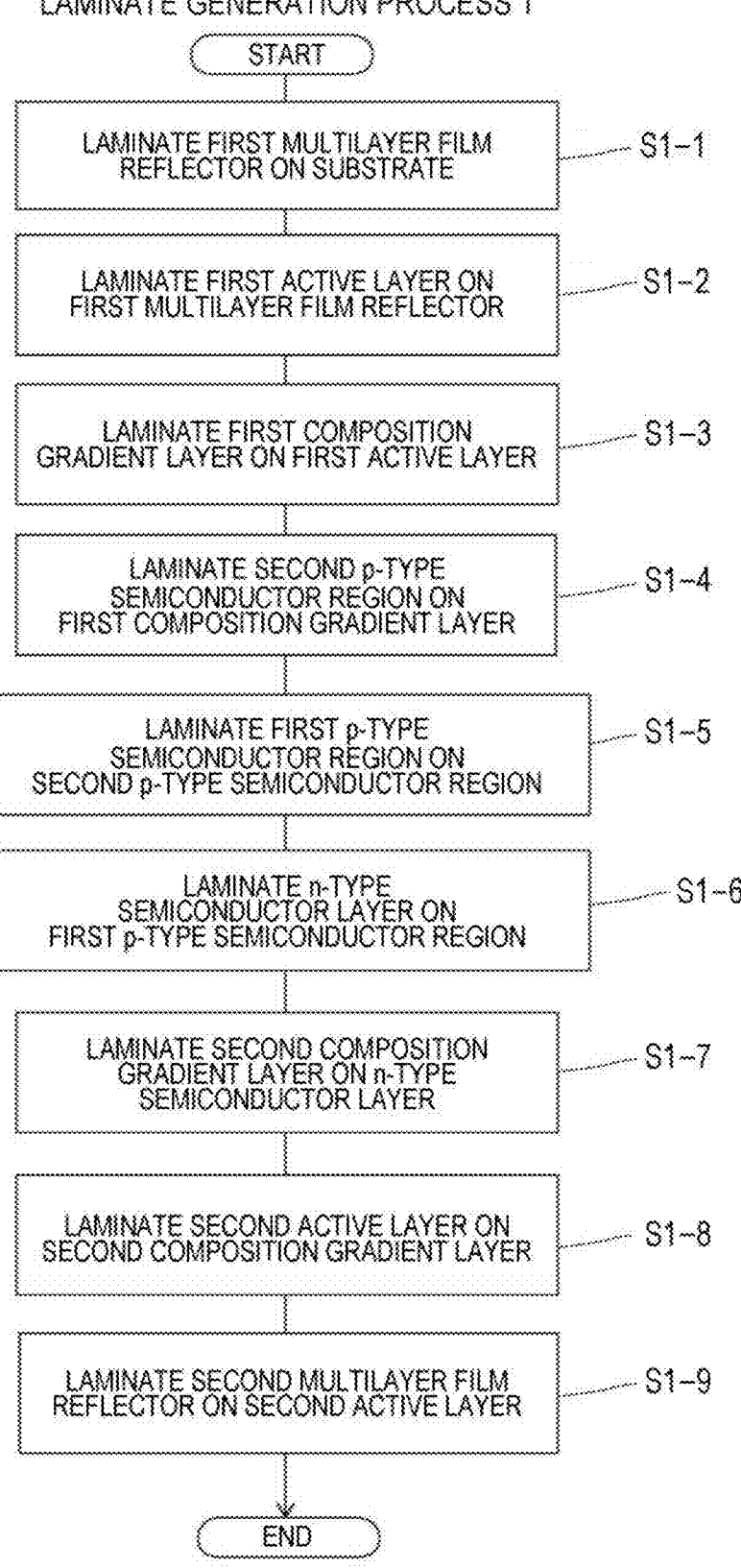
FIG. 3 is a flowchart for describing a first step (laminate generation process 1) in FIG. 2.

Hereinafter, a method for manufacturing the surface emitting laser 100 will be described with reference to the flowchart (steps S1 to S7) in FIG. 2. Here, as an example, a plurality of surface emitting laser arrays in which a plurality of surface emitting lasers 100 is two-dimensionally arranged is simultaneously generated on one wafer which is a base material of the substrate 101 by a semiconductor manufacturing method using a semiconductor manufacturing apparatus. Next, a series of a plurality of integrated surface emitting laser arrays is separated from each other to obtain a plurality of chip-shaped surface emitting laser arrays (surface emitting laser array chips). Note that, by the manufacturing method described below, it is also possible to simultaneously generate a plurality of surface emitting lasers 100 on one wafer which is a base material of the substrate 101, and separate a series of the plurality of integrated surface emitting lasers 100 from each other to obtain a chip-shaped surface emitting laser (surface emitting laser chip).

<Step S1>

In step S1, a laminate generation process 1 is performed. In the laminate generation process 1, as an example, materials of layers constituting the surface emitting laser 100 are sequentially laminated in a growth chamber by a chemical vapor deposition (CVD) method, for example, a metal organic chemical vapor deposition (MOCVD) method to generate a laminate L1 (see FIG. 12).

The laminate generation process 1 (step S1 in FIG. 2) will be described with reference to the flowchart in FIG. 3 and FIGS. 4 to 12.

Figure 4:
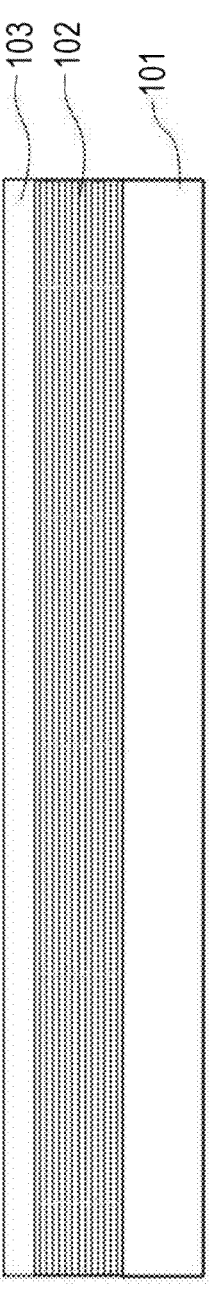
FIG. 4 is a first lamination step diagram of a laminate generation process 1.

In the first step S1-1, the first multilayer film reflector 102 is laminated on the substrate 101 (see FIG. 4). Further, the first cladding layer 103 is laminated on the first multilayer film reflector 102.

Figure 5:
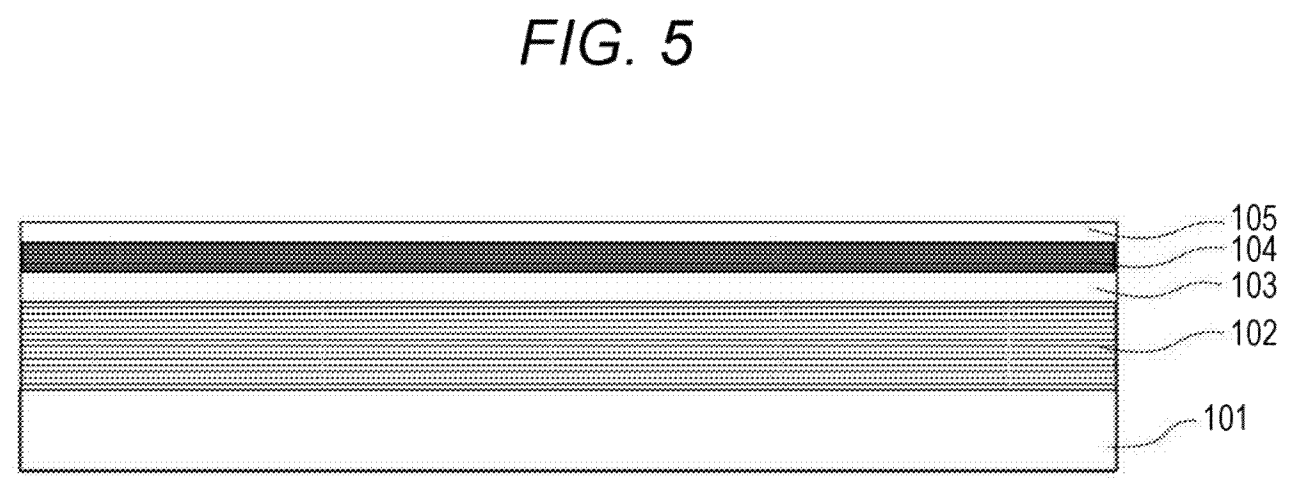

In the next step S1-2, the first active layer 104 is laminated on the first multilayer film reflector 102 (see FIG. 5). More specifically, the first active layer 104 is laminated on the first cladding layer 103.

Further, the first spacer layer 105 is laminated on the first active layer 104.

Figure 6:
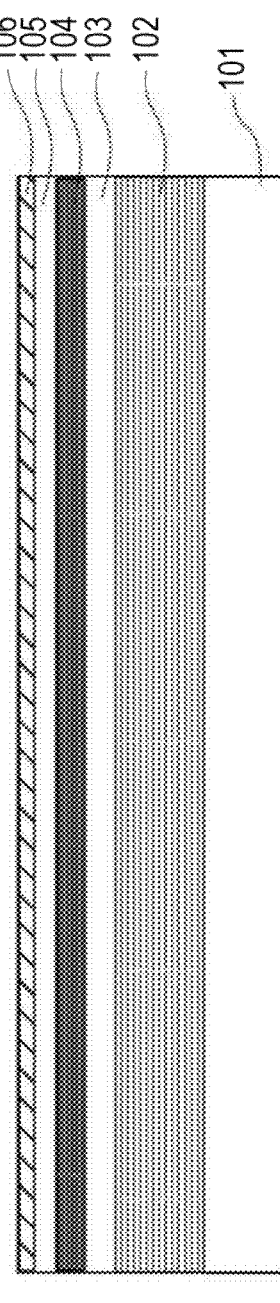
FIG. 6 is a third lamination step diagram of the laminate generation process 1.

In the next step S1-3, the first composition gradient layer 106 is laminated on the first active layer 104 (see FIG. 6). More specifically, the first composition gradient layer 106 is laminated on the first spacer layer 105.

Figure 7:
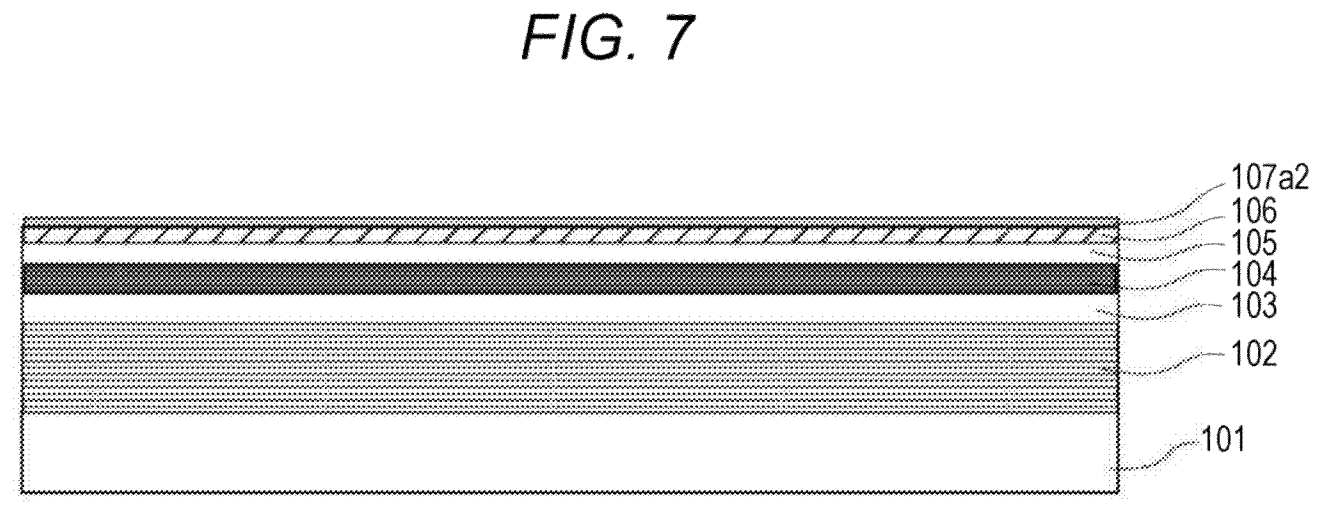

In the next step S1-4, the second p-type semiconductor region 107a2 is laminated on the first composition gradient layer 106 (see FIG. 7).

Figure 8:
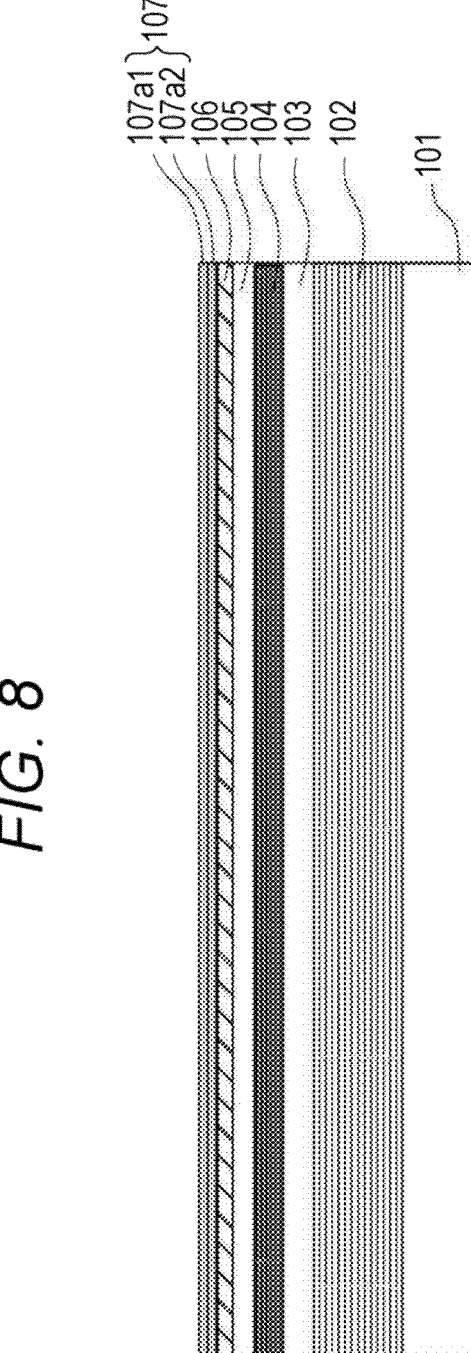
FIG. 8 is a fifth lamination step diagram of the laminate generation process 1.

In the next step S1-5, the first p-type semiconductor region 107a1 is laminated on the second p-type semiconductor region 107a2 (see FIG. 8). As a result, the p-type semiconductor layer 107a is formed.

Figure 9:
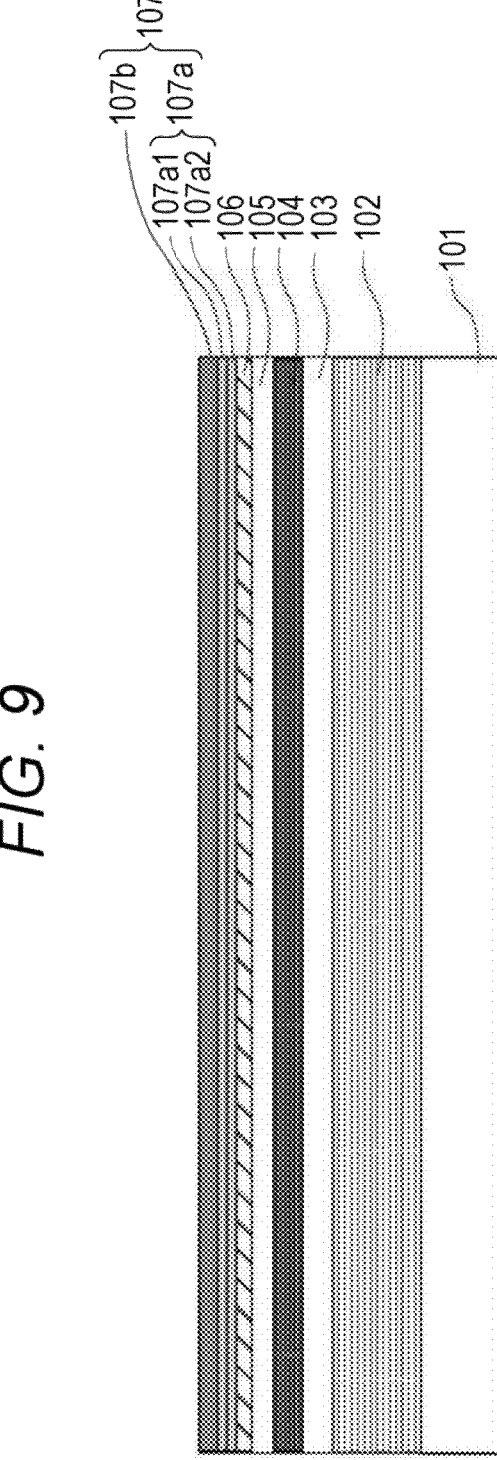
FIG. 9 is a sixth lamination step diagram of the laminate generation process 1.

In the next step S1-6, the n-type semiconductor layer 107b is laminated on the first p-type semiconductor region 107a1 (see FIG. 9). As a result, the tunnel junction 107 is formed.

Figure 10:
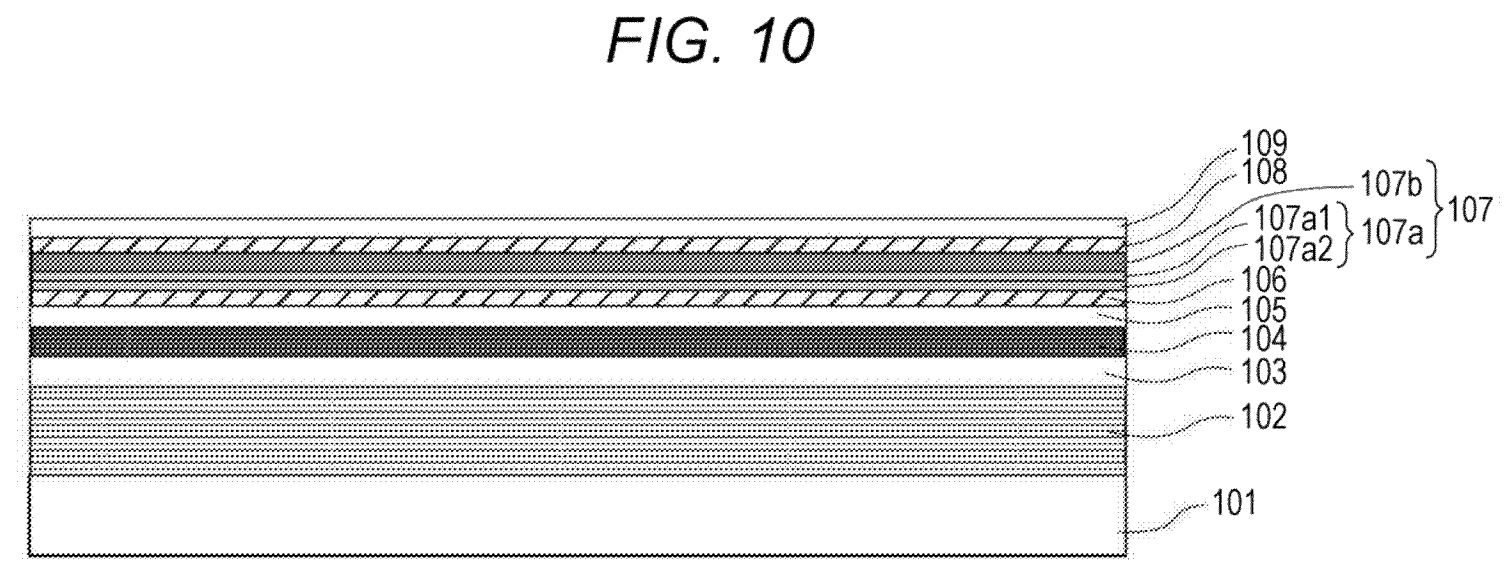

In the next step S1-7, the second composition gradient layer 108 is laminated on the n-type semiconductor layer 107b (see FIG. 10). Further, the second spacer layer 109 is laminated on the second composition gradient layer 108.

Figure 11:
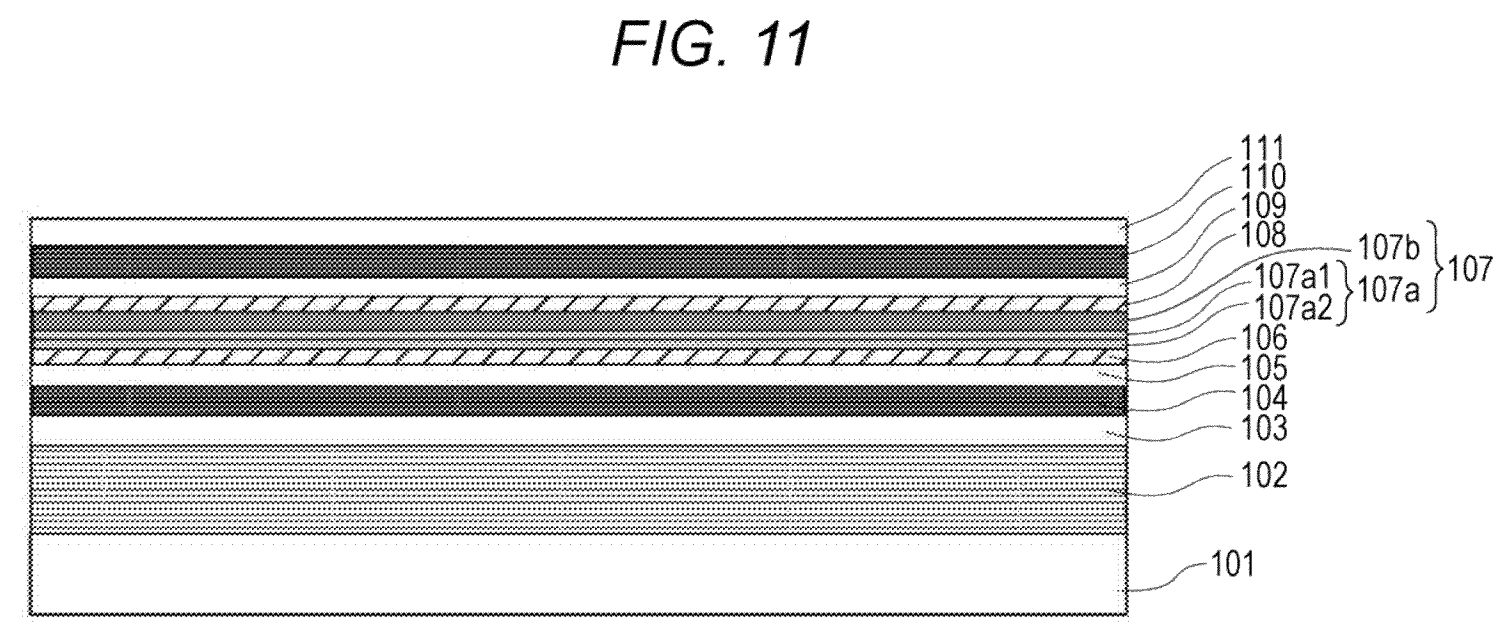

In the next step S1-8, the second active layer 110 is laminated on the second composition gradient layer 108 (see FIG. 11). More specifically, the second active layer 110 is laminated on the second spacer layer 109. Further, the second cladding layer 111 is laminated on the second active layer 110.

Figure 12:
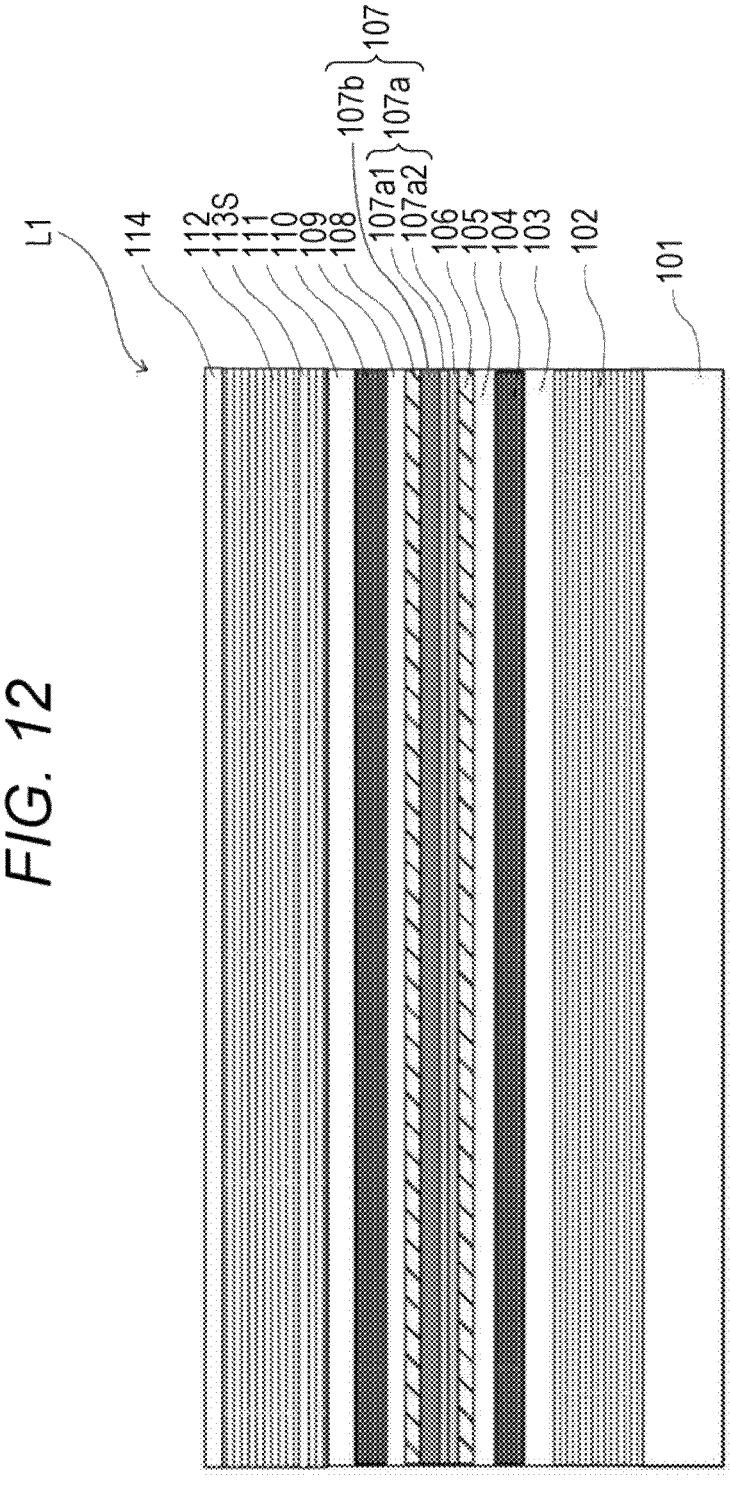
FIG. 12 is a ninth lamination step diagram of the laminate generation process 1.

In the next step S1-9, the second multilayer film reflector 112 is laminated on the second active layer 110 (see FIG. 12). More specifically, the second multilayer film reflector 112 including the selected oxide layer 113S serving as the current confinement layer 113 therein is laminated on the second cladding layer 111. Further, the contact layer 114 is laminated on the second multilayer film reflector 112. As a result, the laminate L1 is generated.

<Step S2>

Figure 13:
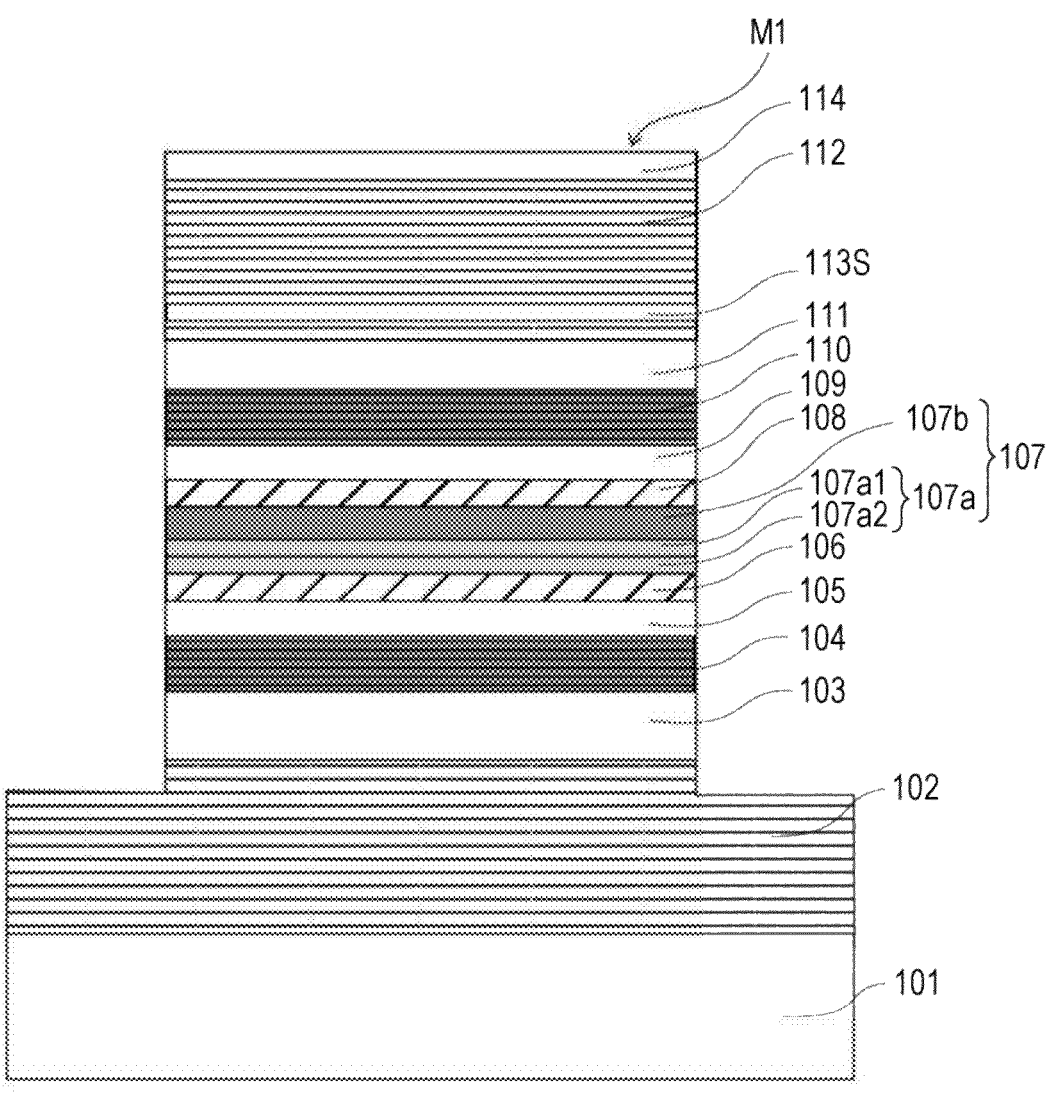
FIG. 13 is a second step diagram of FIG. 2.

In step S2, the laminate L1 is etched to form the mesa M1 (see FIG. 13).

Specifically, a resist pattern is formed by photolithography on the laminate L1 taken out from the growth chamber. Next, using this resist pattern as a mask, the laminate L1 is etched by, for example, RIE etching (reactive ion etching) until at least the side surface of the selected oxide layer 113S is exposed (for example, until the side surface of the first cladding layer 103 is completely exposed), thereby forming the mesa M1. The etching here is performed until the etching bottom surface is located in the first multilayer film reflector 102. Thereafter, the resist pattern is removed.

<Step S3>

Figure 14:
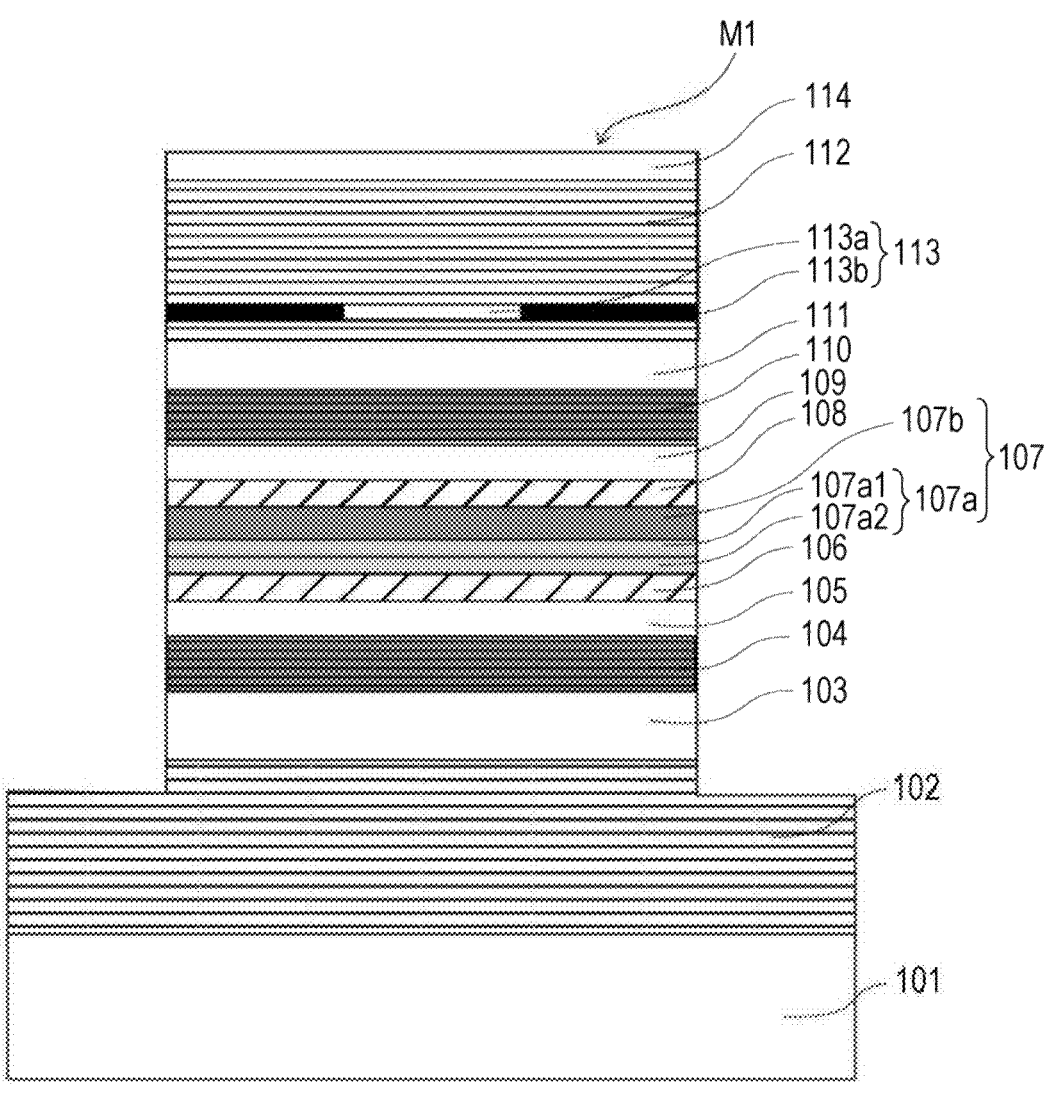
FIG. 14 is a third step diagram of FIG. 2.

In step S3, the peripheral portion of the selected oxide layer 113S (see FIG. 13) is oxidized to generate the current confinement layer 113 (see FIG. 14).

Specifically, the mesa M1 is exposed to a water vapor atmosphere, and the selected oxide layer 113S is oxidized (selectively oxidized) from the side surface to form the current confinement layer 113 in which the non-oxidized region 113a is surrounded by the oxidized region 113b.

<Step S4>

Figure 15:
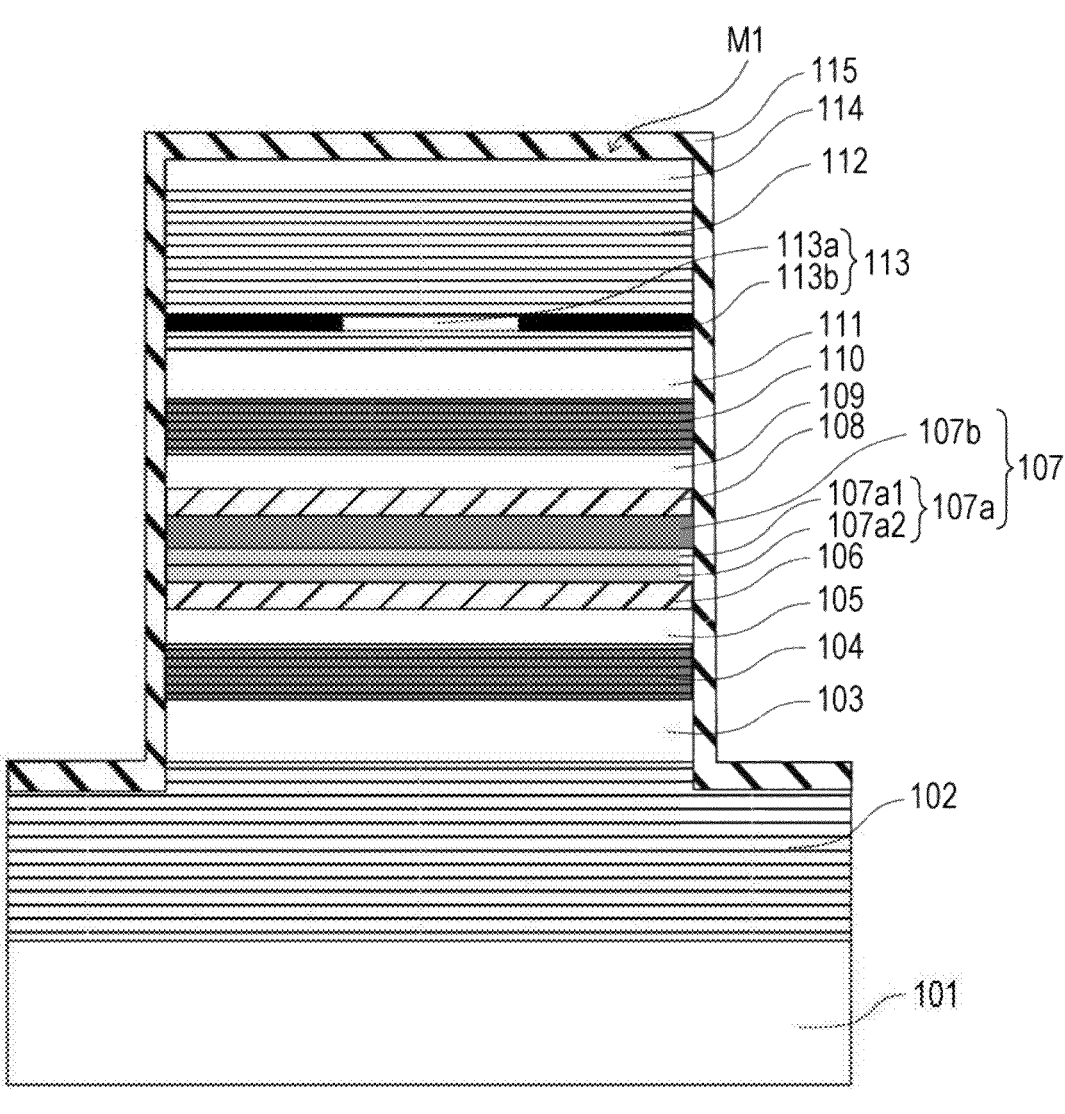
FIG. 15 is a fourth step diagram of FIG. 2.

In step S4, the insulating film 115 is formed (see FIG. 15). Specifically, the insulating film 115 is formed over substantially the entire area of the laminate on which the mesa M1 is formed.

<Step S5>

Figure 16:
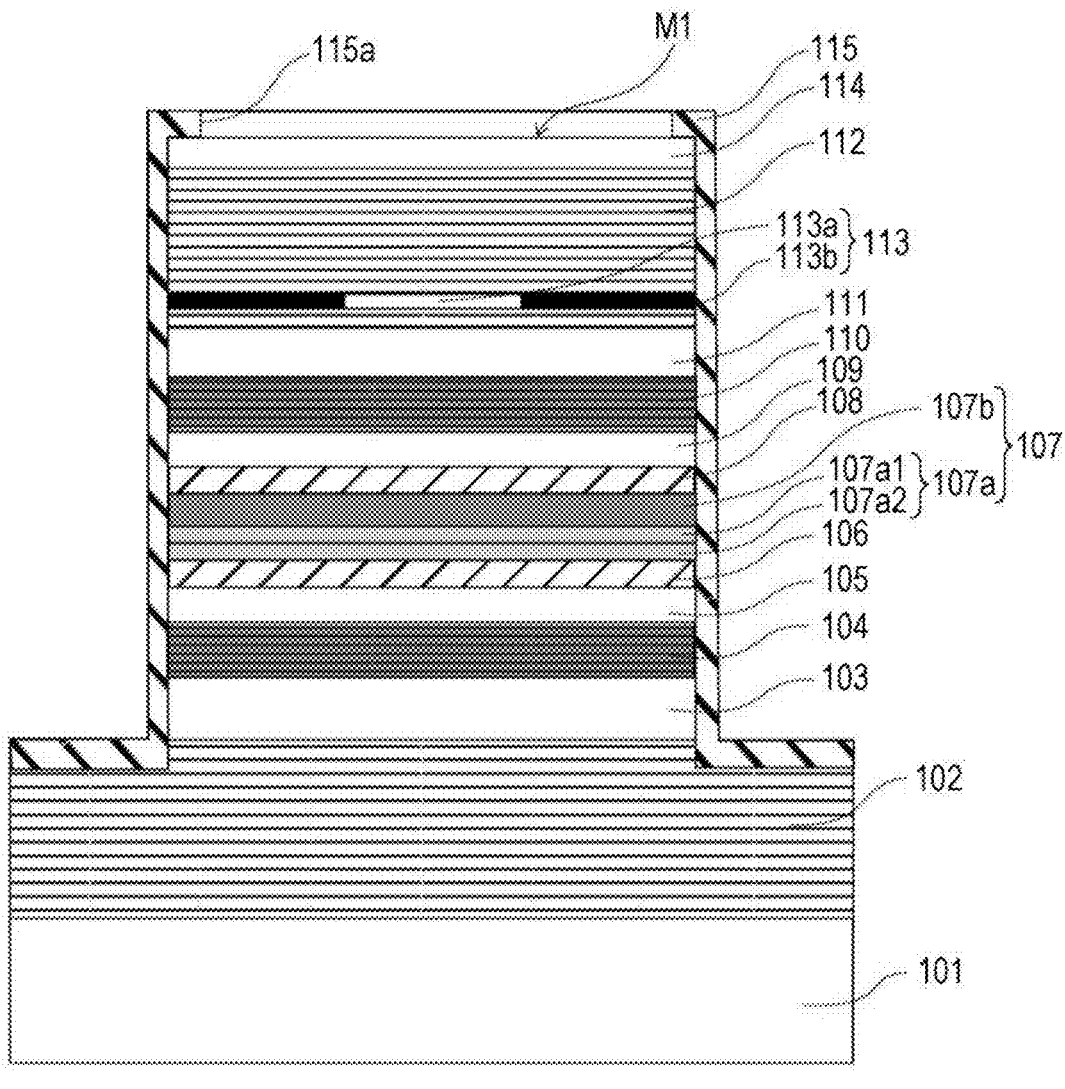
FIG. 16 is a fifth step diagram of FIG. 2.

In step S5, the contact hole 115a is formed (see FIG. 16). Specifically, a resist pattern is formed by photolithography on the insulating film 115 other than the insulating film 115 formed on the top of the mesa M1. Next, using this resist pattern as a mask, the insulating film 115 formed on the top of the mesa M1 is removed by etching using, for example, a hydrofluoric acid-based etchant. Thereafter, the resist pattern is removed. As a result, the contact hole 115a is formed, and the contact layer 114 is exposed.

<Step S6>

Figure 17:
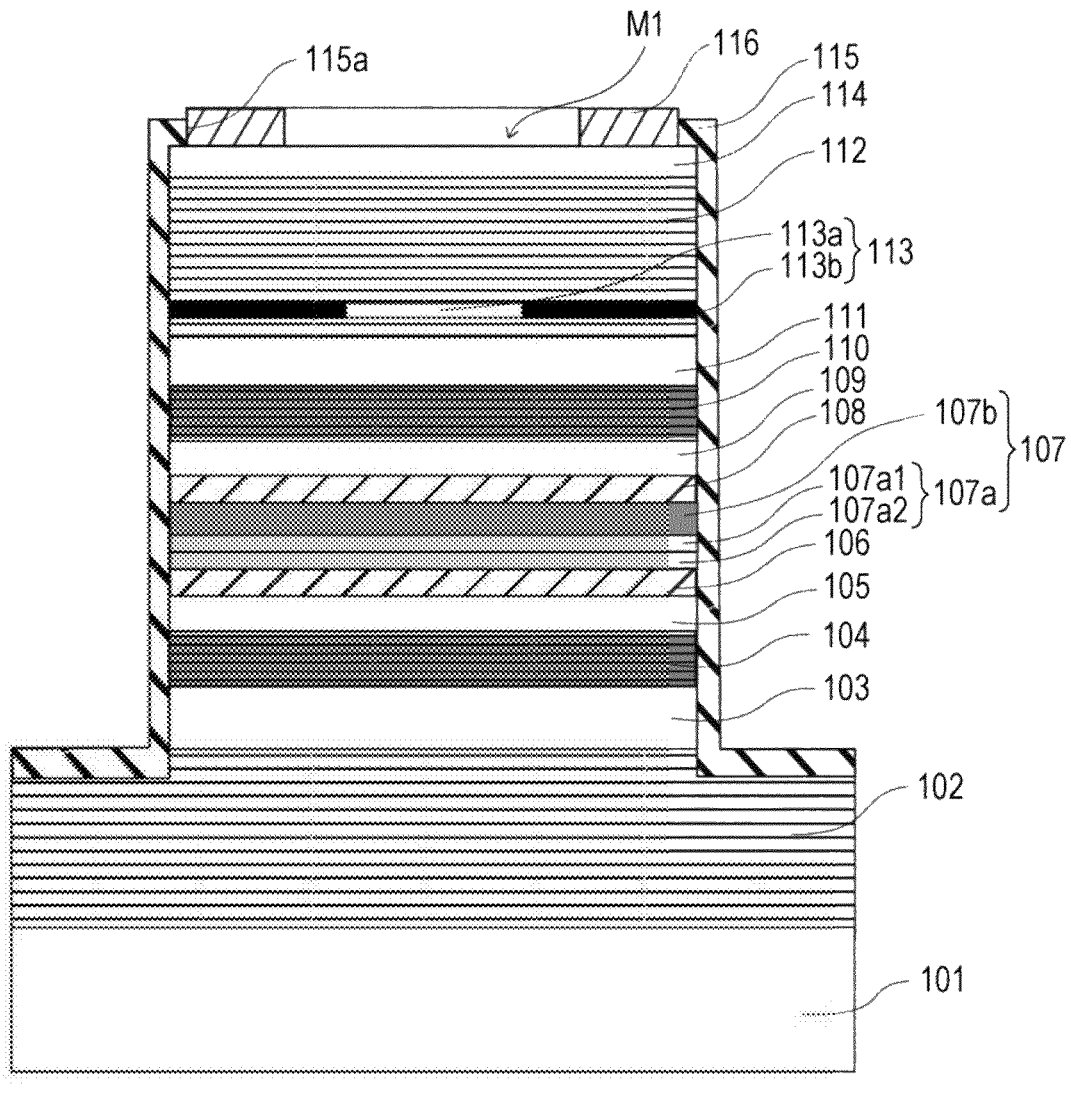
FIG. 17 is a sixth step diagram of FIG. 2.

In step S6, the anode electrode 116 is formed (see FIG. 17). Specifically, for example, a Ti/Pt/Au film is formed on the contact layer 114 via the contact hole 115a by an EB vapor deposition method, and the resist and, for example, Ti/Pt/Au on the resist are lifted off to form the anode electrode 116 in the contact hole 115a.

<Step S7>

Figure 18:
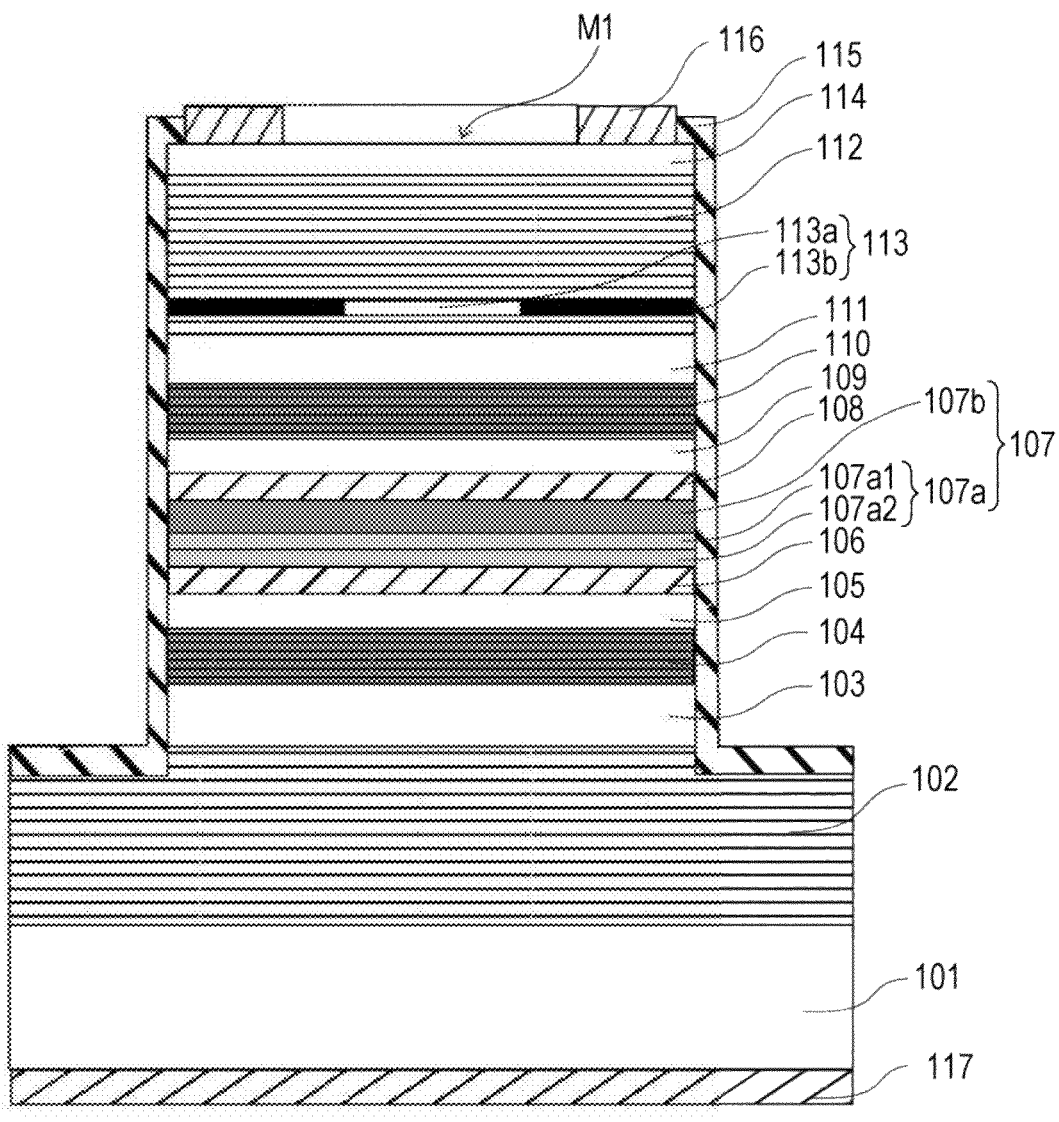
FIG. 18 is a seventh step diagram of FIG. 2.

In step S7, the cathode electrode 117 is formed (see FIG. 18). Specifically, after the back surface (lower surface) of the substrate 101 is polished, for example, an AuGe/Ni/Au film is formed on the back surface.

(4) Effects of Surface Emitting Laser

The surface emitting laser 100 according to the first embodiment of the present technology includes: the first and second multilayer film reflectors 102 and 112 laminated together; the plurality of active layers 104 and 110 laminated together between the first and second multilayer film reflectors 102 and 112; and the tunnel junction 107 disposed between the first and second active layers 104 and 110 adjacent to each other in the lamination direction among the plurality of active layers. The tunnel junction 107 includes the n-type semiconductor layer 107b and the p-type semiconductor layer 107a laminated together, and the p-type semiconductor layer 107a includes the first and second p-type semiconductor regions 107a1 and 107a2 laminated together.

In this case, the first and second p-type semiconductor regions 107a1 and 107a2 can be formed by different materials, and can have different characteristics. For example, a p-type semiconductor having a smaller band gap can be used for one of the first and second p-type semiconductor regions 107a1 and 107a2 closer to the n-type semiconductor layer 107b and a p-type semiconductor having a higher carrier concentration can be used for the other of the first and second p-type semiconductor regions 107a1 and 107a2 farther from the n-type semiconductor layer 107b.

As a result, in the p-type semiconductor layer 107a of the tunnel junction 107, a voltage drop in a region near the pn junction that is an interface between the p-type semiconductor layer 107a and the n-type semiconductor layer 107b can be reduced (resistance can be reduced), and a voltage drop in a region other than the region near the pn junction can be reduced (resistance can be reduced).

As a result, according to the surface emitting laser 100 of the first embodiment, it is possible to provide the surface emitting laser 100 capable of reducing the voltage drop at the tunnel junction 107. Accordingly, the surface emitting laser 100 having excellent light emission characteristics can be realized.

The first p-type semiconductor region 107a1 is disposed between the n-type semiconductor layer 107b and the second p-type semiconductor region 107a2. In this case, for example, by using a material having a small band gap for the first p-type semiconductor region 107a1, resistance in a region near the pn junction of the p-type semiconductor layer 107a can be reduced.

The first p-type semiconductor region 107a1 is in contact with the n-type semiconductor layer 107b. In this case, for example, by using a material having a small band gap for the first p-type semiconductor region 107a1, resistance at the pn junction can be reduced, and resistance at the tunnel junction 107 can be further reduced.

The second p-type semiconductor region 107a2 is in contact with the first p-type semiconductor region 107a1. In this case, for example, by using a material having a high carrier concentration for the first p-type semiconductor region 107a1, resistance in a region other than the vicinity of the pn junction of the p-type semiconductor layer 107a can be reduced.

The first p-type semiconductor region 107a1 is in contact with the n-type semiconductor layer 107b, and the second p-type semiconductor region 107a2 is in contact with the first p-type semiconductor region 107a1. In this case, for example, by using a material having a small band gap for the first p-type semiconductor region 107a1 and using a material having a high carrier concentration for the first p-type semiconductor region 107a1, resistance in the entire p-type semiconductor layer 107a can be reduced, and resistance at the tunnel junction 107 can be significantly reduced.

Here, originally, it is desirable that the first p-type semiconductor region 107a1 have a high carrier concentration, but it is difficult to obtain a high carrier concentration with a material maintaining a small band gap. Therefore, the carrier concentration of the second p-type semiconductor region 107a2 is preferably higher than the carrier concentration of the first p-type semiconductor region 107a1.

The band gap of the first p-type semiconductor region 107a1 is preferably smaller than the band gap of the second p-type semiconductor region 107a2.

The surface emitting laser 100 further includes the first composition gradient layer 106 disposed between the first active layer 104 and the tunnel junction 107. Accordingly, the resistance between the first active layer 104 and the tunnel junction 107 can be reduced.

The surface emitting laser 100 further includes the second composition gradient layer 108 disposed between the second active layer 110 and the tunnel junction 107. Accordingly, since the change in Al composition in the region between the second active layer 110 and the tunnel junction 107 can be moderated, the resistance of the region can be reduced.

The surface emitting laser 100 further includes the first spacer layer 105 disposed between the first active layer 104 and the first composition gradient layer 106, the first active layer 104 having the first composition gradient layer 106 disposed between the tunnel junction 107 and one of the first and second active layers 104 and 110. Accordingly, the positions of the active layers and the tunnel junction 107 can be controlled according to the optical field intensity inside the resonator.

The surface emitting laser 100 further includes the second spacer layer 109 disposed between the second active layer 110 and the second composition gradient layer 108, the second active layer 110 having the second composition gradient layer 108 disposed between the tunnel junction 107 and one of the first and second active layers 104 and 110. Accordingly, the positions of the active layers and the tunnel junction 107 can be controlled according to the optical field intensity inside the resonator.

The first p-type semiconductor region 107a1 is preferably formed by a GaAs compound semiconductor, an AlGaAs-based compound semiconductor, or an InGaAs-based compound semiconductor.

The second p-type semiconductor region 107a2 is preferably formed by a GaAs compound semiconductor, an AlGaInAs-based compound semiconductor, or an AlGaAs-based compound semiconductor.

The Al composition of the second p-type semiconductor region 107a2 is preferably higher than the Al composition of the first p-type semiconductor region 107a1.

The first p-type semiconductor region 107a1 and/or the second p-type semiconductor region 107a2 are preferably doped with at least one of C, Zn, Mg, or Be.

2. Surface Emitting Lasers According to Modifications 1 to 8 of First Embodiment of Present Technology Hereinafter, surface emitting lasers according to Modifications 1 to 8 of the first embodiment of the present technology will be described.

(Modification 1)

Figure 19:
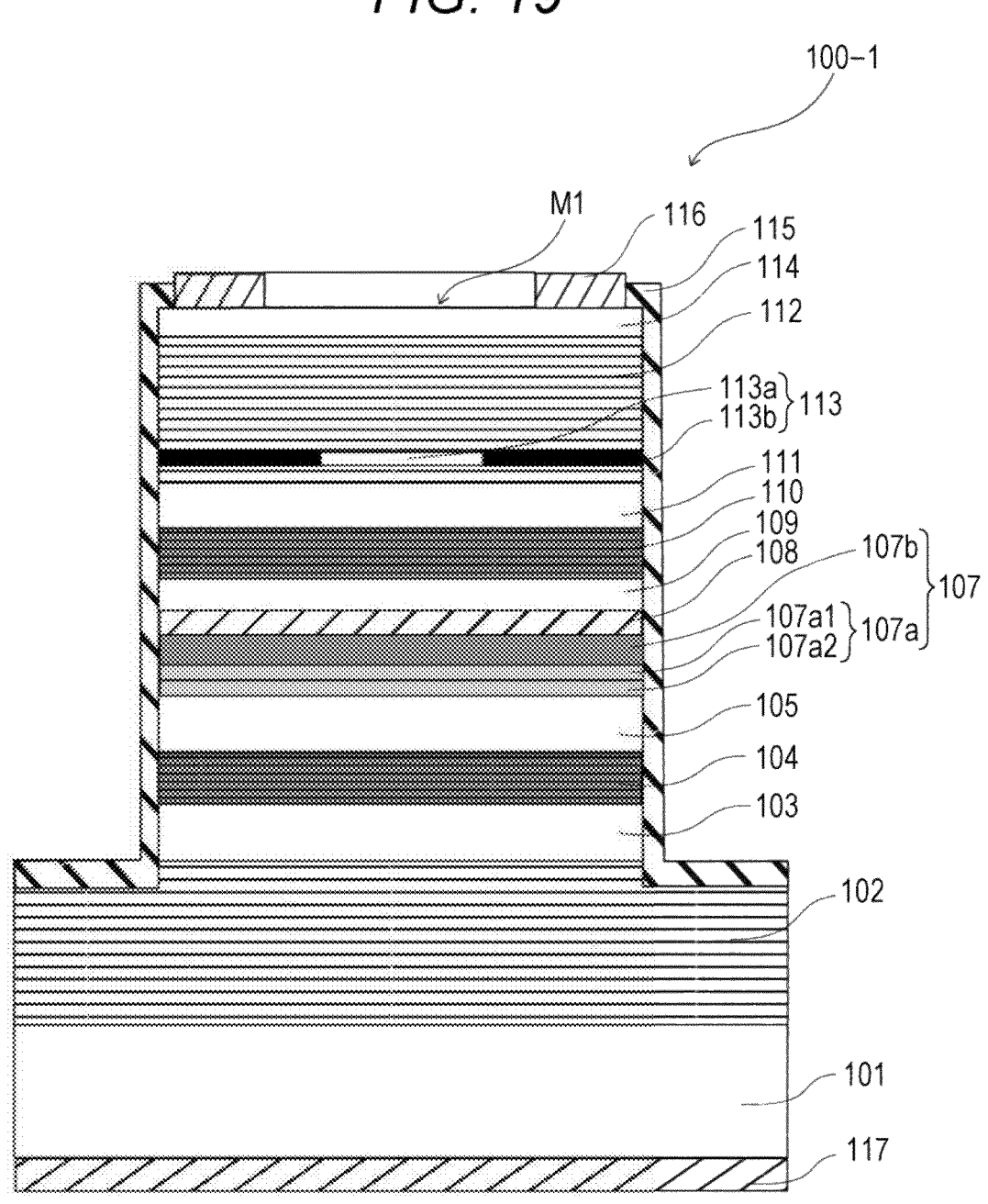
FIG. 19 is a cross-sectional view illustrating a configuration of a surface emitting laser according to Modification 1 of the first embodiment of the present technology.

As illustrated in FIG. 19, a surface emitting laser 100-1 of Modification 1 has a configuration similar to that of the surface emitting laser 100 of the first embodiment except that the first composition gradient layer 106 is not provided.

Since the surface emitting laser 100-1 is not provided with the first composition gradient layer 106, it is inferior to the surface emitting laser 100 in terms of reduction in resistance between the first active layer 104 and the tunnel junction 107, but it is effective in that the layer configuration can be further simplified and the number of lamination steps can be reduced by one in the laminate generation process.

(Modification 2)

Figure 20:
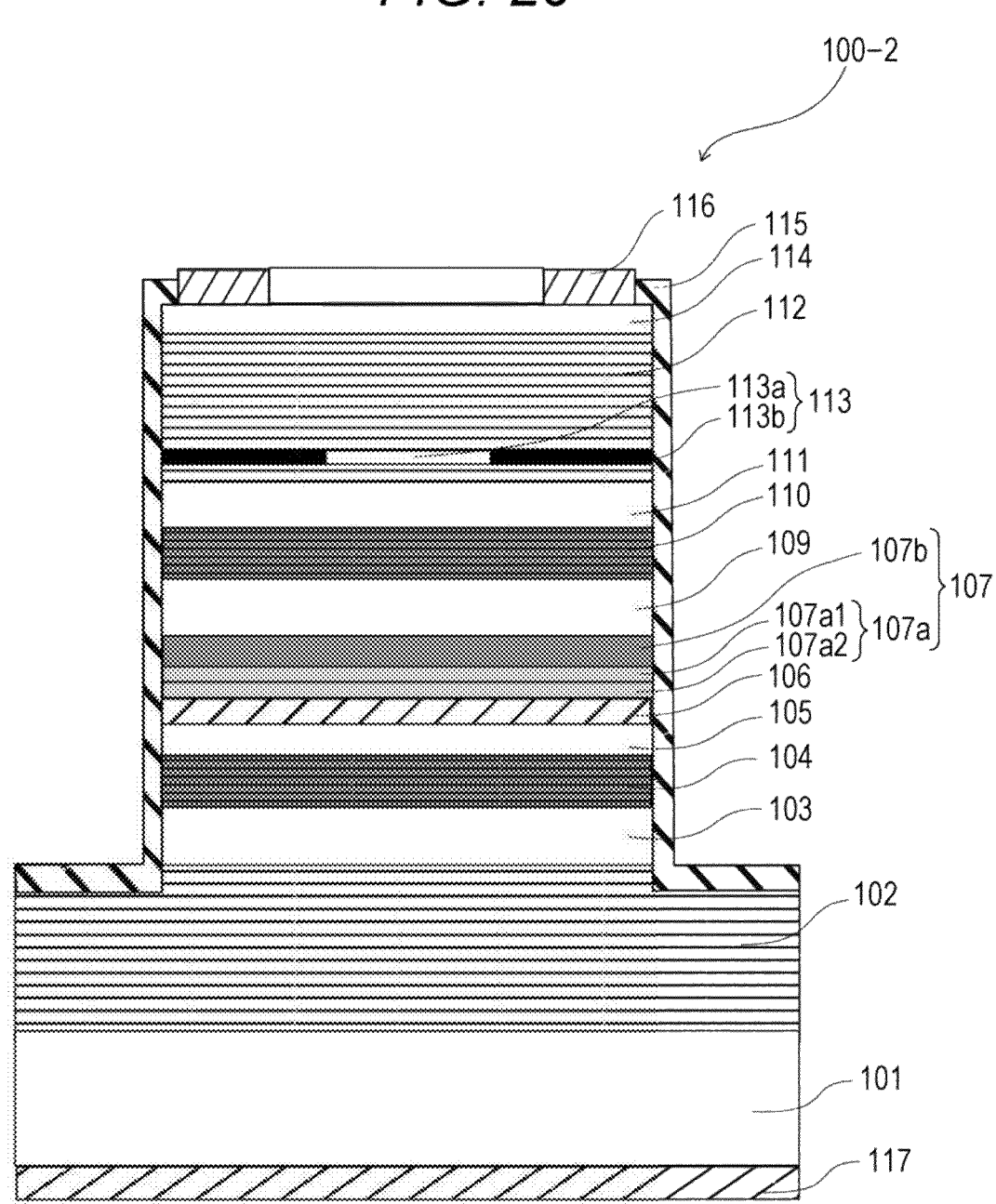
FIG. 20 is a cross-sectional view illustrating a configuration of a surface emitting laser according to Modification 2 of the first embodiment of the present technology.

As illustrated in FIG. 20, a surface emitting laser 100-2 of Modification 2 has a configuration similar to that of the surface emitting laser 100 of the first embodiment except that the second composition gradient layer 108 is not provided.

Since the surface emitting laser 100-2 is not provided with the second composition gradient layer 108, it is inferior to the surface emitting laser 100 in terms of reduction in resistance between the second active layer 110 and the tunnel junction 107, but it is effective in that the layer configuration can be further simplified and the number of lamination steps can be reduced by one in the laminate generation process.

(Modification 3)

Figure 21:
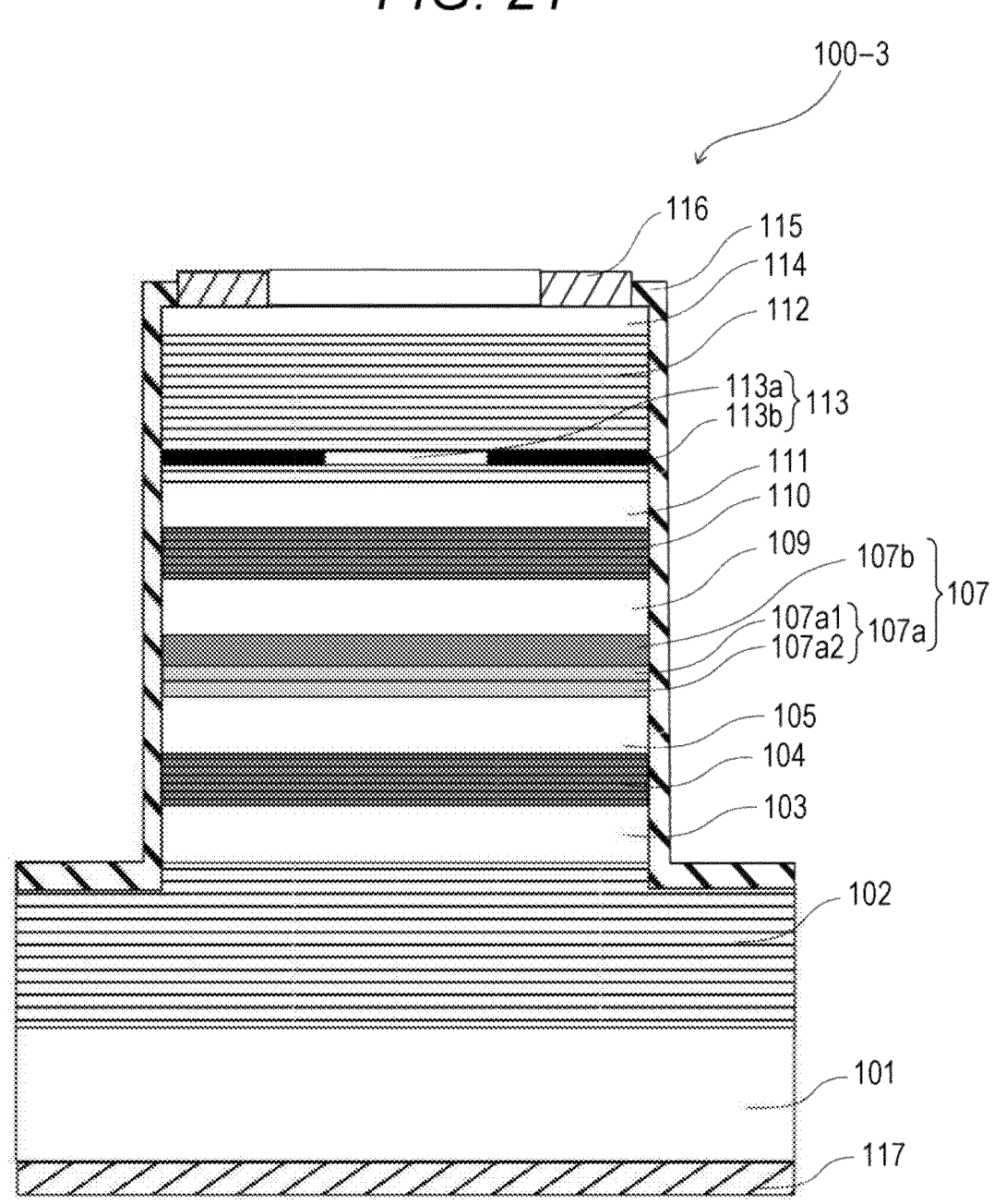
FIG. 21 is a cross-sectional view illustrating a configuration of a surface emitting laser according to Modification 3 of the first embodiment of the present technology.

As illustrated in FIG. 21, a surface emitting laser 100-3 of Modification 3 has a configuration similar to that of the surface emitting laser 100 of the first embodiment except that the first and second composition gradient layers 106 and 108 are not provided.

Since the surface emitting laser 100-3 is not provided with the first and second composition gradient layers 106 and 108, it is inferior to the surface emitting laser 100 in terms of reduction in resistance between the first active layer 104 and the tunnel junction 107 and reduction in resistance between the second active layer 110 and the tunnel junction 107, but it is effective in that the layer configuration can be further simplified and the number of lamination steps can be reduced by two in the laminate generation process.

(Modification 4)

Figure 22:
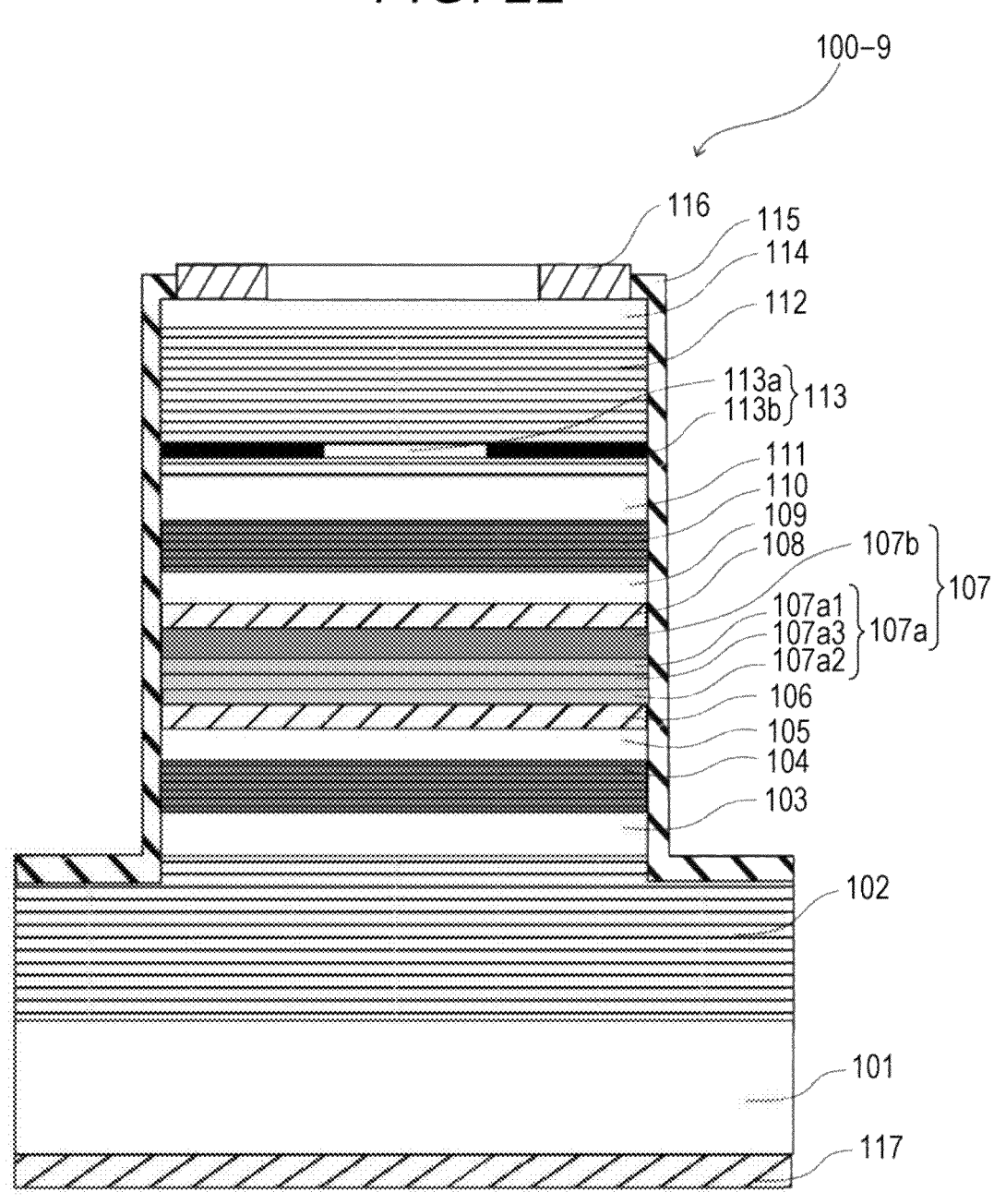
FIG. 22 is a cross-sectional view illustrating a configuration of a surface emitting laser according to Modification 4 of the first embodiment of the present technology.

As illustrated in FIG. 22, a surface emitting laser 100-9 of Modification 4 has a configuration similar to that of the surface emitting laser 100 of the first embodiment except that the p-type semiconductor layer 107*a* has a third p-type semiconductor region 107*a*3 between the first and second p-type semiconductor regions 107*a*1 and 107*a*2.

The third p-type semiconductor region 107*a*3 may be formed by a material (for example, a GaAs-based compound semiconductor or an AlGaAs-based compound semiconductor) similar to the material (for example, a GaAs-based compound semiconductor) of the first p-type semiconductor region 107*a*1, and may have characteristics (for example, characteristics with a small band gap) similar to those of the first semiconductor region 107*a*1.

The third p-type semiconductor region 107*a*3 may be formed by a material (for example, $Al_YGaAs$ (Y≠X)) similar to the material (for example, $Al_XGaAs$) of the second p-type semiconductor region 107*a*2, and may have characteristics similar to those of the second p-type semiconductor region 107*a*2 (for example, characteristics of high carrier concentration in Y>X or Y<X).

The third p-type semiconductor region 107*a*3 may be formed by a material (for example, $Al_YGaAs$ (Y≠X)) having intermediate properties between the material (for example, GaAs) of the first p-type semiconductor region 107*a*1 and the material (for example, $Al_XGaAs$) of the second p-type semiconductor region 107*a*2, and may have intermediate characteristics between the first and second p-type semiconductor regions 107*a*1 and 107*a*2.

Note that two or more p-type semiconductor regions may be provided between the first and second p-type semiconductor regions 107*a*1 and 107*a*2. Each of these two or more p-type semiconductor regions can also have characteristics similar to those of the above-described third p-type semiconductor region 107*a*3. For example, among these two or more p-type semiconductor regions, the p-type semiconductor region closer to the first p-type semiconductor region

107*a*1 may have more similar characteristics to the first p-type semiconductor region 107*a*1, and the p-type semiconductor region closer to the second p-type semiconductor region 107*a*2 may have more similar characteristics to the second p-type semiconductor region 107*a*2.

(Modification 5)

Figure 23:
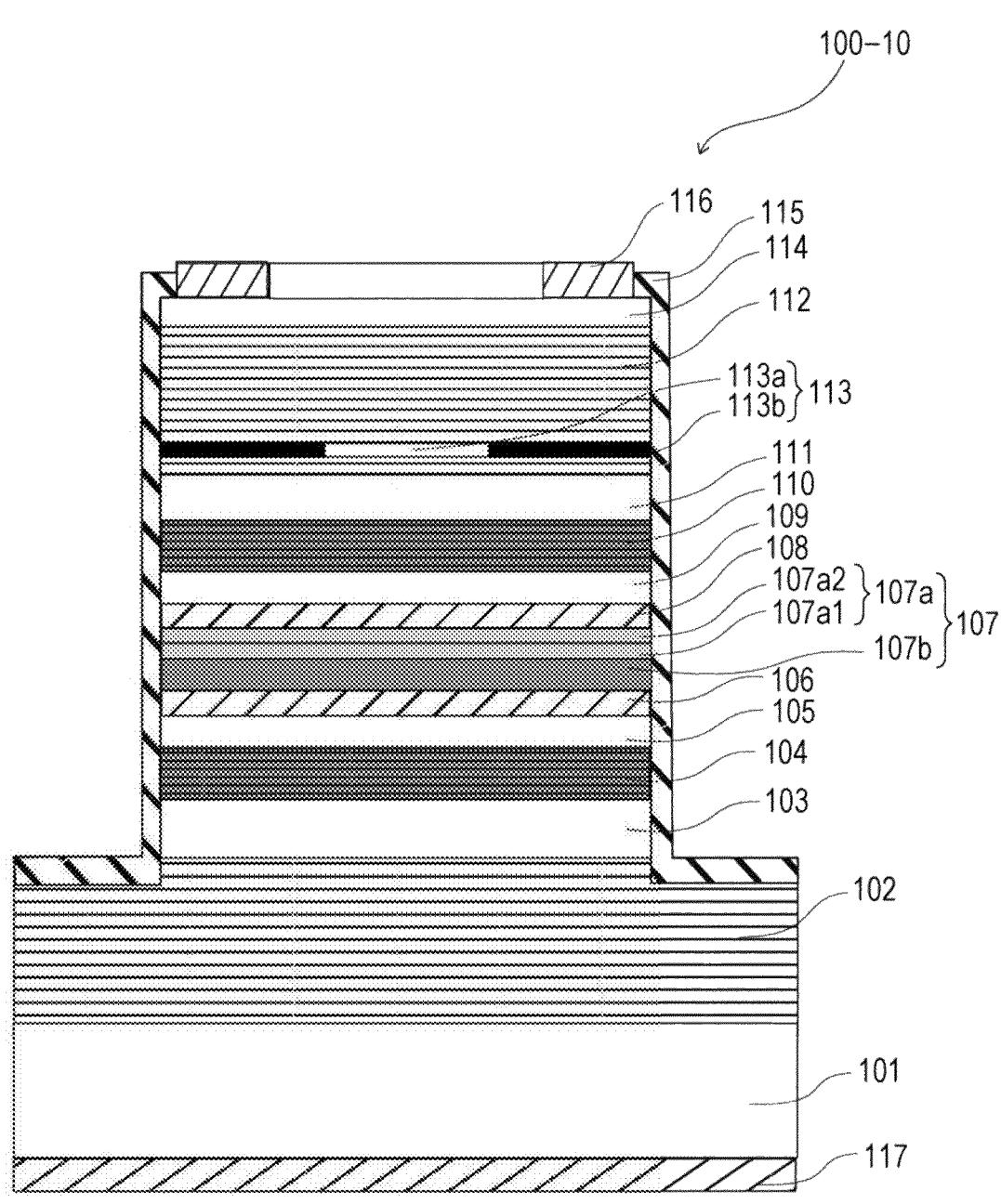
FIG. 23 is a cross-sectional view illustrating a configuration of a surface emitting laser according to Modification 5 of the first embodiment of the present technology.

As illustrated in FIG. 23, a surface emitting laser 100-10 of Modification 5 has a configuration in which conductivity types (first and second conductivity types, for example, p-type and n-type) of layers constituting the surface emitting laser 100 of the first embodiment are interchanged. In this case, the n-type semiconductor layer 107*b* is disposed on the substrate 101 side (lower side) of the p-type semiconductor layer 107*a* at the tunnel junction 107.

The surface emitting laser 100-10 also has an effect similar to that of the surface emitting laser 100 of the first embodiment.

(Modification 6)

Figure 24:
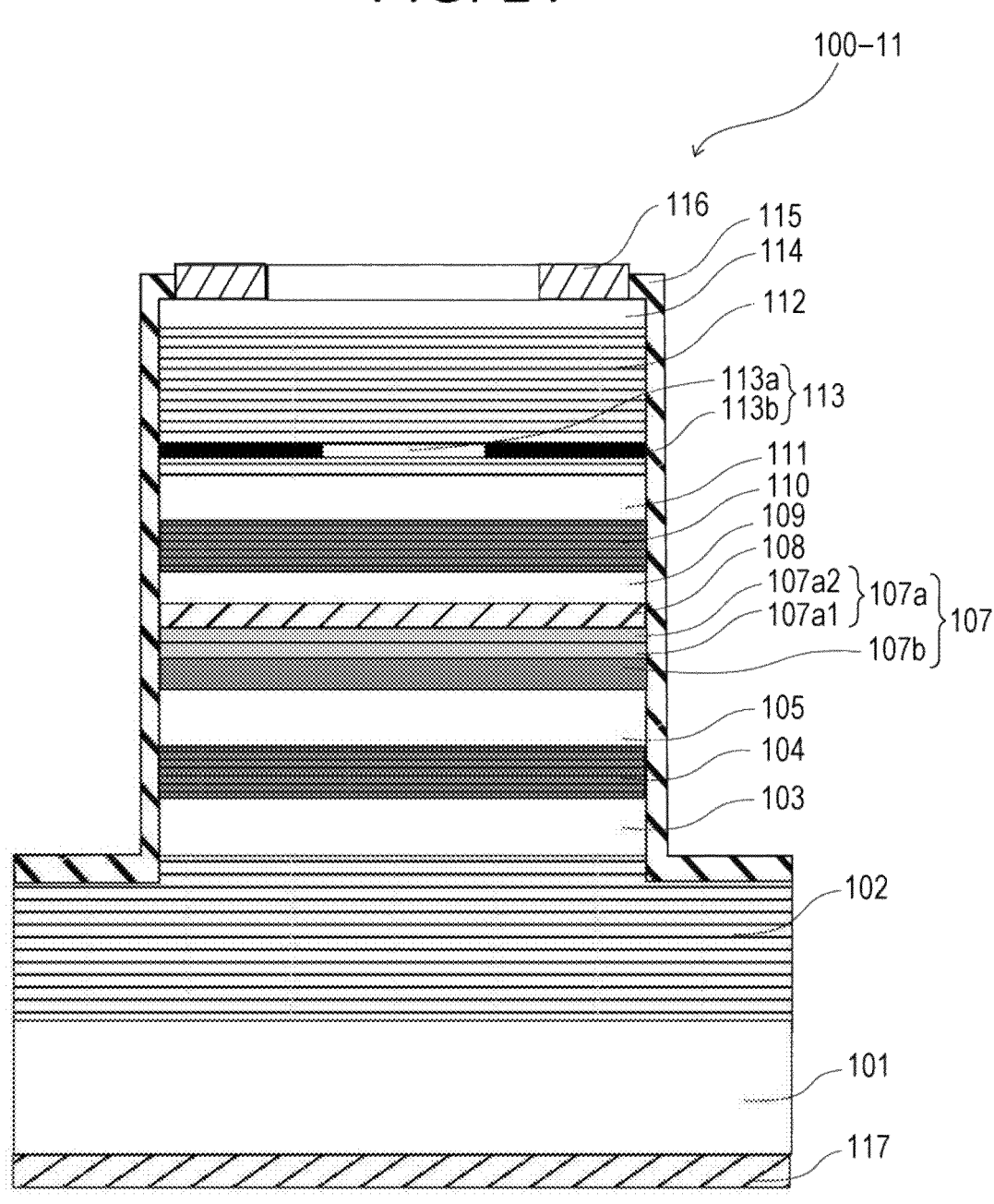
FIG. 24 is a cross-sectional view illustrating a configuration of a surface emitting laser according to Modification 6 of the first embodiment of the present technology.

As illustrated in FIG. 24, a surface emitting laser 100-11 of Modification 6 has a configuration similar to that of the surface emitting laser 100-10 of Modification 5 except that the first composition gradient layer 106 is not provided.

(Modification 7)

Figure 25:
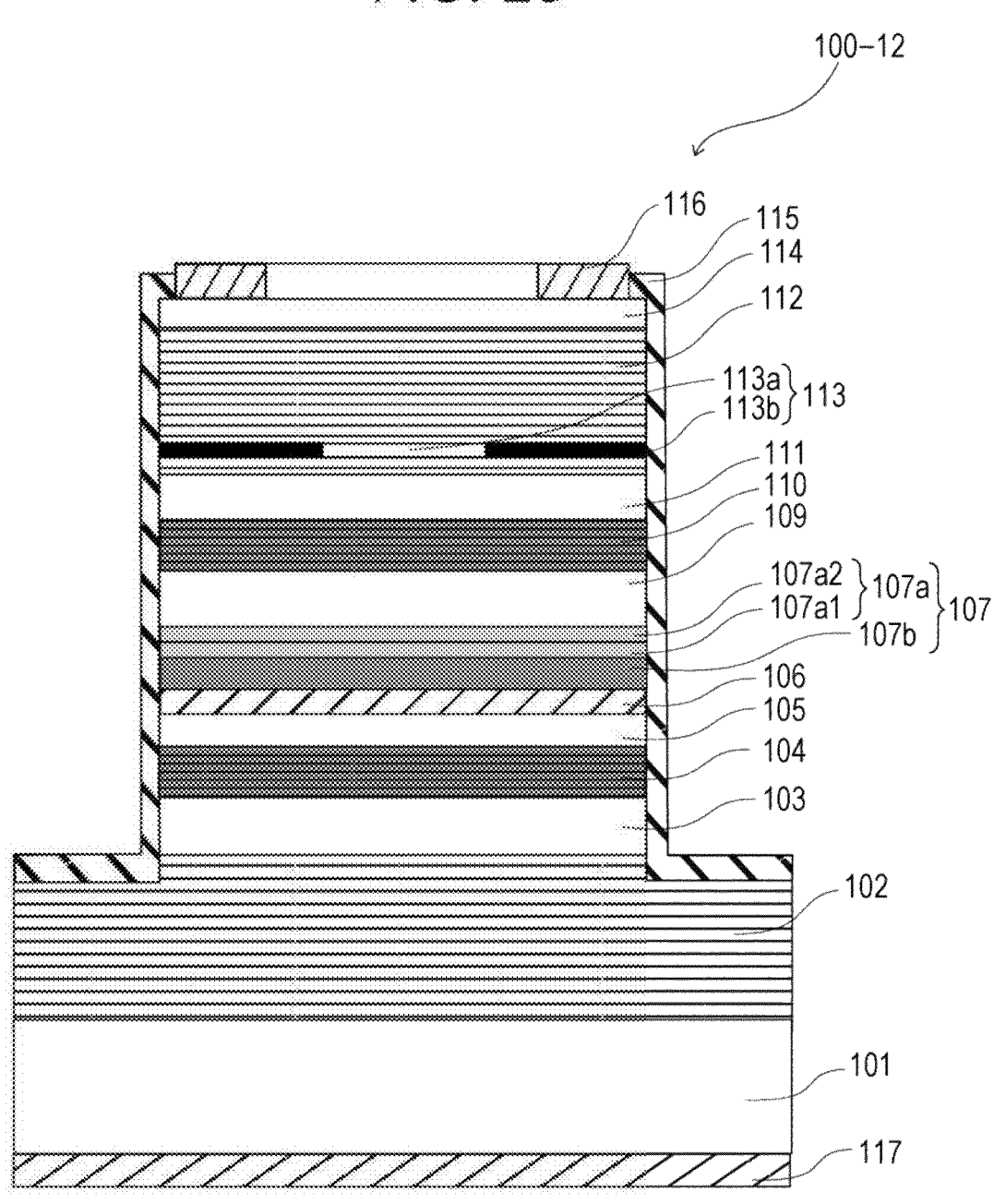
FIG. 25 is a cross-sectional view illustrating a configuration of a surface emitting laser according to Modification 7 of the first embodiment of the present technology.

As illustrated in FIG. 25, a surface emitting laser 100-12 of Modification 7 has a configuration similar to that of the surface emitting laser 100-10 of Modification 5 except that the second composition gradient layer 108 is not provided.

(Modification 8)

Figure 26:
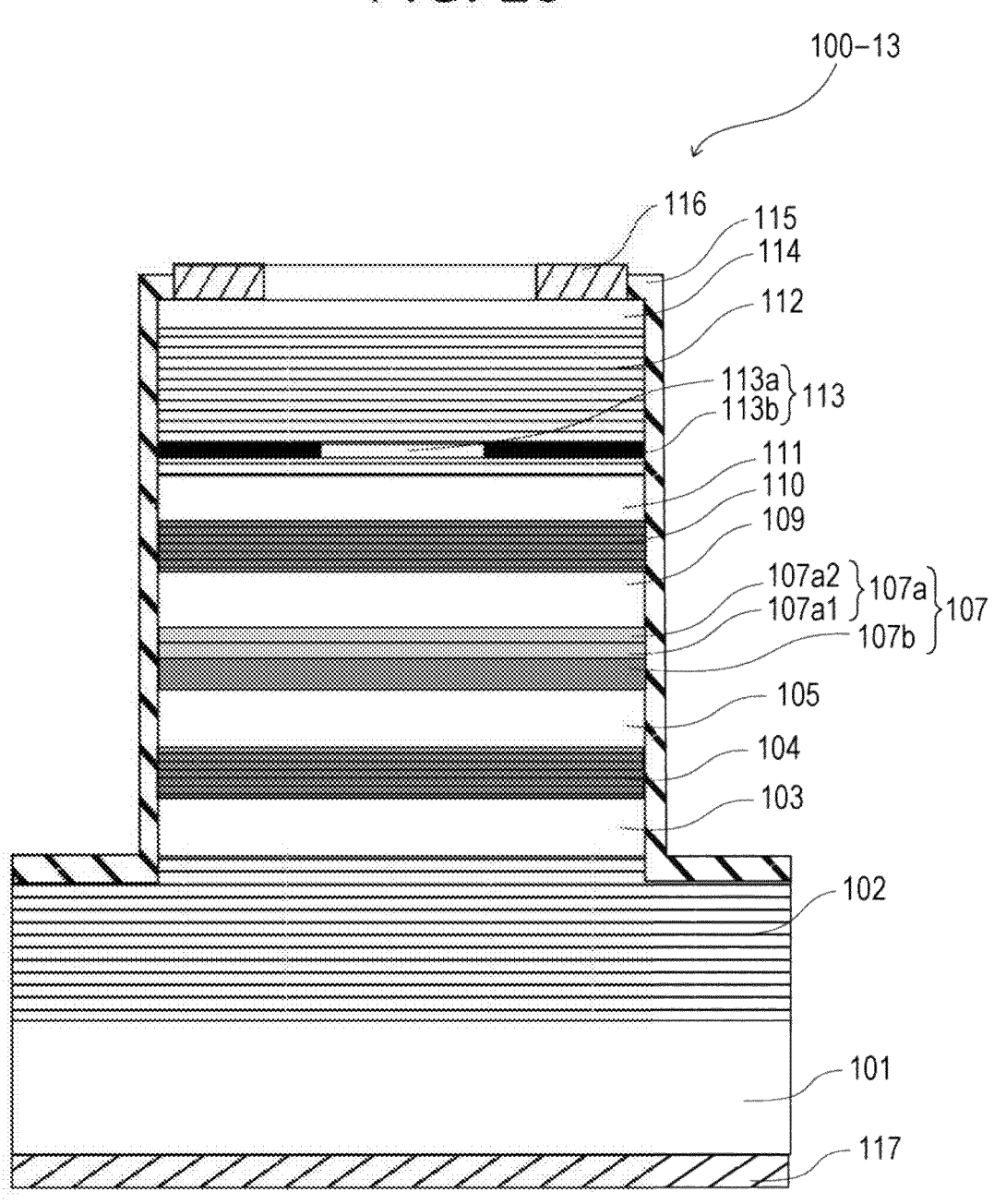
FIG. 26 is a cross-sectional view illustrating a configuration of a surface emitting laser according to Modification 8 of the first embodiment of the present technology.

As illustrated in FIG. 26, a surface emitting laser 100-13 of Modification 8 has a configuration similar to that of the surface emitting laser 100-10 of Modification 5 except that the first and second composition gradient layers 106 and 108 are not provided.

3. Surface Emitting Laser According to Second Embodiment of Present Technology

Hereinafter, a surface emitting laser 200 according to a second embodiment of the present technology will be described.

(1) Configuration of Surface Emitting Laser

Figure 27:
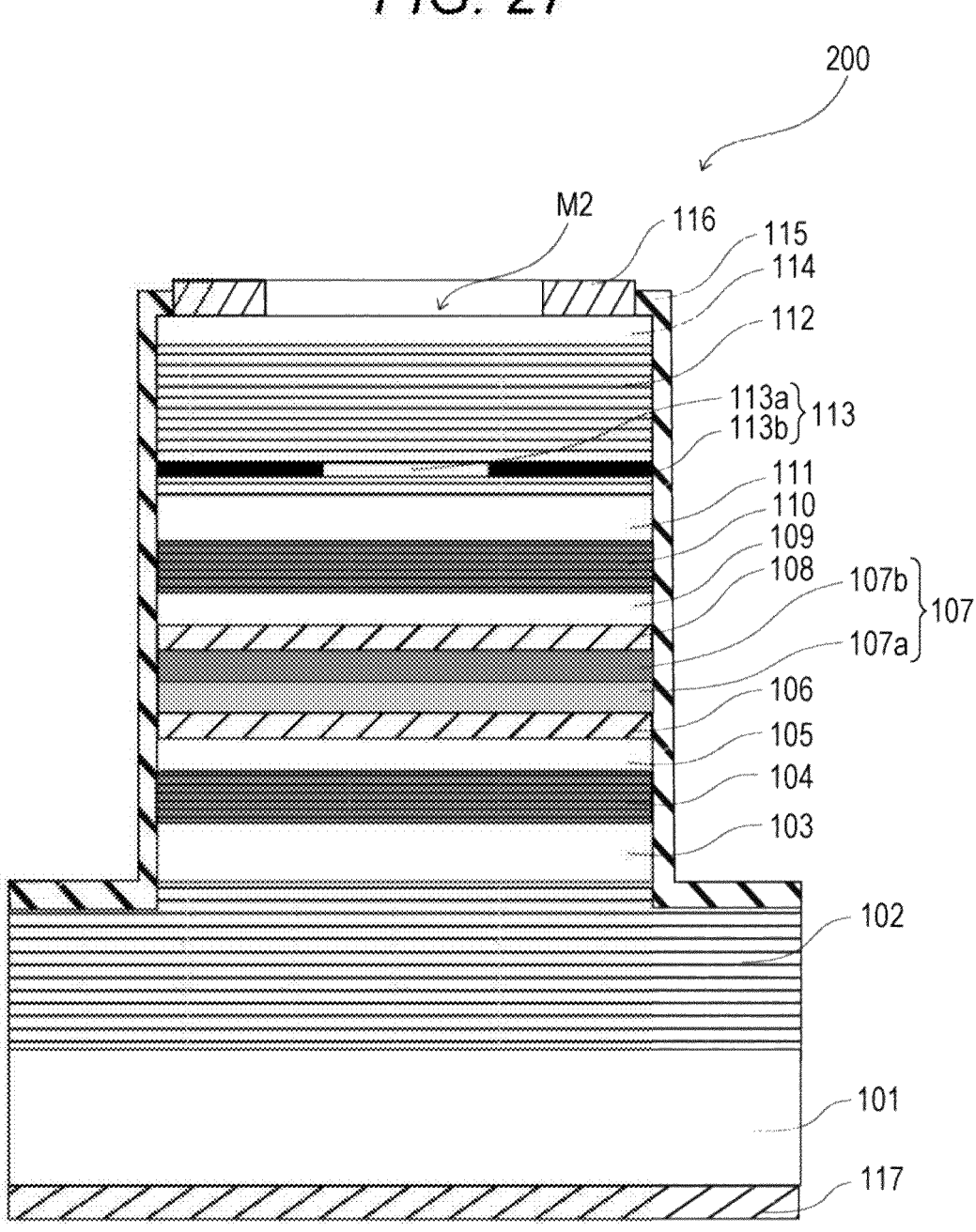
FIG. 27 is a cross-sectional view illustrating a configuration of a surface emitting laser according to a second embodiment of the present technology.

As illustrated in FIG. 27, the surface emitting laser 200 according to the second embodiment has a configuration similar to that of the surface emitting laser 100 according to the first embodiment except that the p-type semiconductor layer 107*a* of the tunnel junction 107 is configured by a single region (does not have a laminated structure).

In the surface emitting laser 200, the p-type semiconductor layer 107*a* is formed by a p-type compound semiconductor (for example, a GaAs-based compound semiconductor, an AlGaAs-based compound semiconductor, an InGaAs-based compound semiconductor, or the like) having a high carrier concentration (for example, $1 \times 10^{20}$ $cm^{-3}$ to $3 \times 10^{20}$ $cm^{-3}$) as an example. The p-type semiconductor layer 107*a* is preferably doped with at least one of C, Zn, Mg, or Be. As the p-type semiconductor layer 107*a*, for example, a GaAs layer doped with C at a high concentration (for example, $1 \times 10^{20}$ $cm^{-3}$) and having a thickness of 10 nm can be used.

In the surface emitting laser 200, the n-type semiconductor layer 107*b* is formed by an n-type compound semiconductor (for example, an InGaAs-based compound semiconductor, a GaAs-based compound semiconductor, or the like) having a high carrier concentration. The n-type semiconductor layer 107*b* is preferably doped with at least one of Si, Te, or Se. As the n-type semiconductor layer 107*b*, for example, a GaAs layer doped with Si at a high concentration (for example, $5 \times 10^{19}$ $cm^{-3}$) and having a thickness of 20 nm can be used.

(2) Operation of Surface Emitting Laser

The surface emitting laser 200 also performs an operation similar to the operation of the surface emitting laser 100.

(3) Method for Manufacturing Surface Emitting Laser

Figure 28:
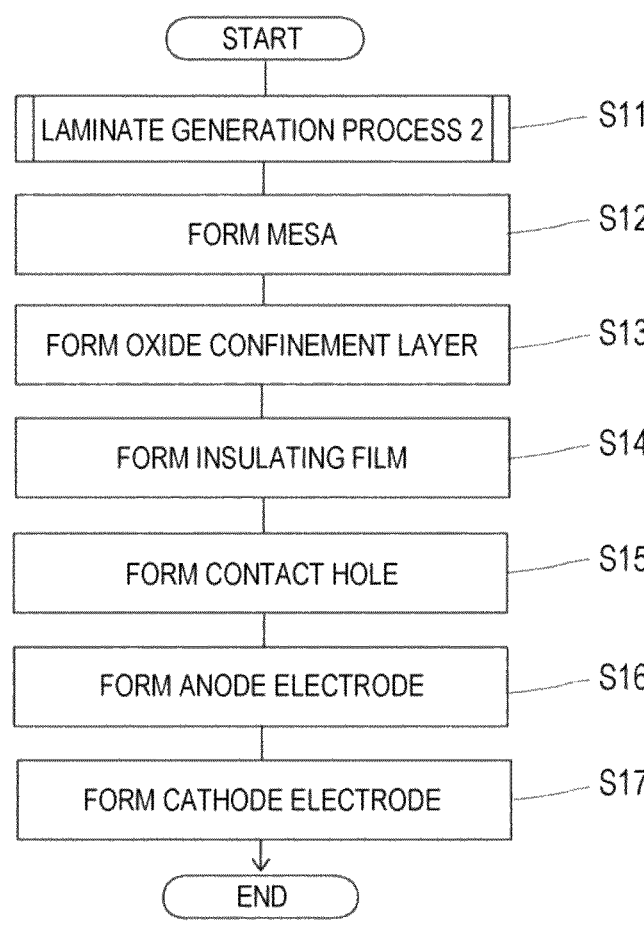
FIG. 28 is a flowchart for describing a method for manufacturing the surface emitting laser according to the second embodiment of the present technology.

Hereinafter, a method for manufacturing the surface emitting laser 100 will be described with reference to the flowchart (steps S11 to S17) in FIG. 28. Here, as an example, a plurality of surface emitting laser arrays in which a plurality of surface emitting lasers 200 is two-dimensionally arranged is simultaneously generated on one wafer which is a base material of the substrate 101 by a semiconductor manufacturing method using a semiconductor manufacturing apparatus. Next, a series of a plurality of integrated surface emitting laser arrays is separated from each other to obtain a plurality of chip-shaped surface emitting laser arrays (surface emitting laser array chips). Note that, by the manufacturing method described below, it is also possible to simultaneously generate a plurality of surface emitting lasers 200 on one wafer which is a base material of the substrate 101, and separate a series of the plurality of integrated surface emitting lasers 200 from each other to obtain a chip-shaped surface emitting laser (surface emitting laser chip).

<Step S11>

In step S11, a laminate generation process 2 is performed. In the laminate generation process 2, as an example, materials of layers constituting the surface emitting laser 200 are sequentially laminated in a growth chamber by a chemical vapor deposition (CVD) method, for example, a metal organic chemical vapor deposition (MOCVD) method to generate a laminate L2 (see FIG. 34).

The laminate generation process 2 (step S11 in FIG. 33) will be described with reference to the flowchart in FIG. 29, FIGS. 4 to 6, and FIGS. 30 to 34.

In the first step S11-1, the first multilayer film reflector 102 is laminated on the substrate 101 (see FIG. 4). Further, the first cladding layer 103 is laminated on the first multilayer film reflector 102.

In the next step S11-2, the first active layer 104 is laminated on the first multilayer film reflector 102 (see FIG. 5). More specifically, the first active layer 104 is laminated on the first cladding layer 103. Further, the first spacer layer 105 is laminated on the first active layer 104.

In the next step S11-3, the first composition gradient layer 106 is laminated on the first active layer 104 (see FIG. 6). More specifically, the first composition gradient layer 106 is laminated on the first spacer layer 105.

Figure 30:
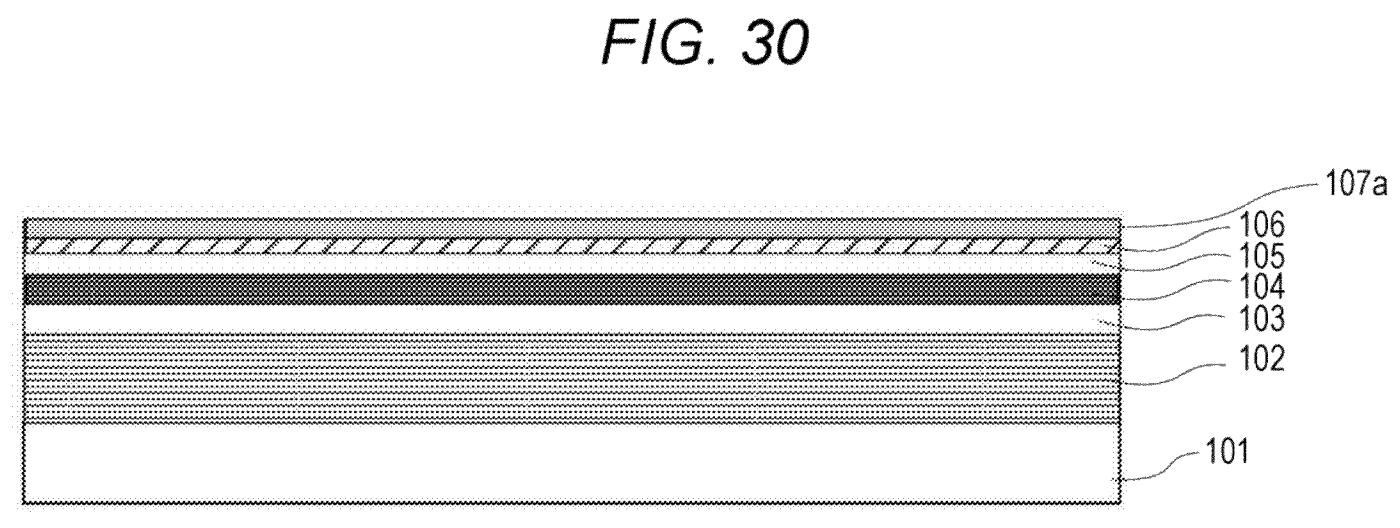

In the next step S11-4, the p-type semiconductor layer 107a is laminated on the first composition gradient layer 106 (see FIG. 30).

Figure 31:
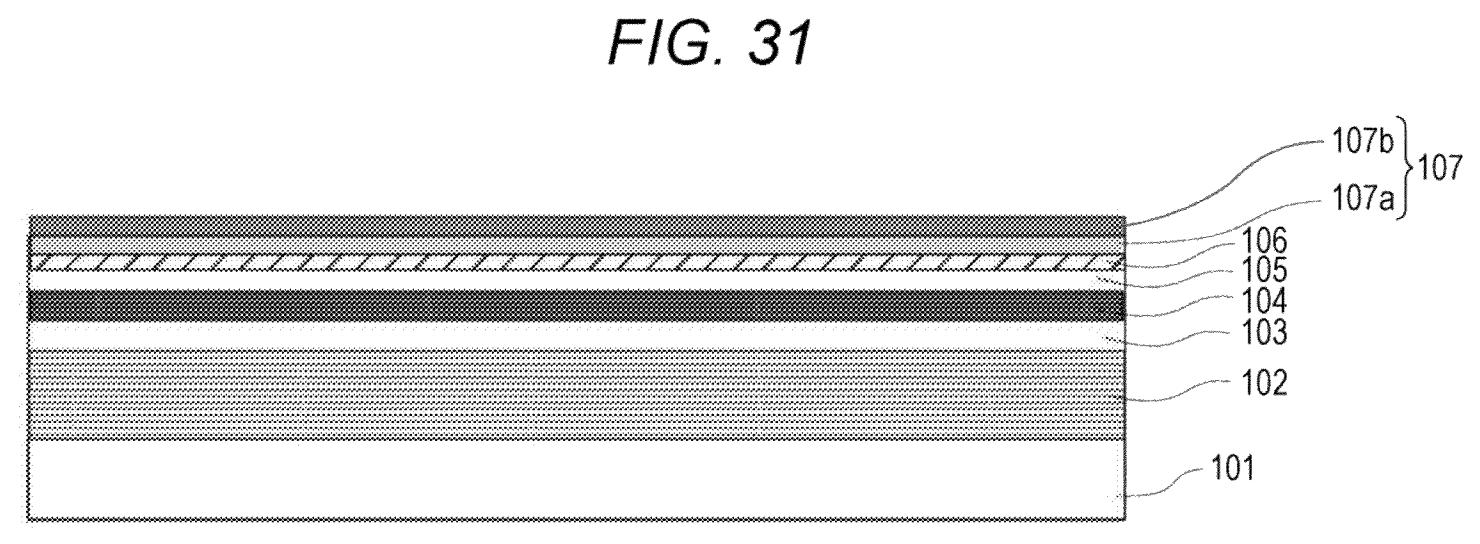

In the next step S11-5, the n-type semiconductor layer 107b is laminated on the p-type semiconductor layer 107a (see FIG. 31). As a result, the tunnel junction 107 is formed.

Figure 32:
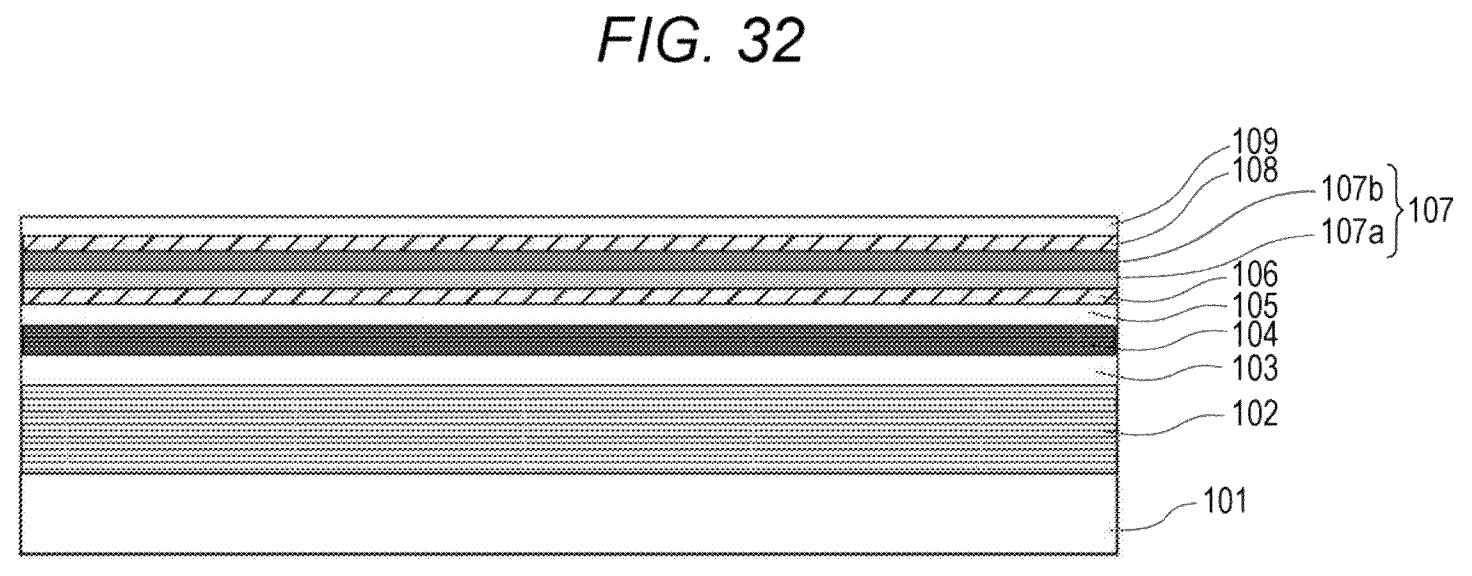

In the next step S11-6, the second composition gradient layer 108 is laminated on the n-type semiconductor layer 107b (see FIG. 32). Further, the second spacer layer 109 is laminated on the second composition gradient layer 108.

Figure 33:
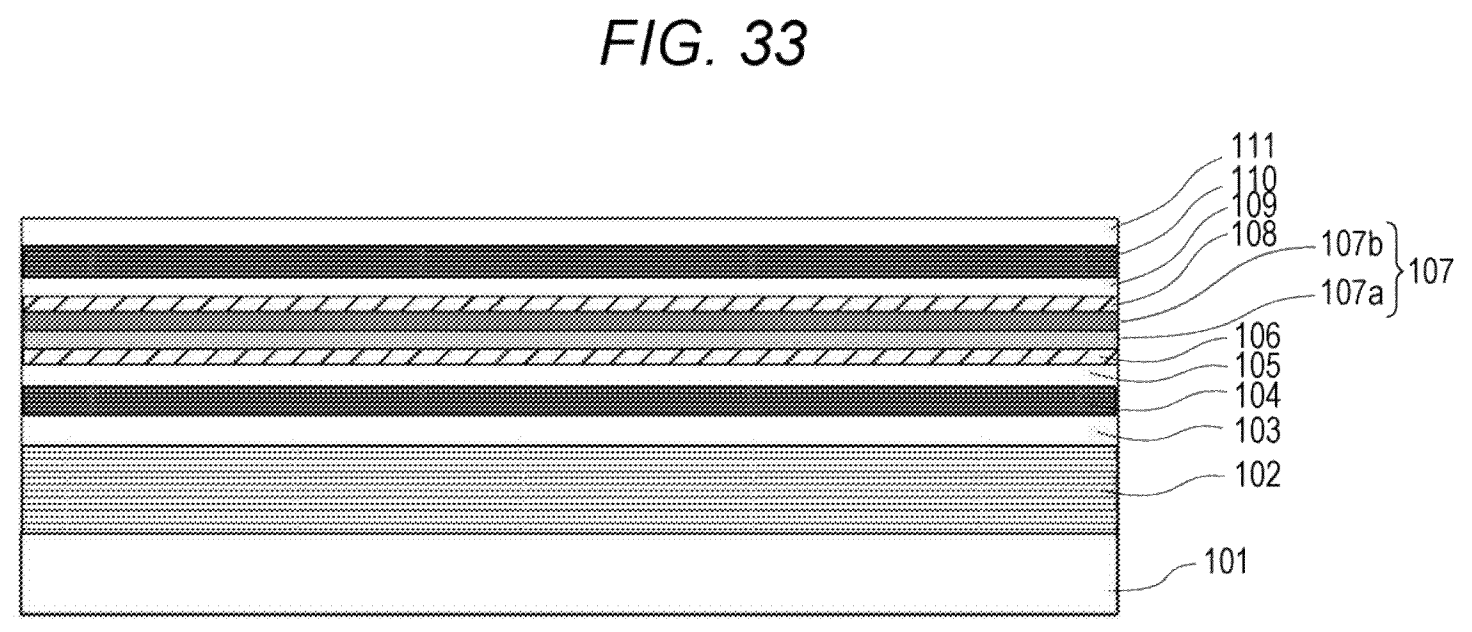

In the next step S11-7, the second active layer 110 is laminated on the second composition gradient layer 108 (see FIG. 33). More specifically, the second active layer 110 is laminated on the second spacer layer 109. Further, the second cladding layer 111 is laminated on the second active layer 110.

Figure 34:
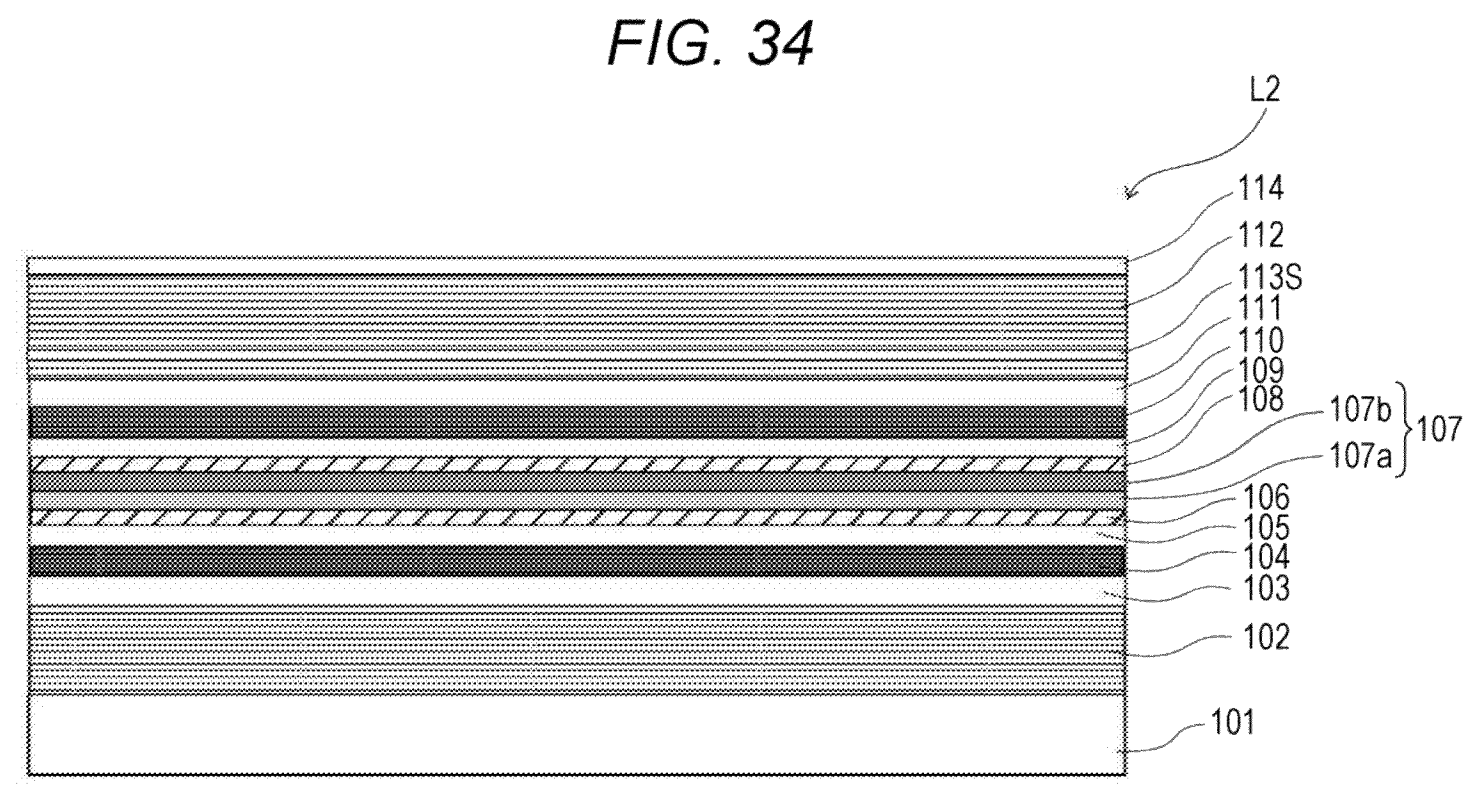

In the next step S11-8, the second multilayer film reflector 112 is laminated on the second active layer 110 (see FIG. 34). More specifically, the second multilayer film reflector 112 including the selected oxide layer 113S serving as the current confinement layer 113 therein is laminated on the second cladding layer 111. Further, the contact layer 114 is laminated on the second multilayer film reflector 112. As a result, the laminate L2 is generated.

<Step S12>

Figure 35:
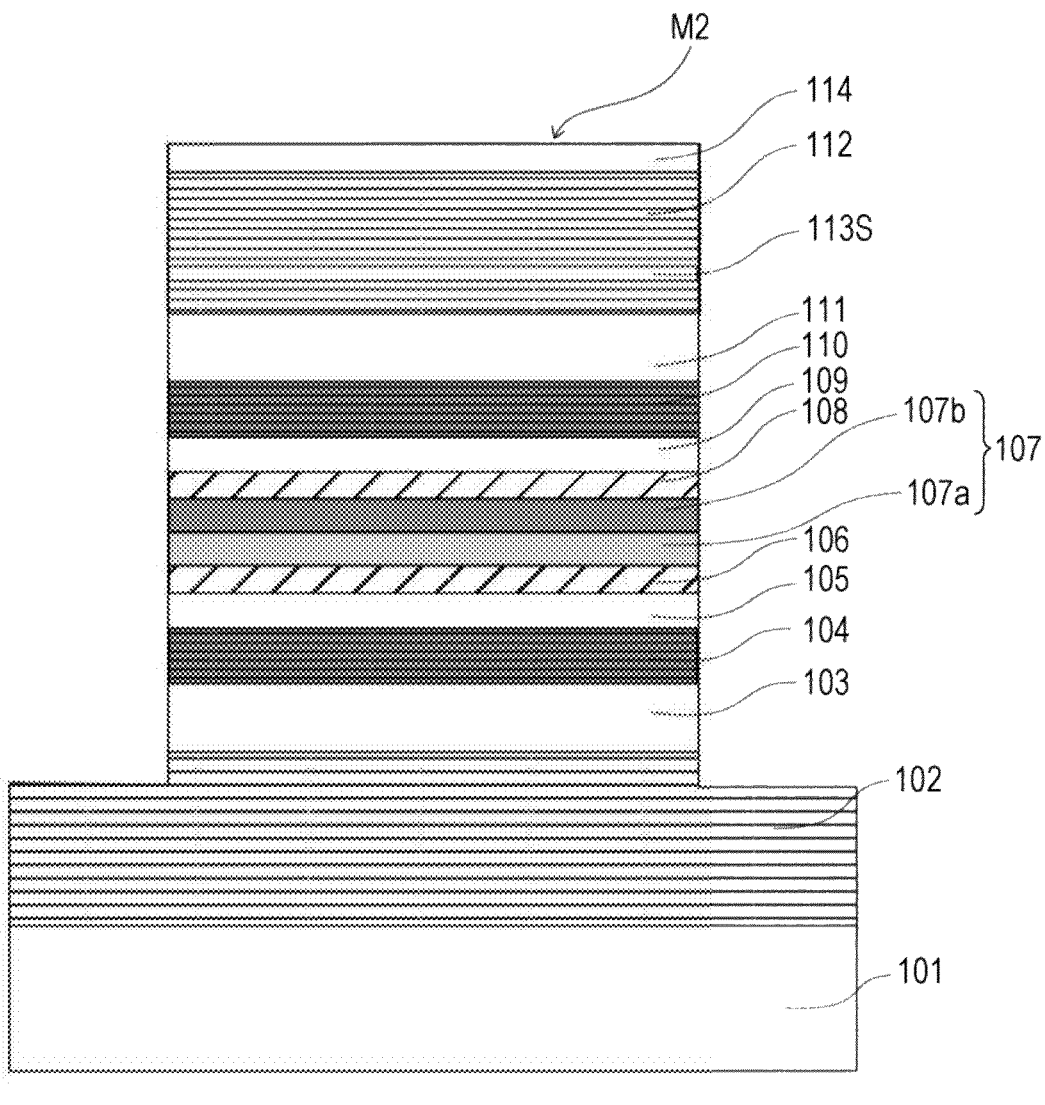
FIG. 35 is a second step diagram of FIG. 28.

In step S12, the laminate L2 is etched to form a mesa M2 (see FIG. 35).

Specifically, a resist pattern is formed by photolithography on the laminate L1 taken out from the growth chamber. Next, using this resist pattern as a mask, the laminate L1 is etched by, for example, RIE etching (reactive ion etching) until at least the side surface of the selected oxide layer 113S is exposed (for example, until the side surface of the first cladding layer 103 is completely exposed), thereby forming the mesa M1. The etching here is performed until the etching bottom surface is located in the first multilayer film reflector 102. Thereafter, the resist pattern is removed.

<Step S13>

Figure 36:
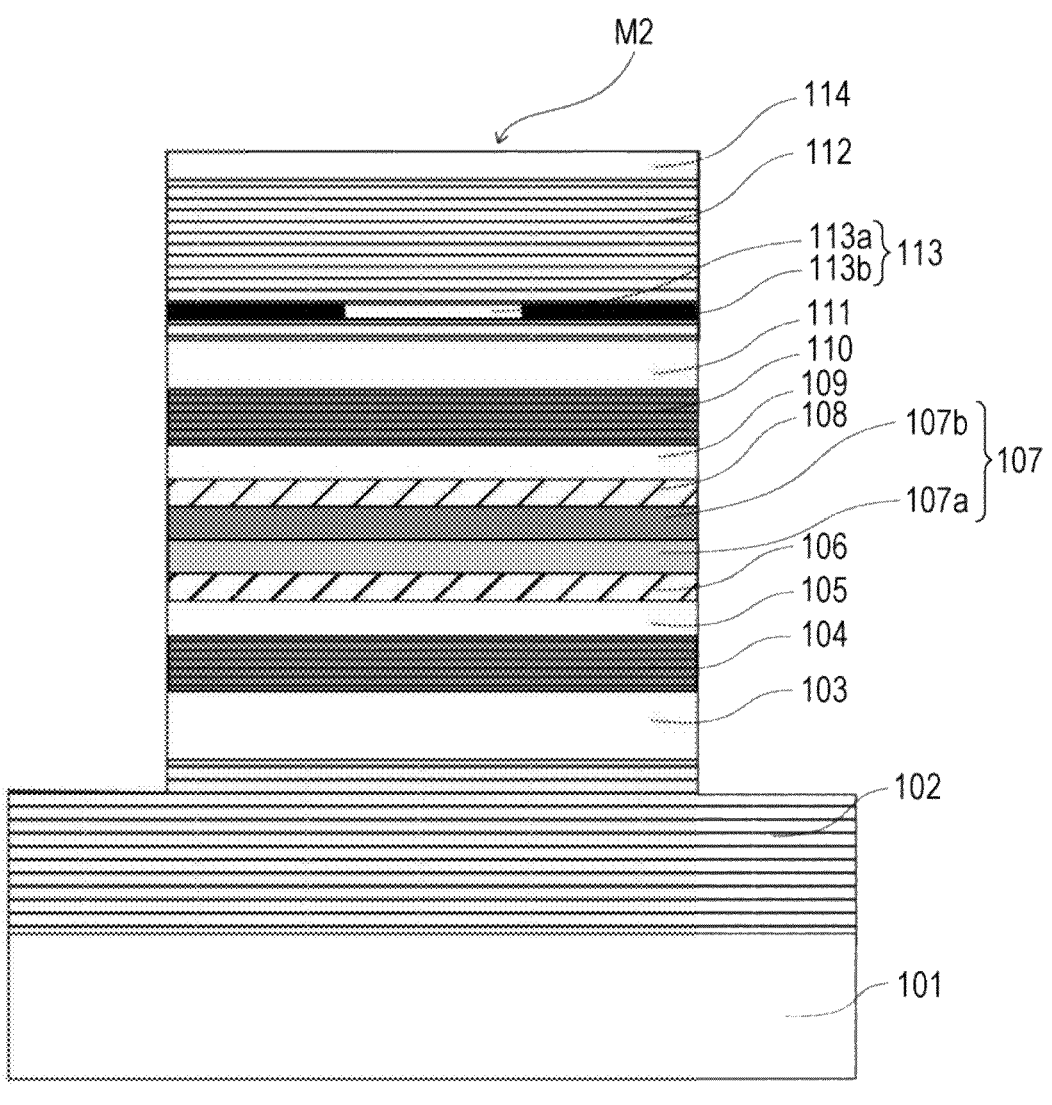
FIG. 36 is a third step diagram of FIG. 28.

In step S13, the peripheral portion of the selected oxide layer 113S (see FIG. 36) is oxidized to generate the current confinement layer 113.

Specifically, the mesa M2 is exposed to a water vapor atmosphere, and the selected oxide layer 113S is oxidized (selectively oxidized) from the side surface to form the current confinement layer 113 in which the non-oxidized region 113a is surrounded by the oxidized region 113b.

<Step S14>

Figure 37:
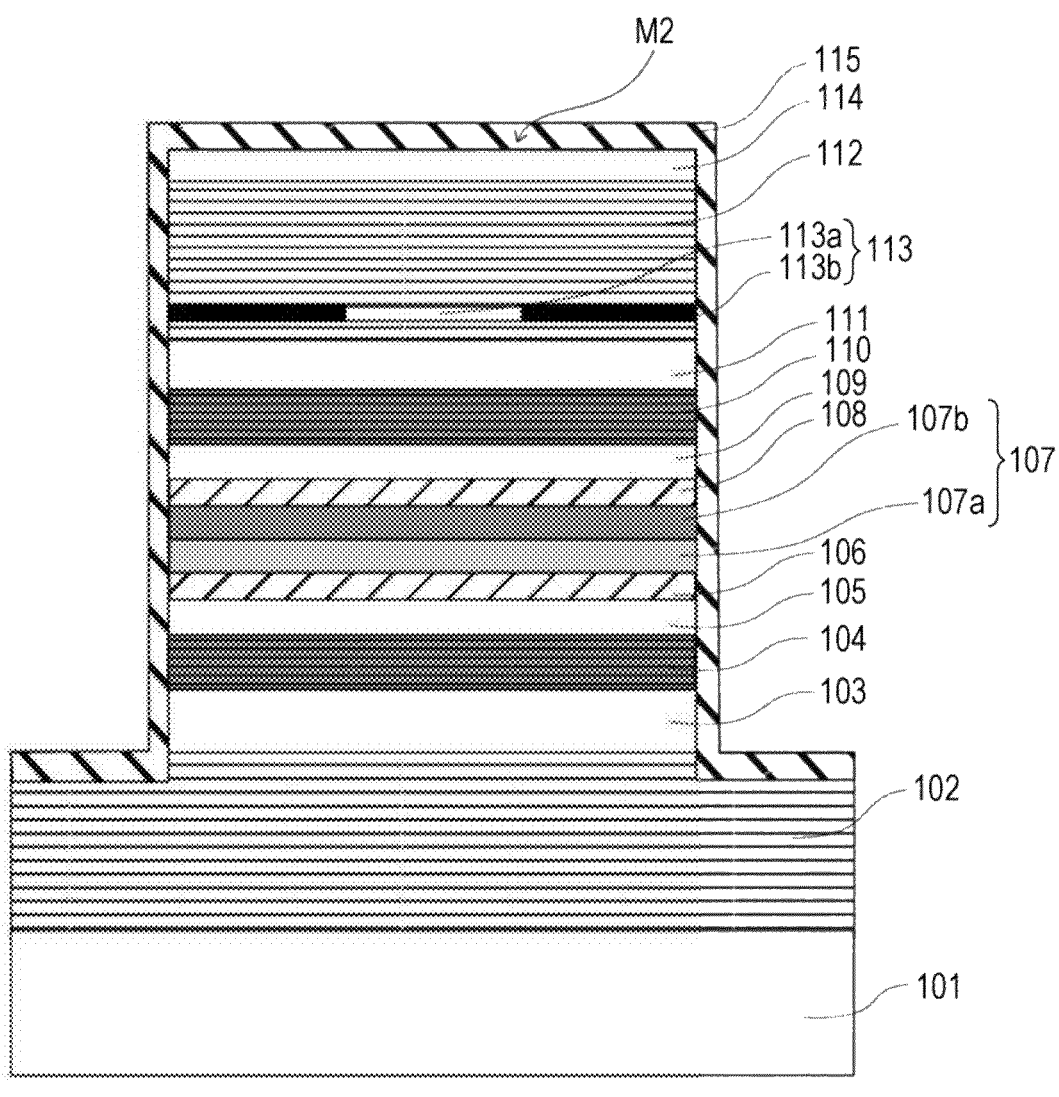
FIG. 37 is a fourth step diagram of FIG. 28.

In step S14, the insulating film 115 is formed (see FIG. 37). Specifically, the insulating film 115 is formed over substantially the entire area of the laminate on which the mesa M2 is formed.

<Step S15>

Figure 38:
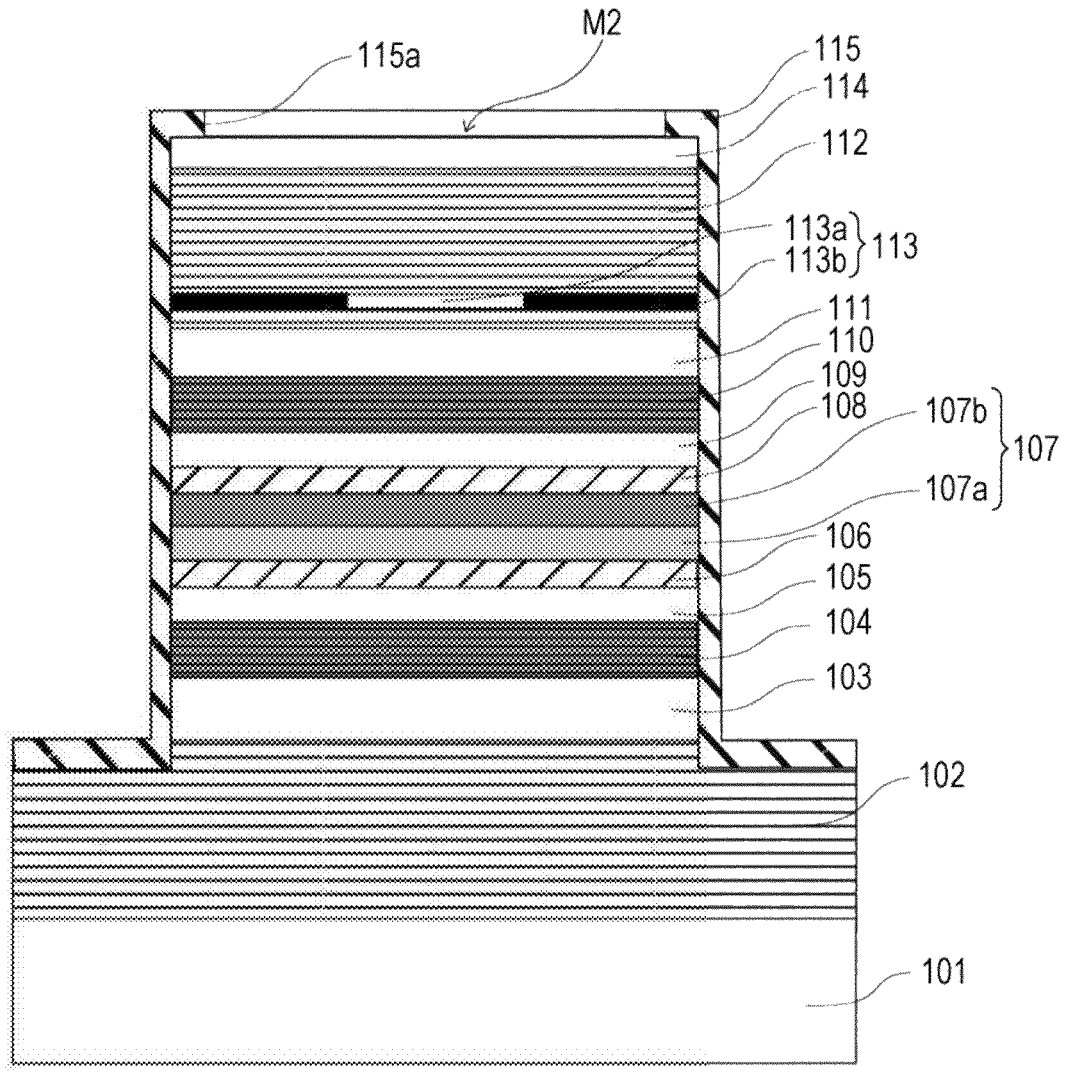
FIG. 38 is a fifth step diagram of FIG. 28.

In step S15, the contact hole 115a is formed (see FIG. 38). Specifically, a resist pattern is formed by photolithography on the insulating film 115 other than the insulating film 115 formed on the top of the mesa M2.

Next, using this resist pattern as a mask, the insulating film 115 formed on the top of the mesa M2 is removed by etching using, for example, a hydrofluoric acid-based etchant. Thereafter, the resist pattern is removed. As a result, the contact hole 115a is formed, and the contact layer 114 is exposed.

<Step S16>

Figure 39:
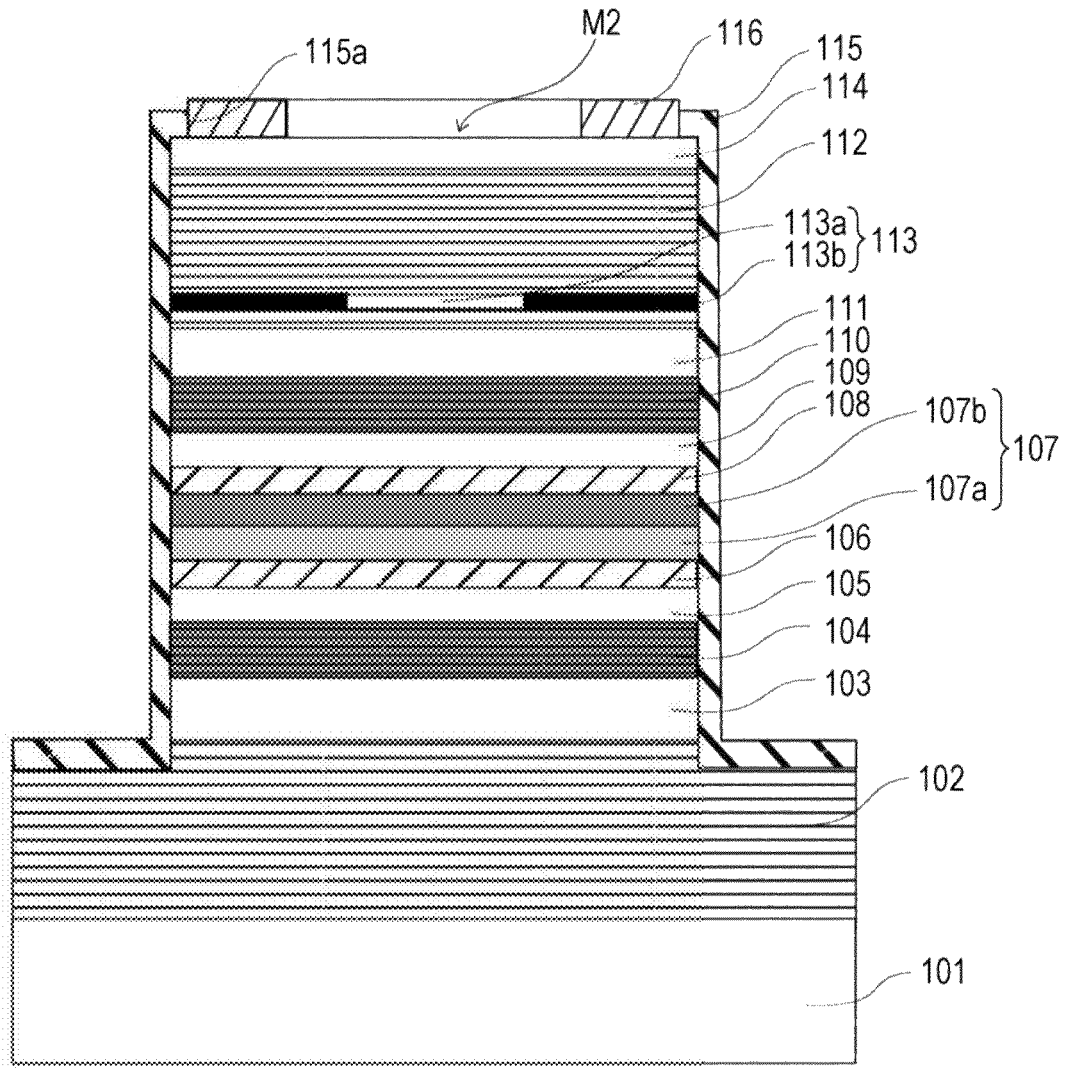
FIG. 39 is a sixth step diagram of FIG. 28.

In step S16, the anode electrode 116 is formed (see FIG. 39). Specifically, for example, a Ti/Pt/Au film is formed on the contact layer 114 via the contact hole 115a by an EB vapor deposition method, and the resist and, for example, Ti/Pt/Au on the resist are lifted off to form the anode electrode 116 in the contact hole 115a.

<Step S17>

Figure 40:
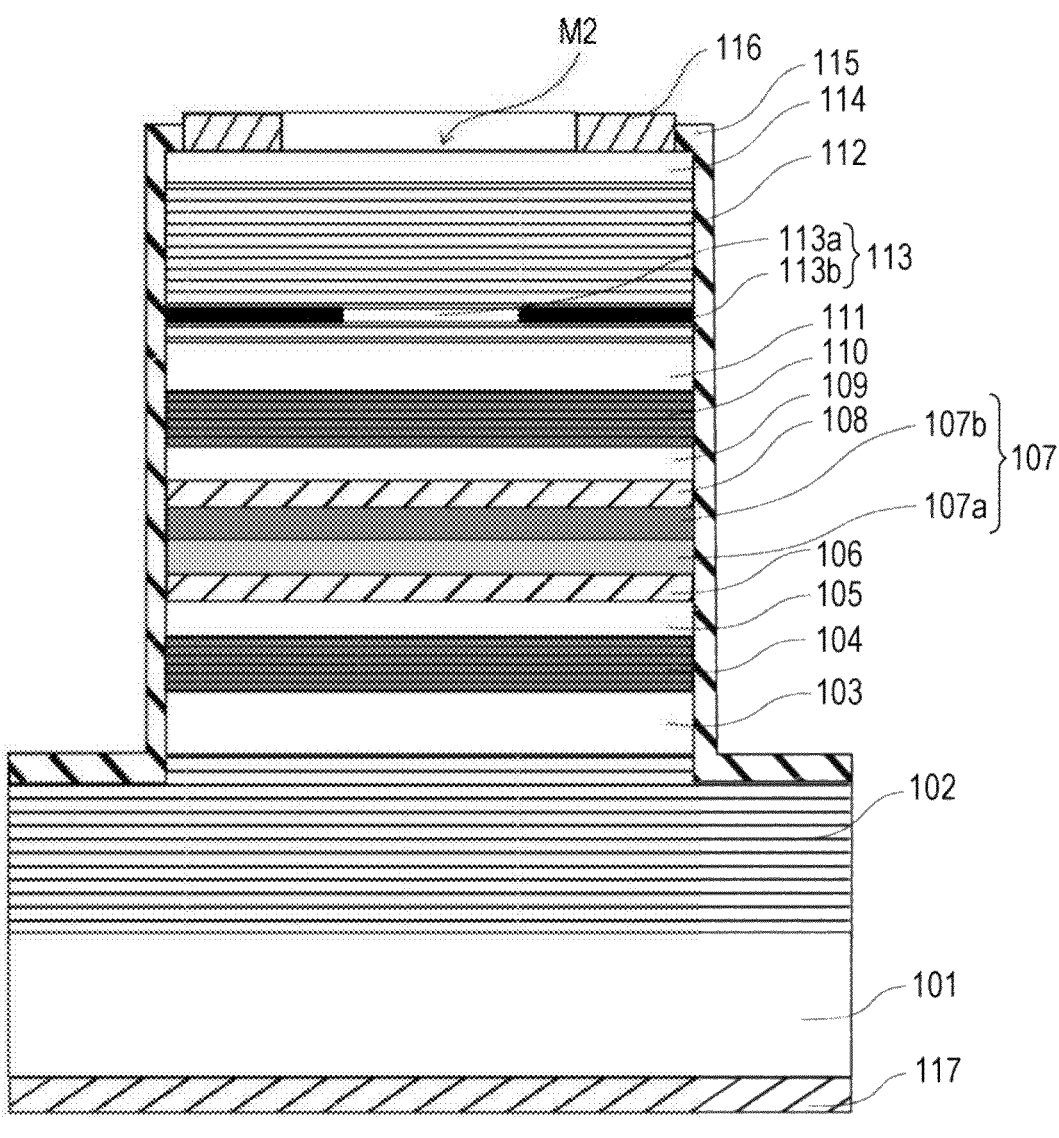
FIG. 40 is a seventh step diagram of FIG. 28.

In step S17, the cathode electrode 117 is formed (see FIG. 40). Specifically, after the back surface (lower surface) of the substrate 101 is polished, for example, an AuGe/Ni/Au film is formed on the back surface.

(4) Effects of Surface Emitting Laser

The surface emitting laser 200 of the second embodiment includes: the first and second multilayer film reflectors 102 and 112 laminated together; the plurality of active layers 104 and 110 laminated together between the first and second multilayer film reflectors 102 and 112; the tunnel junction 107 disposed between the first and second active layers 104 and 110 adjacent to each other among the plurality of active layers 104 and 110; the first composition gradient layer 106 disposed between the first active layer 104 and the tunnel junction 107; and the second composition gradient layer 108 disposed between the second active layer 110 and the tunnel junction 107.

Accordingly, it is possible to reduce the voltage drop between the first active layer 104 and the tunnel junction 107 and reduce the voltage drop between the second active layer 110 and the tunnel junction 107, and it is possible to provide a surface emitting laser having excellent light emission characteristics.

The surface emitting laser 200 further includes a first spacer layer 105 disposed between the first active layer 104 and the first composition gradient layer 106, the first active layer 104 having the first composition gradient layer 106 disposed between the tunnel junction 107 and one of the first and second active layers 104 and 110. Accordingly, the positions of the active layers and the tunnel junction 107 can be controlled according to the optical field intensity inside the resonator.

The surface emitting laser 200 further includes a second spacer layer 109 disposed between the second active layer 110 and the second composition gradient layer 108, the second active layer 110 having the second composition gradient layer 108 disposed between the tunnel junction 107 and one of the first and second active layers 104 and 110. Accordingly, the positions of the active layers and the tunnel junction 107 can be controlled according to the optical field intensity inside the resonator.

Note that, in the surface emitting laser 200, similarly to the surface emitting laser 100 of the first embodiment, the p-type semiconductor layer 107a of the tunnel junction 107 may have a laminated structure including the first p-type semiconductor region 107a1 and the second p-type semiconductor region 107a2.

In this case, the first p-type semiconductor region 107a1 may be disposed between the n-type semiconductor layer 107b and the second p-type semiconductor region 107a2. In this case, for example, by using a material having a small band gap for the first p-type semiconductor region 107a1, resistance in a region near the pn junction of the p-type semiconductor layer 107a can be reduced.

In this case, the first p-type semiconductor region 107a1 may be in contact with the n-type semiconductor layer 107b. In this case, for example, by using a material having a small band gap for the first p-type semiconductor region 107a1, resistance at the pn junction can be reduced, and resistance at the tunnel junction 107 can be further reduced.

In this case, the second p-type semiconductor region 107a2 may be in contact with the first p-type semiconductor region 107a1. In this case, for example, by using a material having a high carrier concentration for the first p-type semiconductor region 107a1, resistance in a region other than the vicinity of the pn junction of the p-type semiconductor layer 107a can be reduced.

In this case, the first p-type semiconductor region 107a1 may be in contact with the n-type semiconductor layer 107b, and the second p-type semiconductor region 107a2 may be in contact with the first p-type semiconductor region 107a1. In this case, for example, by using a material having a small band gap for the first p-type semiconductor region 107a1 and using a material having a high carrier concentration for the first p-type semiconductor region 107a1, resistance in the entire p-type semiconductor layer 107a can be reduced, and resistance at the tunnel junction 107 can be significantly reduced.

Here, originally, it is desirable that the first p-type semiconductor region 107a1 have a high carrier concentration, but it is difficult to obtain a high carrier concentration with a material maintaining a small band gap. Therefore, therefore, the carrier concentration of the second p-type semiconductor region 107a2 is preferably higher than the carrier concentration of the first p-type semiconductor region 107a1.

In this case, the band gap of the first p-type semiconductor region 107a1 is preferably smaller than the band gap of the second p-type semiconductor region 107a2.

In this case, the first p-type semiconductor region 107a1 is preferably formed by a GaAs compound semiconductor, an AlGaAs-based compound semiconductor, or an InGaAs-based compound semiconductor.

In this case, the second p-type semiconductor region 107a2 is preferably formed by a GaAs compound semiconductor, an AlGaInAs-based compound semiconductor, or an AlGaAs-based compound semiconductor.

In this case, the Al composition of the second p-type semiconductor region 107a2 is preferably higher than the Al composition of the first p-type semiconductor region 107a1.

In this case, the first p-type semiconductor region 107a1 and/or the second p-type semiconductor region 107a2 are preferably doped with at least one of C, Zn, Mg, or Be.

4. Surface Emitting Lasers According to Modifications 1 to 14 of Second Embodiment of Present Technology Hereinafter, surface emitting lasers according to Modifications 1 to 14 of the second embodiment of the present technology will be described.

(Modification 1)

Figure 41:
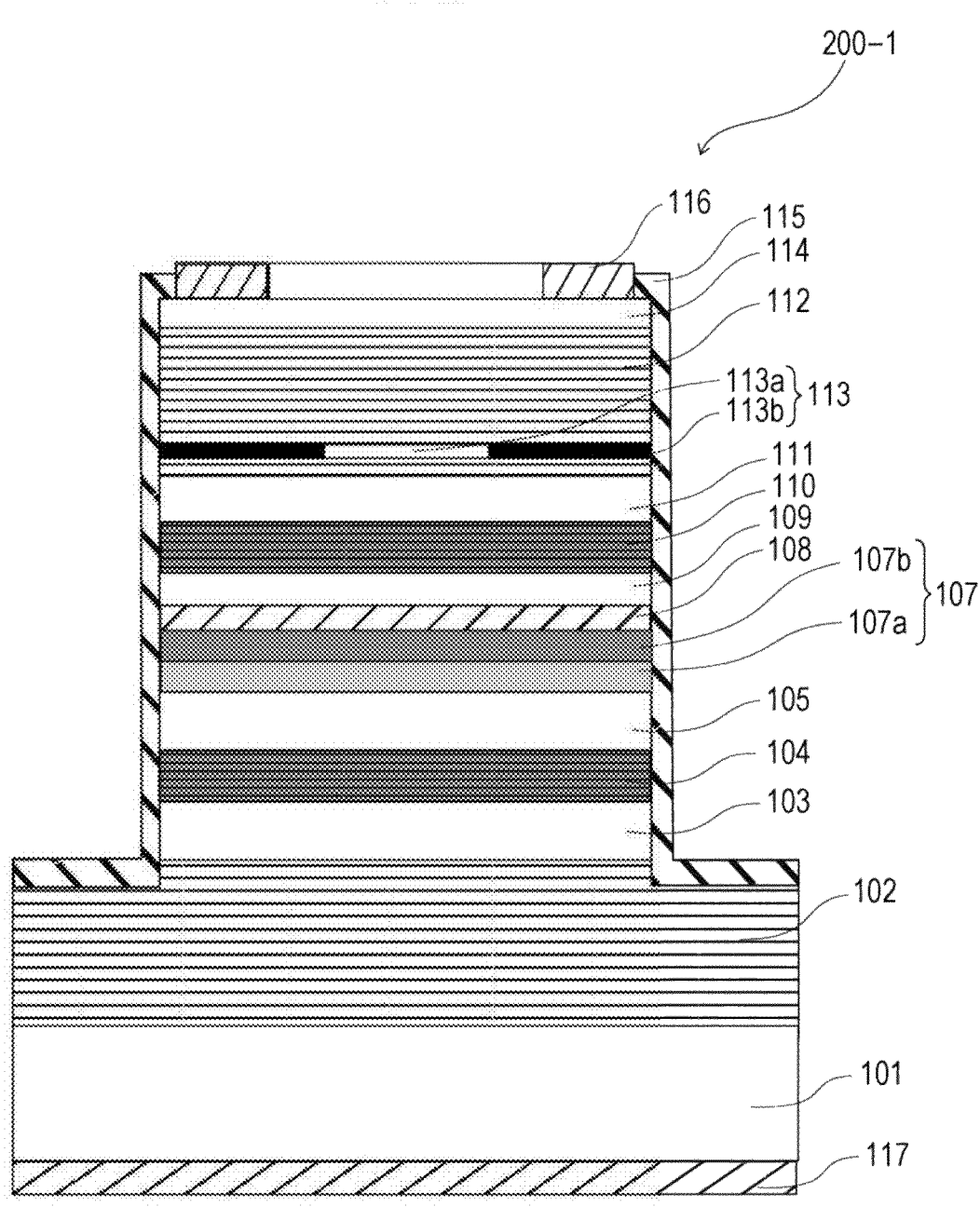
FIG. 41 is a cross-sectional view illustrating a configuration of a surface emitting laser according to Modification 1 of the second embodiment of the present technology.

As illustrated in FIG. 41, a surface emitting laser 200-1 of Modification 1 has a configuration similar to that of the surface emitting laser 200 of the second embodiment except that the first composition gradient layer 106 is not provided.

Since the surface emitting laser 200-1 is not provided with the first composition gradient layer 106, it is inferior to the surface emitting laser 200 in terms of reduction in resistance between the first active layer 104 and the tunnel junction 107, but it is effective in that the layer configuration can be simplified and the number of lamination steps can be reduced by one in the laminate generation process.

(Modification 2)

Figure 42:
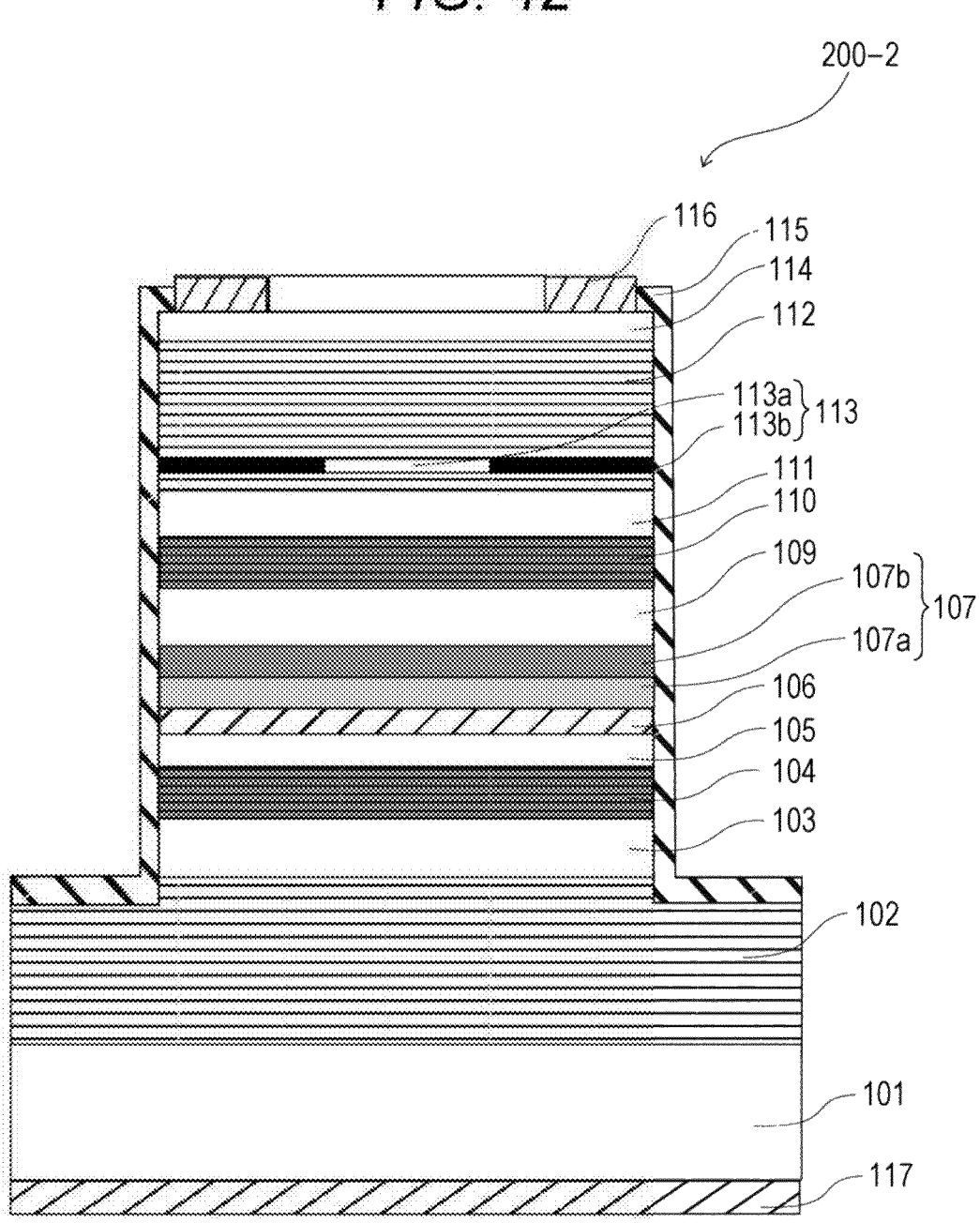
FIG. 42 is a cross-sectional view illustrating a configuration of a surface emitting laser according to Modification 2 of the second embodiment of the present technology.

As illustrated in FIG. 42, a surface emitting laser 200-2 of Modification 2 has a configuration similar to that of the surface emitting laser 200 of the second embodiment except that the second composition gradient layer 108 is not provided.

Since the surface emitting laser 200-2 is not provided with the second composition gradient layer 108, it is inferior to the surface emitting laser 200 in terms of reduction in resistance between the second active layer 110 and the tunnel junction 107, but it is effective in that the layer configuration can be further simplified and the number of lamination steps can be reduced by one in the laminate generation process.

(Modification 3)

Figure 43:
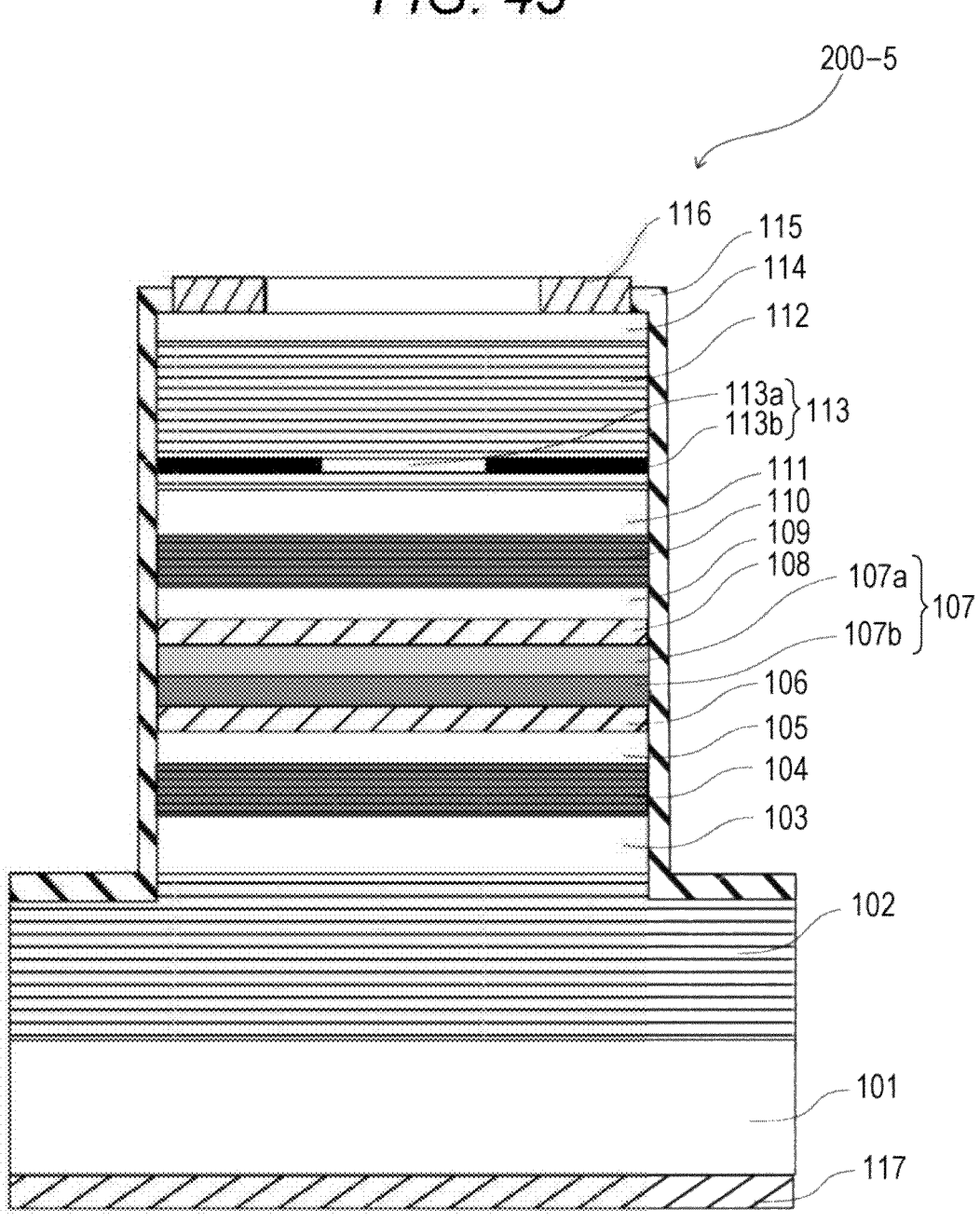
FIG. 43 is a cross-sectional view illustrating a configuration of a surface emitting laser according to Modification 3 of the second embodiment of the present technology.

As illustrated in FIG. 43, a surface emitting laser 200-5 of Modification 3 has a configuration in which conductivity types (first and second conductivity types, for example, p-type and n-type) of layers constituting the surface emitting laser 200 of the second embodiment are interchanged. In this case, the n-type semiconductor layer 107b is disposed on the substrate 101 side of the p-type semiconductor layer 107a at the tunnel junction 107.

The surface emitting laser 200-5 also has an effect similar to that of the surface emitting laser 200.

(Modification 4)

Figure 44:
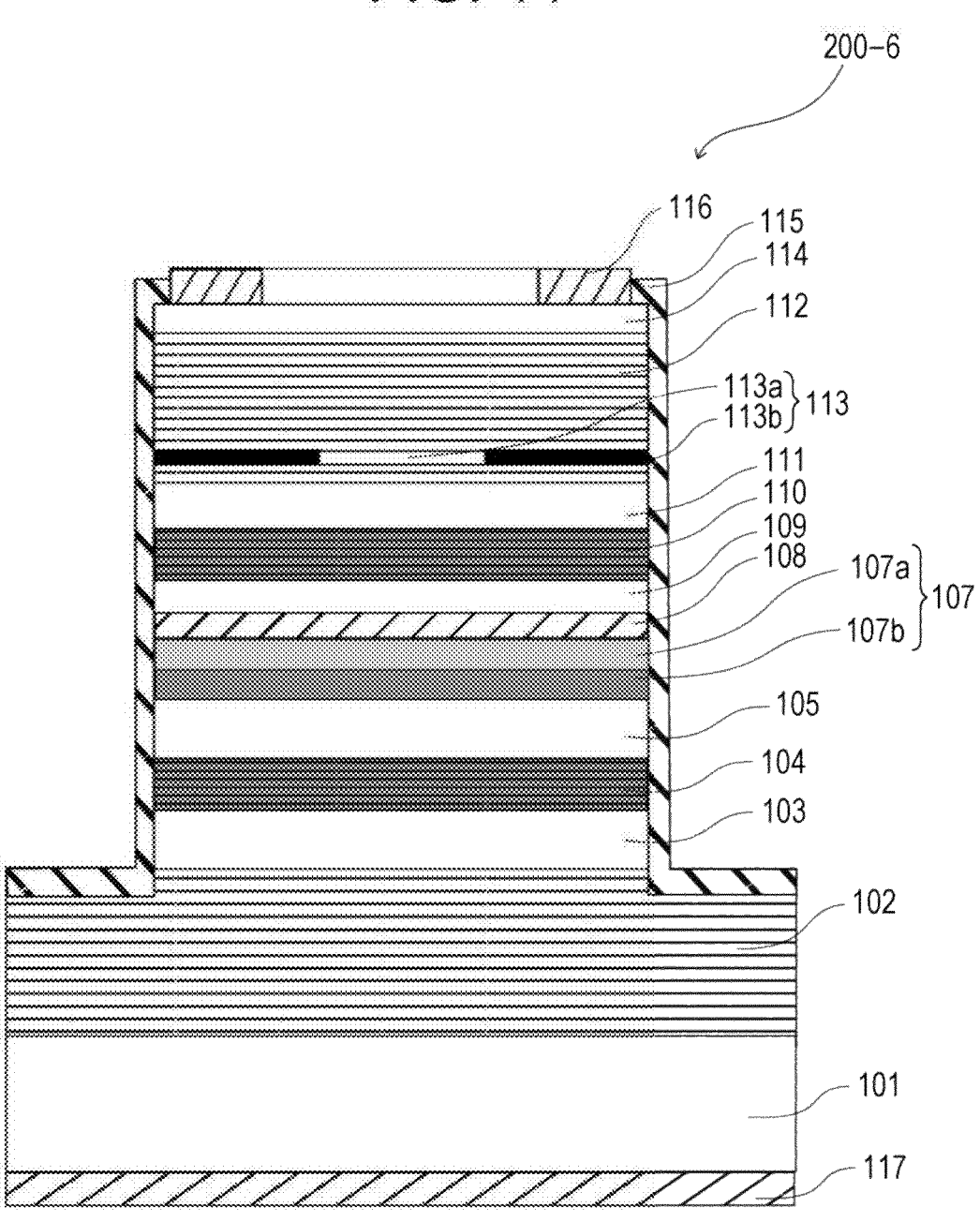
FIG. 44 is a cross-sectional view illustrating a configuration of a surface emitting laser according to Modification 4 of the second embodiment of the present technology.

As illustrated in FIG. 44, a surface emitting laser 200-6 of Modification 4 has a configuration similar to that of the surface emitting laser 200-5 of Modification 3 except that the first composition gradient layer 106 is not provided.

(Modification 5)

Figure 45:
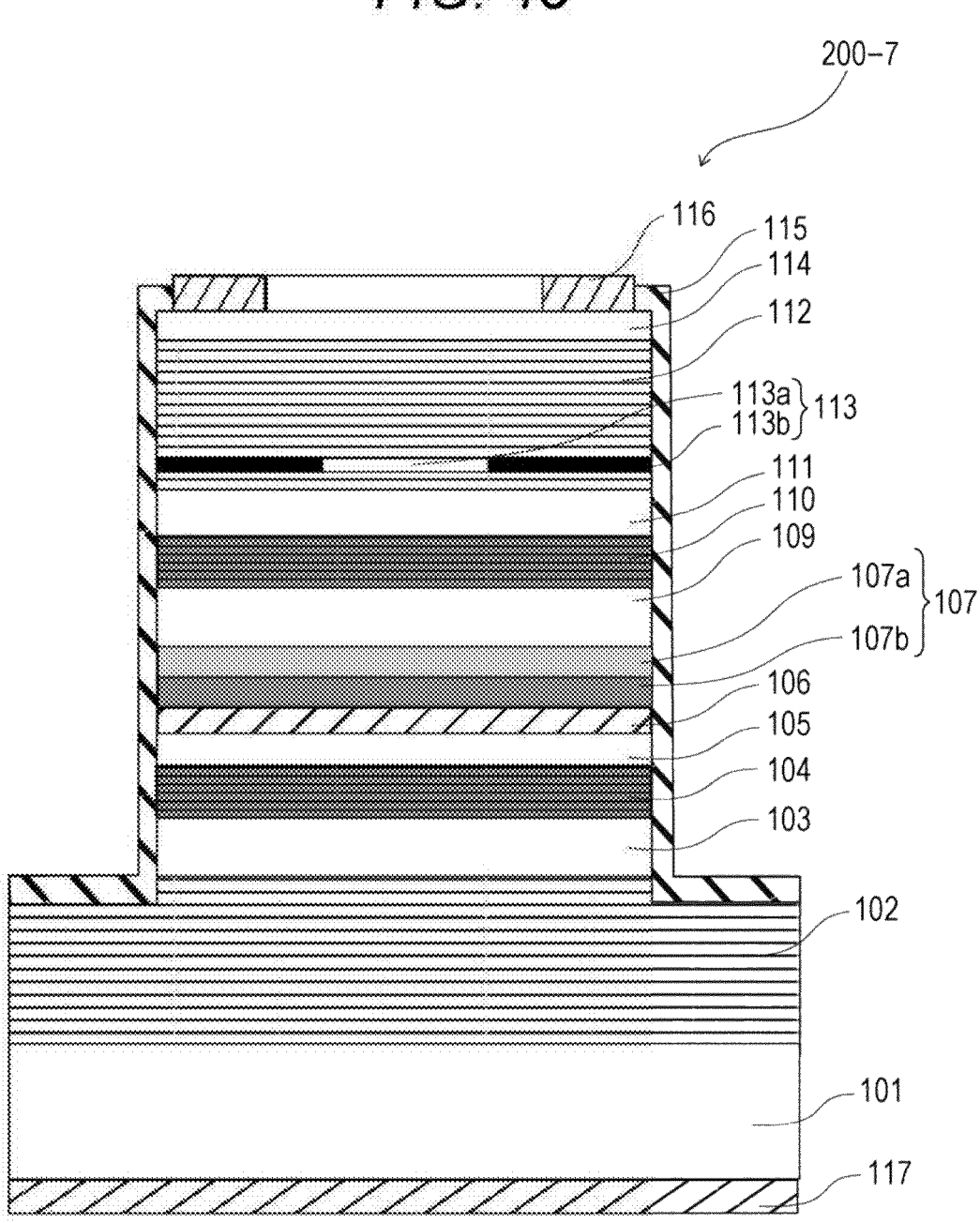
FIG. 45 is a cross-sectional view illustrating a configuration of a surface emitting laser according to Modification 5 of the second embodiment of the present technology.

As illustrated in FIG. 45, a surface emitting laser 200-7 of Modification 5 has a configuration similar to that of the surface emitting laser 200-5 of Modification 3 except that the second composition gradient layer 108 is not provided.

(Modification 6)

Figure 46:
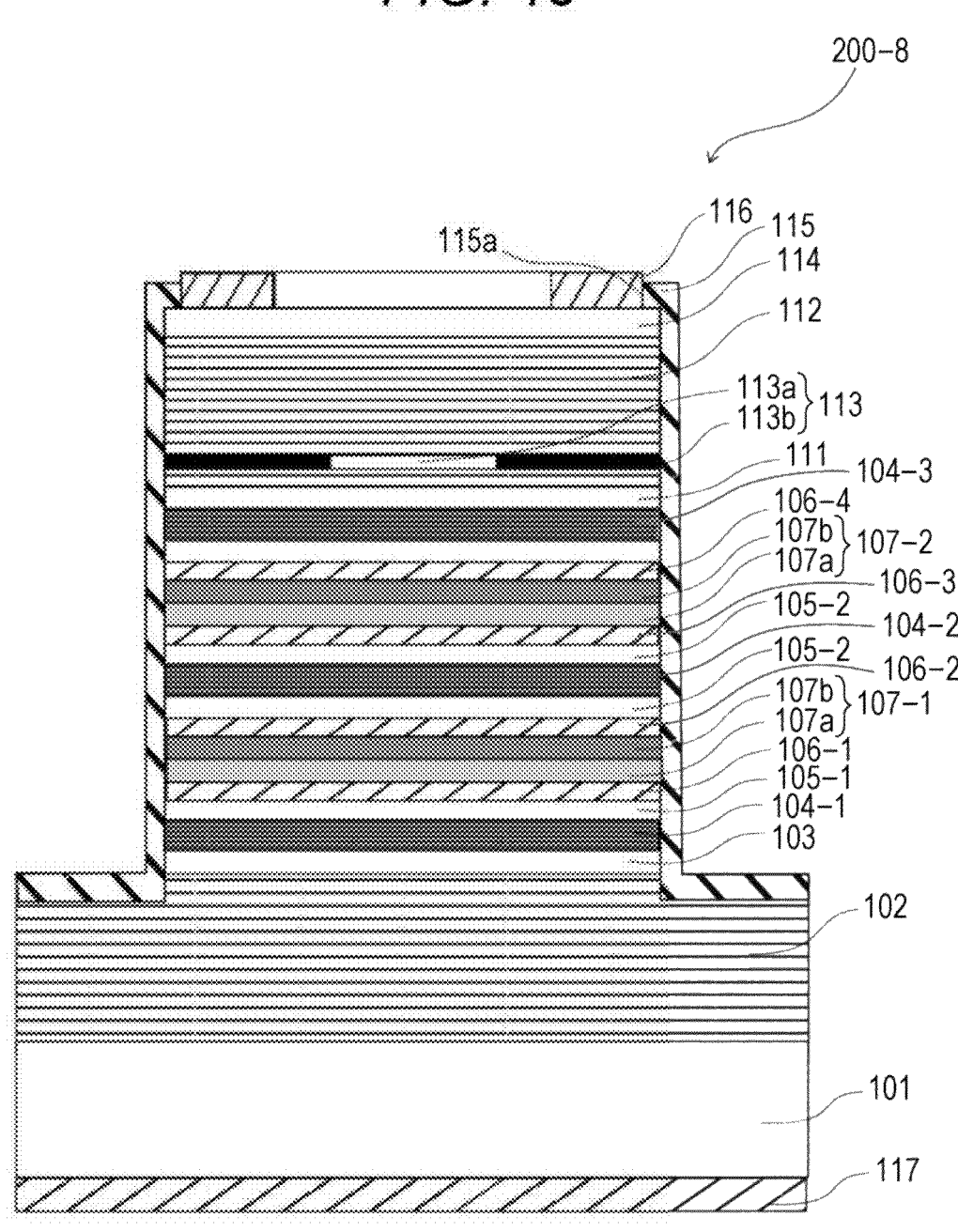
FIG. 46 is a cross-sectional view illustrating a configuration of a surface emitting laser according to Modification 6 of the second embodiment of the present technology.

As illustrated in FIG. 46, a surface emitting laser 200-8 of Modification 6 includes first to third active layers 104-1, 104-2, and 104-3 laminated together. Each active layer has a configuration and a function similar to those of the first active layer 104 described above.

The surface emitting laser 200-8 further includes a first tunnel junction 107-1 disposed between the first and second active layers 104-1 and 104-2 adjacent to each other in the lamination direction, and a second tunnel junction 107-2 disposed between the second and third active layers 104-2 and 104-3 adjacent to each other in the lamination direction. Each tunnel junction has a configuration and a function similar to those of the tunnel junction 107 described above.

The surface emitting laser 200-8 further includes a first composition gradient layer 106-1 disposed between the first active layer 104-1 and the first tunnel junction 107-1, a second composition gradient layer 106-2 disposed between the second active layer 104-2 and the first tunnel junction 107-1, a third composition gradient layer 106-3 disposed between the second active layer 104-2 and the second tunnel junction 107-2, and a fourth composition gradient layer 106-4 disposed between the third active layer 104-3 and the second tunnel junction 107-2. Each composition gradient layer has a configuration and a function similar to those of the first composition gradient layer 106 described above.

In the surface emitting laser 200-8, the plurality of active layers is at least three active layers including the first to third active layers 104-1, 104-2, and 104-3, the first tunnel junction 107-1 is disposed between the first and second active layers 104-1 and 104-2 which are two adjacent active layers of the first set of a plurality of sets of two adjacent active layers (set of first and second active layers 104-1 and 104-2 and set of second and third active layers 104-2 and 104-3) of the at least three active layers, and the second tunnel junction 107-2 is disposed between the second and third active layers 104-2 and 104-3 which are two adjacent active layers of the second set. The first composition gradient layer 106-1 is disposed between the first tunnel junction 107-1 which is one tunnel junction of a plurality of (for example, two) tunnel junctions, and the first active layer 104-1 which is one active layer of the first and second active layers 104-1 and 104-2 which are two adjacent active layers sandwiching the first tunnel junction 107-1. The second composition gradient layer 106-2 is disposed between the first tunnel junction 107-1 and the second active layer 104-2 which is the other active layer of the first and second active layers 104-1 and 104-2 which are two adjacent active layers sandwiching the first tunnel junction 107-1. The third composition gradient layer 106-3 is disposed between the second tunnel junction 107-2 which is the other tunnel junction of the plurality of (for example, two) tunnel junctions and the second active layer 104-2 which is one active layer of the second and third active layers 104-2 and 104-3 which are two adjacent active layers sandwiching the second tunnel junction 107-2. The fourth composition gradient layer 106-4 is disposed between the second tunnel junction 107-2 and the third active layer 104-3 which is the other active layer of the second and third active layers 104-2 and 104-3 which are two adjacent active layers sandwiching the second tunnel junction 107-2.

According to the surface emitting laser 200-8 of Modification 6, in the case of including a multi-active layer (three or more active layers) and the tunnel junction disposed between the active layers, since the composition gradient layer is provided in a region between each active layer and the tunnel junction adjacent to the active layer, a voltage drop in the region can be reduced, and the surface emitting laser having excellent light emission characteristics can be realized.

(Modification 7)

Figure 47:
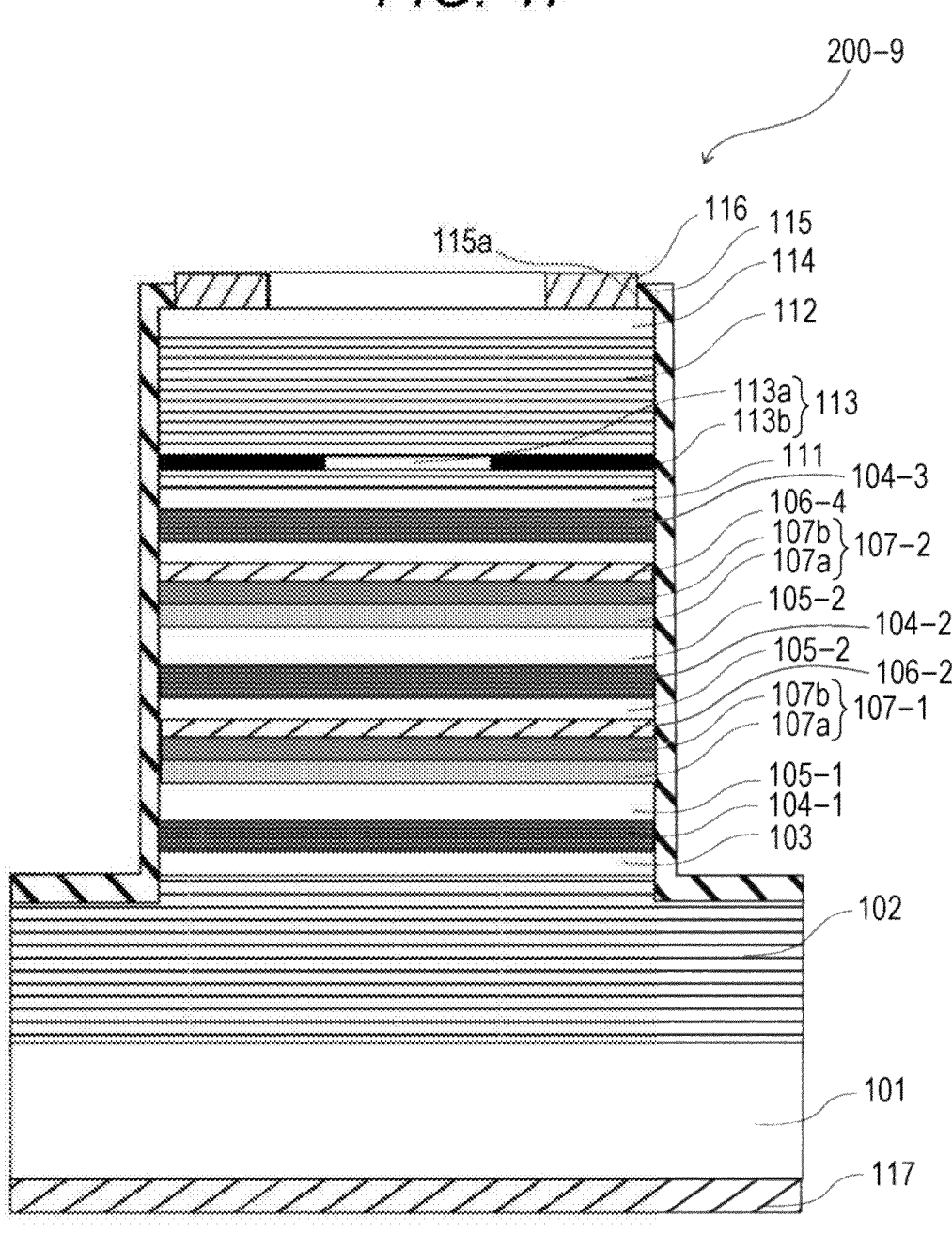
FIG. 47 is a cross-sectional view illustrating a configuration of a surface emitting laser according to Modification 7 of the second embodiment of the present technology.

As illustrated in FIG. 47, a surface emitting laser 200-9 of Modification 7 has a configuration similar to that of the surface emitting laser 200-8 of Modification 6 except that the first and third composition gradient layers 106-1 and 106-3 are not provided.

Although the surface emitting laser 200-7 has a lower degree of improvement in light emission characteristics than the surface emitting laser 200-8, it is effective in that the layer configuration can be further simplified and the number of lamination steps when a laminate is generated at the time of manufacturing can be reduced by two.

(Modification 8)

Figure 48:
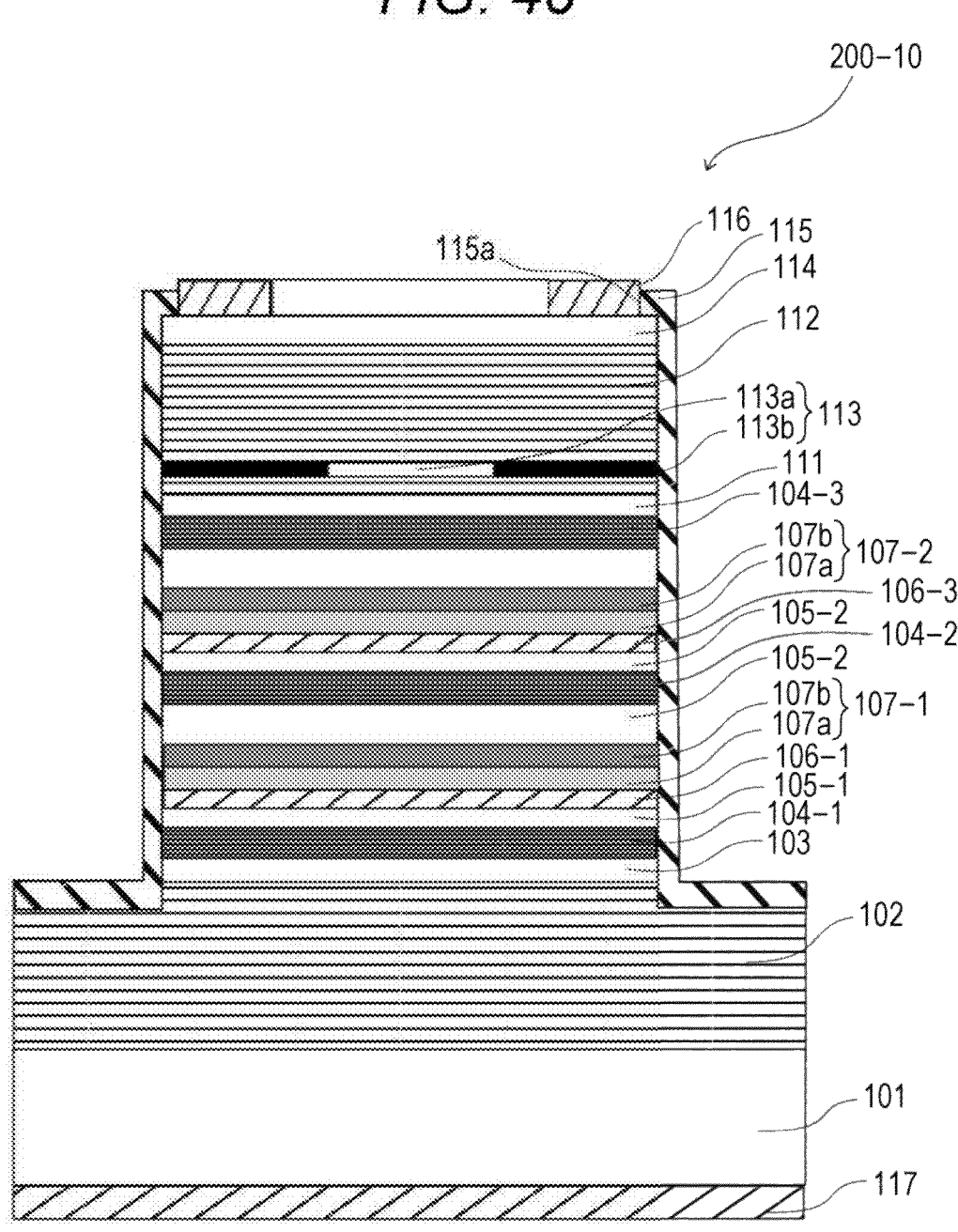
FIG. 48 is a cross-sectional view illustrating a configuration of a surface emitting laser according to Modification 8 of the second embodiment of the present technology.

As illustrated in FIG. 48, a surface emitting laser 200-10 of Modification 8 has a configuration similar to that of the surface emitting laser 200-8 of Modification 6 except that the second and fourth composition gradient layers 106-2 and 106-4 are not provided.

Although the surface emitting laser 200-10 has a lower degree of improvement in light emission characteristics than the surface emitting laser 200-8, it is effective in that the layer configuration can be further simplified and the number of lamination steps when a laminate is generated at the time of manufacturing can be reduced by two.

(Modification 9)

Figure 49:
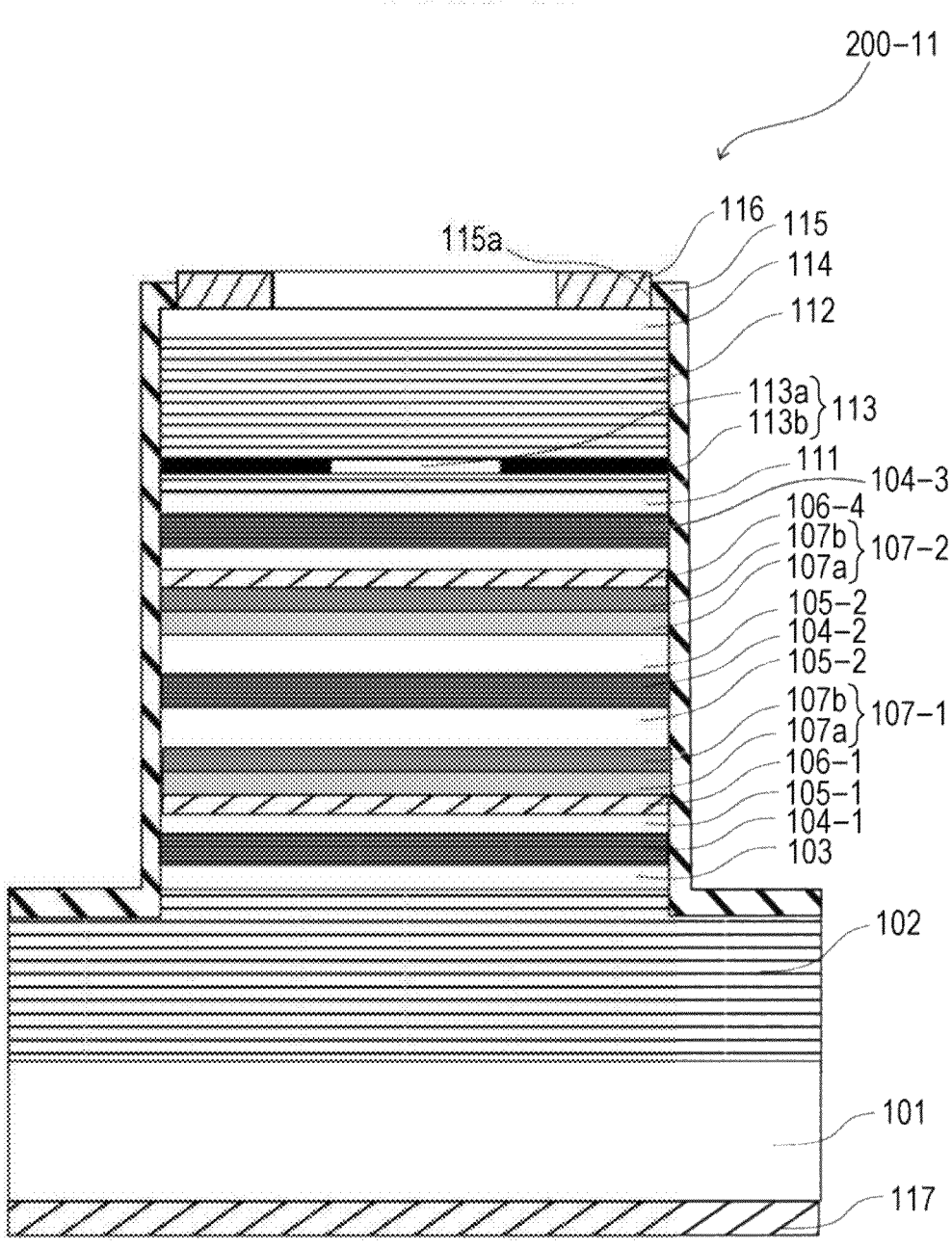
FIG. 49 is a cross-sectional view illustrating a configuration of a surface emitting laser according to Modification 9 of the second embodiment of the present technology.

As illustrated in FIG. 49, a surface emitting laser 200-11 of Modification 9 has a configuration similar to that of the surface emitting laser 200-8 of Modification 6 except that the second and third composition gradient layers 106-2 and 106-3 are not provided.

Although the surface emitting laser 200-11 has a lower degree of improvement in light emission characteristics than the surface emitting laser 200-8, it is effective in that the layer configuration can be further simplified and the number of lamination steps when a laminate is generated at the time of manufacturing can be reduced by two.

(Modification 10)

Figure 50:
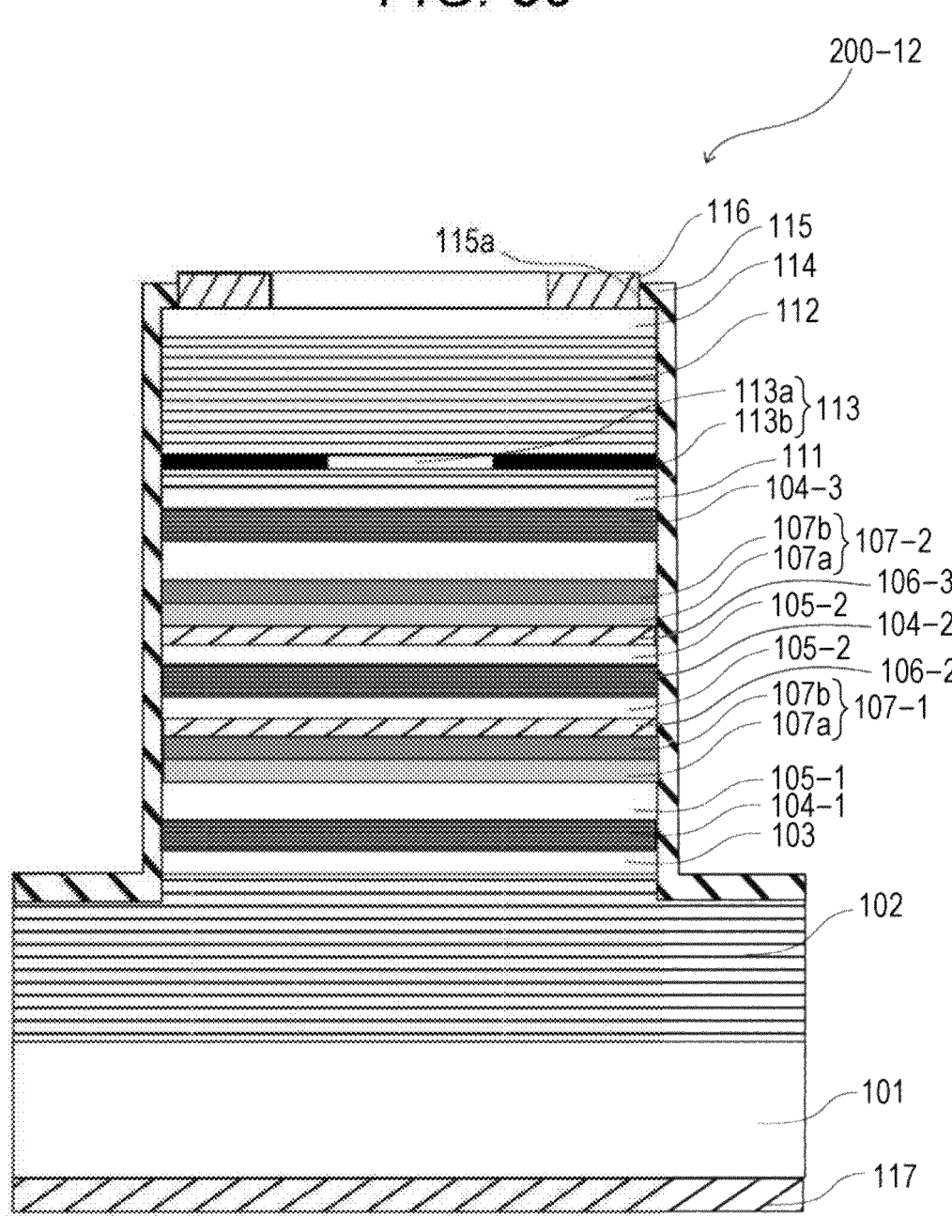
FIG. 50 is a cross-sectional view illustrating a configuration of a surface emitting laser according to Modification 10 of the second embodiment of the present technology.

As illustrated in FIG. 50, a surface emitting laser 200-12 of Modification 10 has a configuration similar to that of the surface emitting laser 200-8 of Modification 6 except that the first and fourth composition gradient layers 106-1 and 106-4 are not provided.

Although the surface emitting laser 200-12 has a lower degree of improvement in light emission characteristics than the surface emitting laser 200-8, it is effective in that the layer configuration can be further simplified and the number of lamination steps when a laminate is generated at the time of manufacturing can be reduced by two.

(Modification 11)

Figure 51:
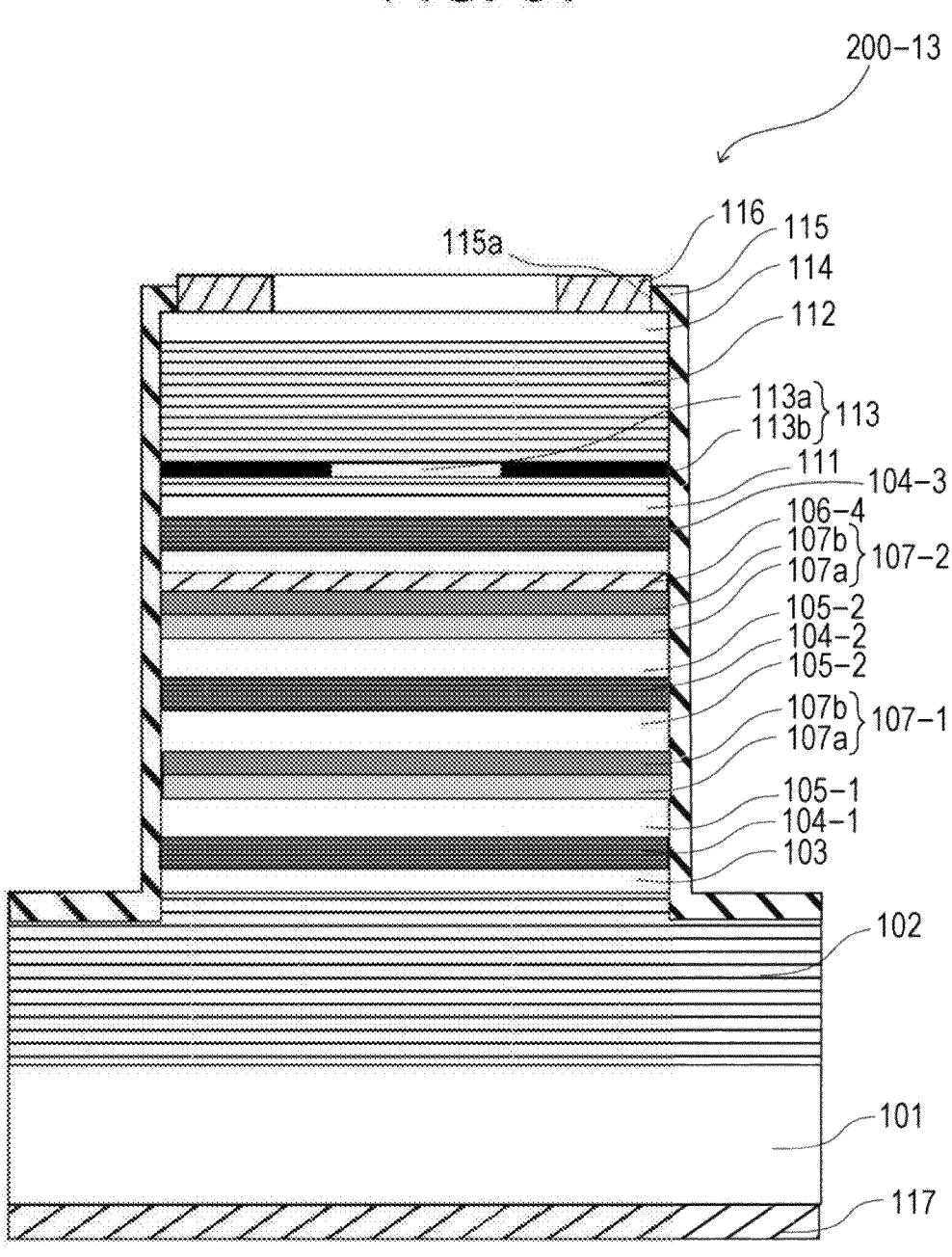
FIG. 51 is a cross-sectional view illustrating a configuration of a surface emitting laser according to Modification 11 of the second embodiment of the present technology.

As illustrated in FIG. 51, a surface emitting laser 200-13 of Modification 11 has a configuration similar to that of the surface emitting laser 200-8 of Modification 6 except that the first to third composition gradient layers 106-1, 106-2, and 106-3 are not provided.

Although the surface emitting laser 200-13 has a lower degree of improvement in light emission characteristics than the surface emitting laser 200-8, it is effective in that the layer configuration can be further simplified and the number of lamination steps when a laminate is generated at the time of manufacturing can be reduced by three.

(Modification 12)

Figure 52:
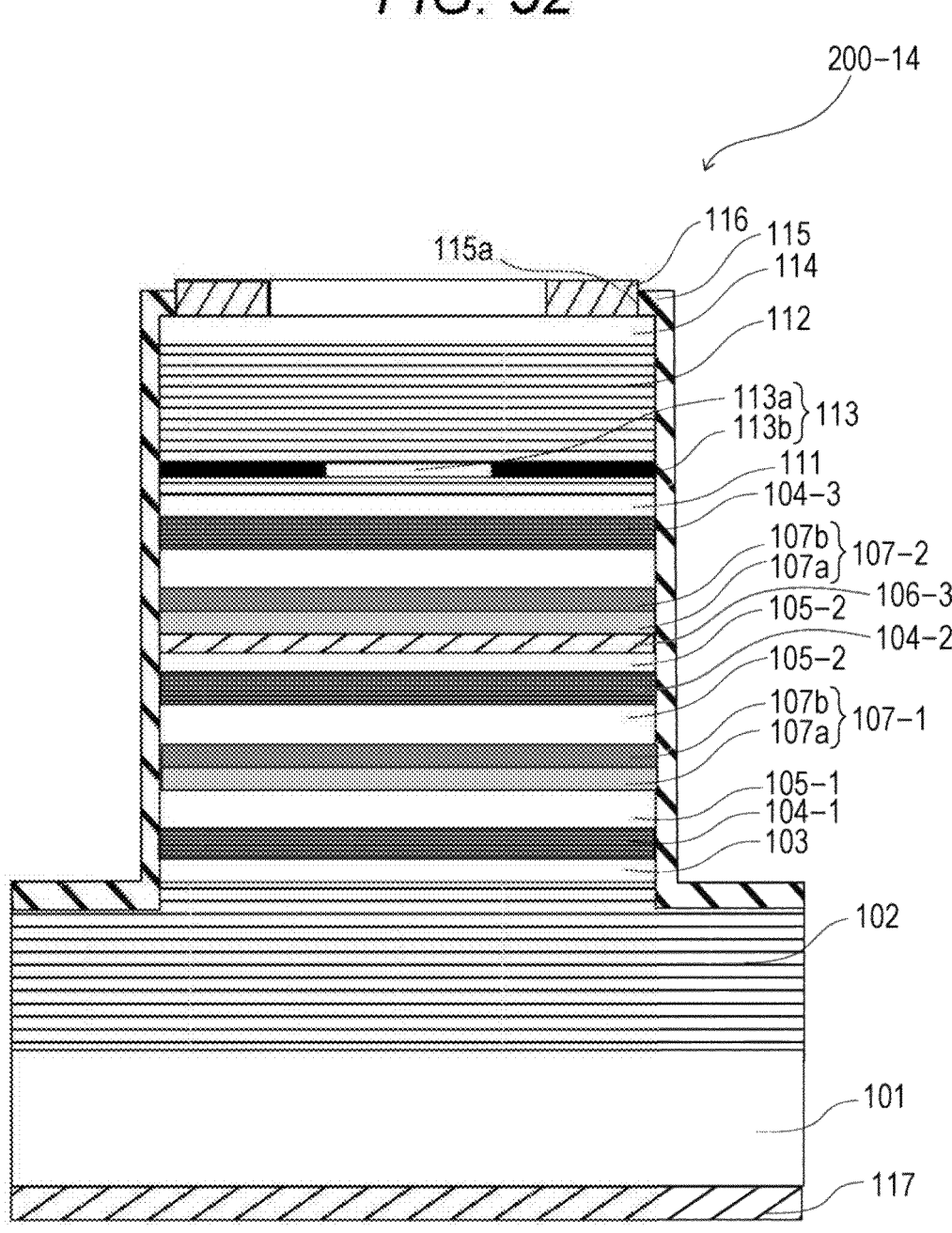
FIG. 52 is a cross-sectional view illustrating a configuration of a surface emitting laser according to Modification 12 of the second embodiment of the present technology.

As illustrated in FIG. 52, a surface emitting laser 200-14 of Modification 12 has a configuration similar to that of the surface emitting laser 200-8 of Modification 6 except that the first, second, and fourth composition gradient layers 106-1, 106-2, and 106-4 are not provided.

Although the surface emitting laser 200-14 has a lower degree of improvement in light emission characteristics than the surface emitting laser 200-8, it is effective in that the layer configuration can be further simplified and the number of lamination steps when a laminate is generated at the time of manufacturing can be reduced by three.

(Modification 13)

Figure 53:
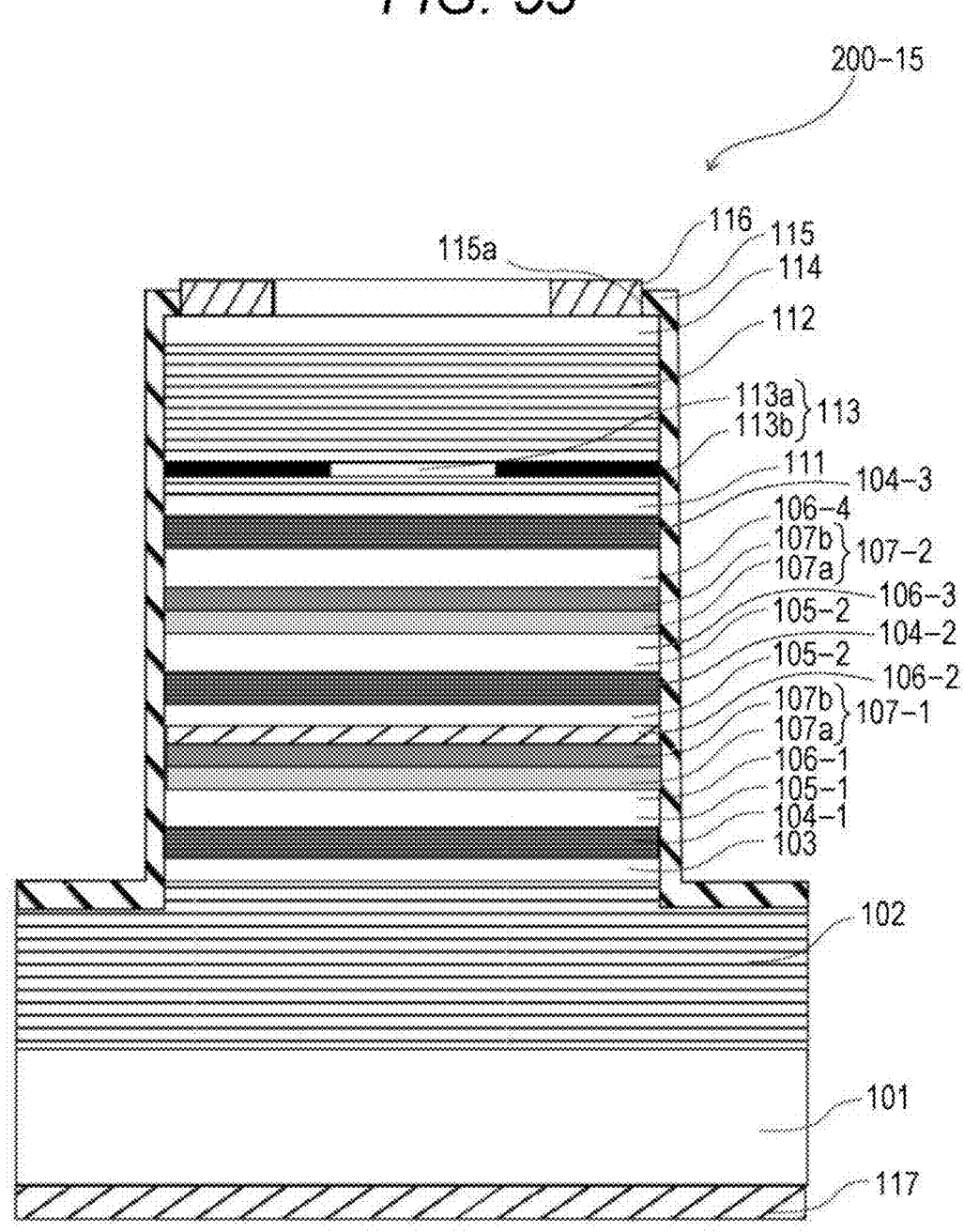
FIG. 53 is a cross-sectional view illustrating a configuration of a surface emitting laser according to Modification 13 of the second embodiment of the present technology.

As illustrated in FIG. 53, a surface emitting laser 200-15 of Modification 13 has a configuration similar to that of the surface emitting laser 200-8 of Modification 6 except that the first, third, and fourth composition gradient layers 106-1, 106-3, and 106-4 are not provided.

Although the surface emitting laser 200-15 has a lower degree of improvement in light emission characteristics than the surface emitting laser 200-8, it is effective in that the layer configuration can be further simplified and the number of lamination steps when a laminate is generated at the time of manufacturing can be reduced by three.

(Modification 14)

Figure 54:
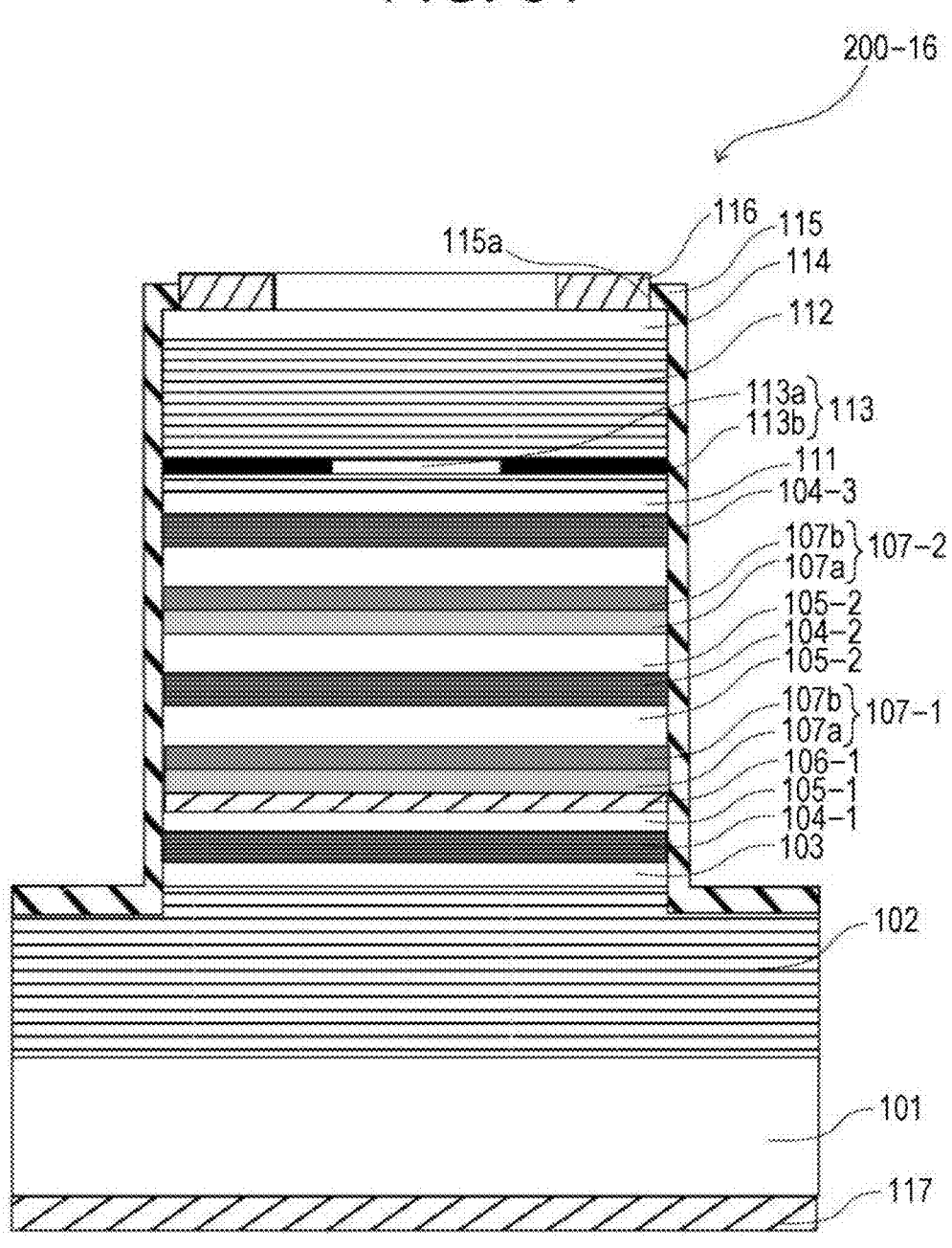
FIG. 54 is a cross-sectional view illustrating a configuration of a surface emitting laser according to Modification 14 of the second embodiment of the present technology.

As illustrated in FIG. 54, a surface emitting laser 200-16 of Modification 14 has a configuration similar to that of the surface emitting laser 200-8 of Modification 6 except that the second, third, and fourth composition gradient layers 106-2, 106-3, and 106-4 are not provided.

Although the surface emitting laser 200-16 has a lower degree of improvement in light emission characteristics than the surface emitting laser 200-8, it is effective in that the layer configuration can be further simplified and the number of lamination steps when a laminate is generated at the time of manufacturing can be reduced by three.

In the above Modifications 6 to 14, the case where the number of active layers is three and the number of tunnel junctions is two has been mainly described, but also in the case where the number of active layers is four or more and the number of tunnel junctions is three or more, similar effects can be obtained by appropriately disposing the composition gradient layer as in Modifications 6 to 14.

Figure 55:
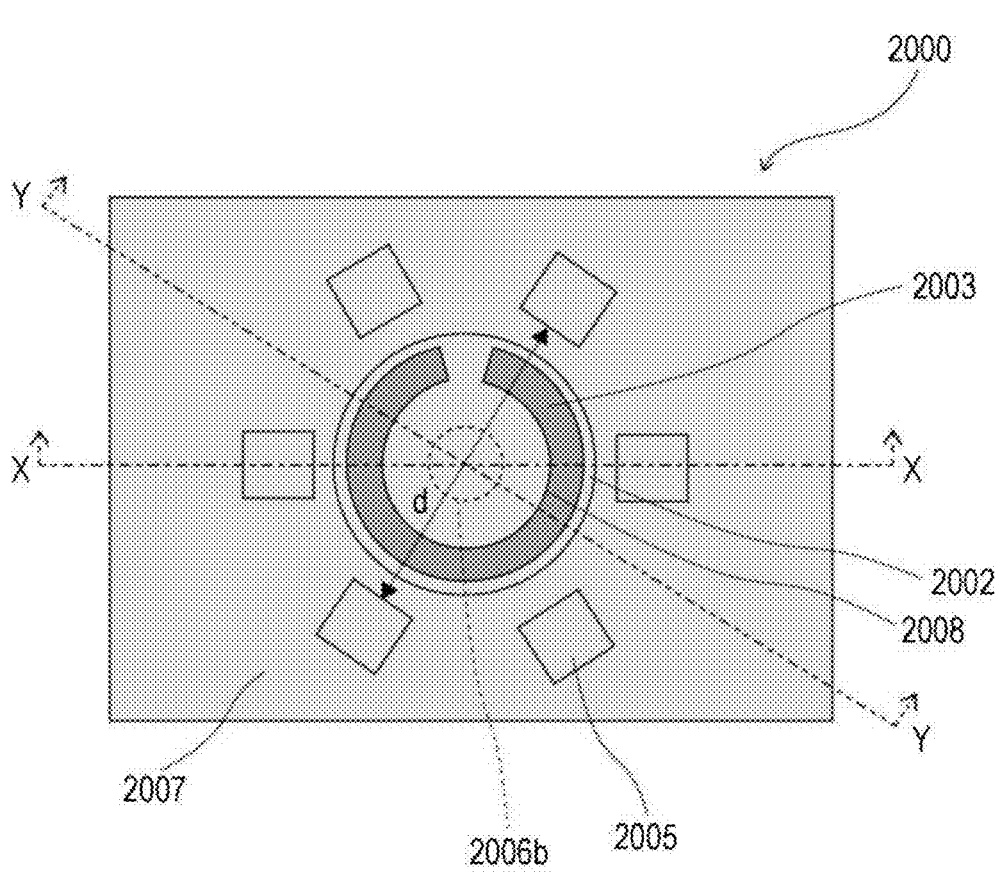
FIG. 55 is a plan view illustrating a configuration example of a surface emitting laser to which the present technology can be applied.

5. Configuration Example of Surface Emitting Laser to which Present Technology can be Applied FIG. 55 is a plan view illustrating a surface emitting laser 2000 which is a configuration example of a surface emitting laser to which the present technology can be applied. FIG. 56A is a cross-sectional view along line X-X of FIG. 55. FIG. 56B is a cross-sectional view along line Y-Y of FIG. 55.

Each component of the surface emitting laser 2000 is laminated on a substrate 2001. The substrate 2001 can include, for example, a semiconductor such as GaAs, InGaAs, InP, or InAsP.

The surface emitting laser 2000 includes a protective region 2002 (the transparent gray region in FIGS. 56A and 56B). As illustrated in FIG. 55, the protective region 2002 has a circular shape in plan view, but may have another shape such as an elliptical shape or a polygonal shape, but is not limited to a specific shape. The protective region 2002 includes a material that provides electrical isolation and is, for example, an ion-implanted region.

Further, as illustrated in FIGS. 56A and 56B, the surface emitting laser 2000 includes a first electrode 2003 and a second electrode 2004. As illustrated in FIG. 55, the first electrode 2003 has a ring shape having discontinuous portions (intermittent portions), that is, a split ring shape in plan view, but is not limited to a specific shape. As illustrated in FIG. 56A or 56B, the second electrode 2004 is in contact with the substrate 2001. The first electrode 2003 and the second electrode 2004 include, for example, a conductive material such as Ti, Pt, Au, AuGeNi, or PdGeAu. The first electrode 2003 and the second electrode 2004 may have a single layer structure or a laminated structure.

Further, the surface emitting laser 2000 includes a trench 2005 provided around the protective region 2002. FIG. 55 illustrates, as an example, a structure in which the trenches 2005 having a rectangular shape in plan view are provided at 6 portions, but the number of the trenches and the shape in plan view are not limited to specific ones. The trench 2005 is an opening for forming the oxide confinement layer 2006 (including an oxidized region 2006a and a non-oxidized region 2006b). In the manufacturing step of the surface emitting laser 2000, high-temperature water vapor is supplied via the trench 2005 to form the oxidized region 2006a of the oxide confinement layer 2006. For example, the oxidized region 2006a is $Al_2O_3$ formed as a result of the oxidation of the AlAs or AlGaAs layer. An arbitrary dielectric may be embedded in the trench 2005 after the step of forming the oxide confinement layer 2006. In addition, surface coating with a dielectric film may be performed.

Further, the surface emitting laser 2000 includes a dielectric opening 2008 (contact hole) provided in a dielectric layer 2007 on the first electrode 2003. The dielectric layer 2007 may have a laminated structure as illustrated in FIGS. 56A and 56B, or may have a single layer structure. As an example, the dielectric layer 2007 includes silicon oxide, silicon nitride, or the like. As illustrated in FIG. 55, the dielectric opening 2008 is formed in the same shape as the first electrode 2003. However, the shape of the dielectric opening 2008 is not limited to the shape of the first electrode 2003, and may be partially formed on the first electrode 2003. The dielectric opening 2008 is filled with a conductive material (not illustrated), and the conductive material comes into contact with the first electrode 2003.

Further, as illustrated in FIGS. 56A and 56B, the surface emitting laser 2000 includes an optical opening 2009 inside the first electrode 2003. The surface emitting laser 2000 emits a light beam through the optical opening 2009. Further, in the surface emitting laser 2000, the oxidized region 2006a of the oxide confinement layer 2006 functions as a current/light confinement region that confines current and light. The non-oxidized region 2006b of the oxide confinement layer 2006 is located below the optical opening 2009 and functions as a current/light passing region that passes current and light.

Further, the surface emitting laser 2000 includes a first multilayer reflector 2011 and a second multilayer reflector 2012. The multilayer reflector is a semiconductor multilayer reflector as an example, and is also referred to as a distributed Bragg reflector.

Further, the surface emitting laser 2000 includes an active layer 2013. The active layer 2013 is disposed between the first multilayer reflector 2011 and the second multilayer reflector 2012, confines the injected carriers, and defines the emission wavelength of the surface emitting laser 2000.

In the present configuration example, as an example, the case where the surface emitting laser 2000 is a front surface emitting type surface emitting laser has been described as an example, but the surface emitting laser 2000 can also constitute a back surface emitting type surface emitting laser.

As illustrated in FIGS. 55 and 56A, the substantial diameter of the surface emitting laser 2000 of the present configuration example is the diameter d of the virtual circle defined by the trench 2005.

As an example, the surface emitting laser 2000 of the present configuration example is manufactured by the procedure of the following steps 1 to 8.

(Step 1) Epitaxial growth of the first multilayer reflector 2011, the active layer 2013, a selected oxide layer serving as the oxide confinement layer 2006, and the second multilayer reflector 2012 is performed on the front surface of the substrate 2001.

(Step 2) The first electrode 2003 is formed on the second multilayer reflector 2012 using, for example, a lift-off method.

(Step 3) The trench 2005 is formed by, for example, photolithography.

(Step 4) A side surface of the selected oxide layer is exposed, and the oxide confinement layer 2006 is formed by selectively oxidizing the selected oxide layer from the side surface.

(Step 5) The protective region 2002 is formed by ion implantation or the like.

(Step 6) A film of the dielectric layer 2007 is formed by, for example, vapor deposition, sputtering, or the like.

(Step 7) The dielectric opening 2008 is formed in the dielectric layer 2007 by, for example, photolithography to expose the contact of the first electrode 2003.

(Step 8) After the back surface of the substrate 2001 is polished and thinned, the second electrode 2004 is formed on the back surface of the substrate 2001.

The number of layers, arrangement, thickness, arrangement order, symmetry, and the like of the layers constituting the surface emitting laser 2000 described above are examples, and can be appropriately changed. That is, the surface emitting laser 2000 may include more layers, fewer layers, different layers, layers of different structures, or layers of different arrangements than those illustrated in FIGS. 55, 56A, and 56B.

The present technology can be applied to the surface emitting laser 2000 described above and modifications thereof.

6. Modification of Present Technology

The present technology is not limited to each of the above-described embodiments and modifications, and various modifications can be made.

For example, the n-type semiconductor layer of the tunnel junction may include a plurality of regions that are laminated together and formed by different materials.

For example, the n-type semiconductor layer of the tunnel junction may be a GaAs layer doped with a GaAs-based compound semiconductor, for example, Si at a high concentration ($1\times10^{19}$ cm$^{-3}$), for example, having a thickness of 20 nm.

For example, the guide/barrier region of the active layer may include a GaAsP-based compound semiconductor (for example, GaAsP$_{0.10}$).

For example, in the p-type semiconductor layer of the tunnel junction, the first p-type semiconductor region may be formed by an InGaAs-based compound semiconductor, and the second p-type semiconductor region may be formed by a GaAs-based compound semiconductor.

The carrier concentrations of the first p-type semiconductor region 107a1 and the second p-type semiconductor region 107a2 are preferably different from each other, and for example, the carrier concentration of the first p-type semiconductor region 107a1 may be higher than the carrier concentration of the second p-type semiconductor region 107a2.

The band gaps of the first p-type semiconductor region 107a1 and the second p-type semiconductor region 107a2 are preferably different from each other, and for example, the band gap of the second p-type semiconductor region 107a2 may be smaller than the band gap of the first p-type semiconductor region 107a1.

It is preferable that the first p-type semiconductor region 107a1 and the second p-type semiconductor region 107a2 are different in at least one of carrier concentrations or band gaps.

The carrier concentrations of the first p-type semiconductor region 107a1 and the second p-type semiconductor region 107a2 may be the same.

The band gaps of the first p-type semiconductor region 107a1 and the second p-type semiconductor region 107a2 may be the same.

The Al compositions of the first p-type semiconductor region 107a1 and the second p-type semiconductor region 107a2 are preferably different from each other, and for example, the Al composition of the second p-type semiconductor region 107a2 may be smaller than the Al composition of the first p-type semiconductor region 107a1.

The Al compositions of the first p-type semiconductor region 107a1 and the second p-type semiconductor region 107a2 may be the same.

In the surface emitting laser according to the present technology, the current confinement layer 113 is not necessarily provided.

In the surface emitting laser according to the present technology, the contact layer 114 is not necessarily provided.

In each of the above-described embodiments and modifications, both the first and second multilayer film reflectors 102 and 112 are semiconductor multilayer film reflectors, but the present technology is not limited thereto.

For example, the first multilayer film reflector 102 may be a semiconductor multilayer film reflector, and the second multilayer film reflector 112 may be a dielectric multilayer film reflector. The dielectric multilayer film reflector is also a kind of distributed Bragg reflector.

For example, the first multilayer film reflector 102 may be a dielectric multilayer film reflector, and the second multilayer film reflector 112 may be a semiconductor multilayer film reflector.

For example, both the first and second multilayer film reflectors 102 and 112 may be dielectric multilayer film reflectors.

The semiconductor multilayer film reflector has low light absorption and conductivity. From this viewpoint, the semiconductor multilayer film reflector is suitable for the second multilayer film reflector 112 on the emission side (front surface side) and on the current path from the anode electrode 116 to each active layer.

On the other hand, the dielectric multilayer film reflector has extremely low light absorption. From this viewpoint, the dielectric multilayer film reflector is suitable for the second multilayer film reflector 112 on the emission side (front surface side).

In each of the above embodiments and modifications, the front surface emitting type surface emitting laser that emits laser light from the mesa top has been described as an example, but the present technology is also applicable to a back surface emitting type surface emitting laser that emits laser light from the back surface of the substrate.

In this case, it is preferable to use a substrate transparent to the oscillation wavelength as the substrate, or to provide an opening serving as an emission port in the substrate.

In each of the above embodiments and modifications, the surface emitting laser 10 using an AlGaAs-based compound semiconductor has been described as an example, but the present technology is also applicable to, for example, a surface emitting laser using a GaN-based compound semiconductor.

Specifically, a GaN-based semiconductor multilayer film reflector may be used for at least one of the first multilayer film reflector 102 or the second multilayer film reflector 112, or a GaN-based dielectric multilayer film reflector may be used for at least one of the first and second multilayer film reflectors 102 and 112.

Examples of the GaN-based compound semiconductor used for at least one of the first multilayer film reflector 102 or the second multilayer film reflector 112 include GaN/AlGaN.

Some of the configurations of the surface emitting laser of each of the above embodiments and modifications may be combined within a range in which they do not contradict each other.

In each of embodiments and modifications described above, the material, conductivity type, doping concentration, thickness, width, and the like of each layer constituting the surface emitting laser can be appropriately changed within a range functioning as the surface emitting laser.

7. Application Example to Electronic Device

The technology according to the present disclosure (present technology) can be applied to various products (electronic devices). For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, and a robot.

The surface emitting laser according to the present technology can also be applied as, for example, a light source of a device that forms or displays an image by laser light (for example, a laser printer, a laser copier, a projector, a head-mounted display, a head-up display, or the like).

8. <Example in which Surface Emitting Laser is Applied to Distance Measuring Device>

Hereinafter, application examples of the surface emitting laser according to each of the above embodiments and modifications will be described.

Figure 57:
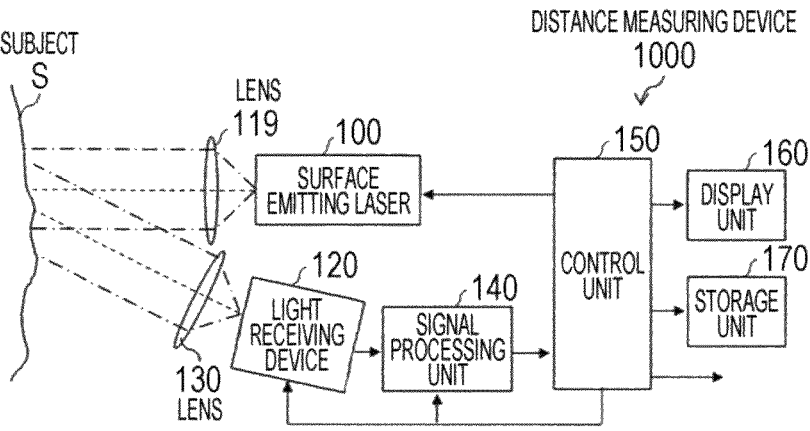
FIG. 57 is a diagram illustrating an application example of a surface emitting laser according to each embodiment of the present technology and its modification to a distance measuring device.

FIG. 57 illustrates an example of a schematic configuration of a distance measuring device 1000 including a surface emitting laser 100 as an example of an electronic device according to the present technology. The distance measuring device 1000 measures the distance to a subject S by a time of flight (TOF) method. The distance measuring device 1000 includes a surface emitting laser 100 as a light source. The distance measuring device 1000 includes, for example, a surface emitting laser 100, a light receiving device 120, lenses 119 and 130, a signal processing unit 140, a control unit 150, a display unit 160, and a storage unit 170.

The light receiving device 120 detects light reflected by the subject S. The lens 119 is a lens for collimating the light emitted from the surface emitting laser 100, and is a collimating lens. The lens 130 is a lens for condensing light reflected by the subject S and guiding the light to the light receiving device 120, and is a condensing lens.

The signal processing unit 140 is a circuit for generating a signal corresponding to a difference between a signal input from the light receiving device 120 and a reference signal input from the control unit 150. The control unit 150 includes, for example, a time to digital converter (TDC). The reference signal may be a signal input from the control unit 150, or may be an output signal of a detection unit that directly detects the output of the surface emitting laser 100. The control unit 150 is, for example, a processor that controls the surface emitting laser 100, the light receiving device 120, the signal processing unit 140, the display unit 160, and the storage unit 170. The control unit 150 is a circuit that measures the distance to the subject S on the basis of the signal generated by the signal processing unit 140. The control unit 150 generates a video signal for displaying information about the distance to the subject S, and outputs the video signal to the display unit 160. The display unit 160 displays information about the distance to the subject S on the basis of the video signal input from the control unit 150. The control unit 150 stores information about the distance to the subject S in the storage unit 170.

In the present application example, instead of the surface emitting laser 100, any one of the surface emitting lasers 100-1 to 100-13, 200, and 200-1 to 200-16 can be applied to the distance measuring device 1000.

9. <Example in which Distance Measuring Device is Mounted on Mobile Body>

Figure 58:
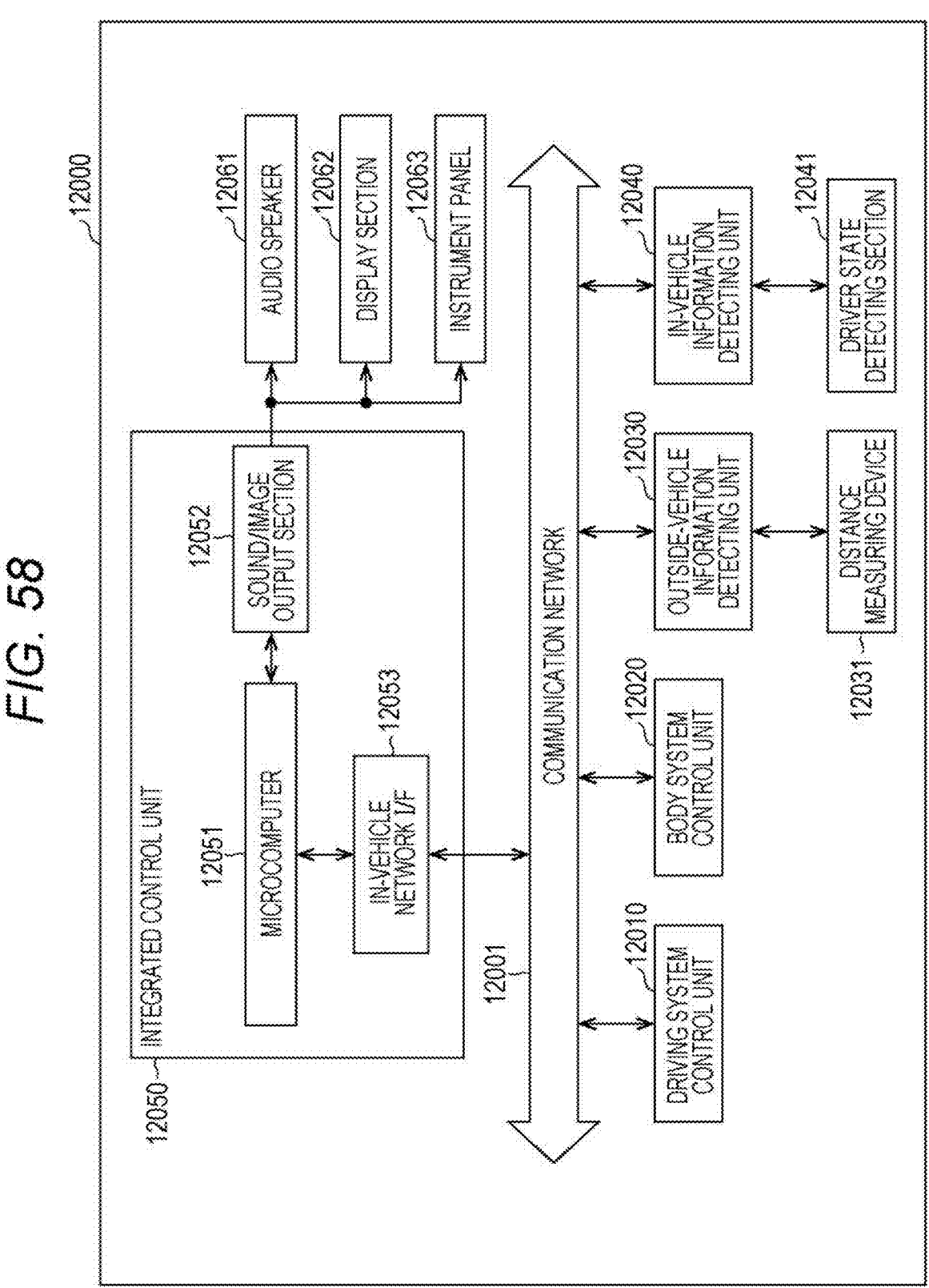
FIG. 58 is a block diagram illustrating an example of a schematic configuration of a vehicle control system.

FIG. 58 is a block diagram illustrating a schematic configuration example of a vehicle control system which is an example of a mobile body control system to which the technology according to the present disclosure can be applied.

A vehicle control system 12000 includes a plurality of electronic control units connected via a communication network 12001. In the example illustrated in FIG. 58, the vehicle control system 12000 includes a driving system control unit 12010, a body system control unit 12020, an outside-vehicle information detecting unit 12030, an in-vehicle information detecting unit 12040, and an integrated control unit 12050. Furthermore, as a functional configuration of the integrated control unit 12050, a microcomputer 12051, a sound/image output section 12052, and an in-vehicle network interface (I/F) 12053 are illustrated.

The driving system control unit 12010 controls the operation of devices related to the drive system of the vehicle according to various programs. For example, the driving system control unit 12010 functions as a control device of a driving force generation device for generating a driving force of the vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operations of various devices mounted on the vehicle body according to various programs. For example, the body system control unit 12020 functions as a control device of a keyless entry system, a smart key system, a power window device, or various lamps such as a head lamp, a back lamp, a brake lamp, a blinker, or a fog lamp. In this case, radio waves transmitted from a portable device that substitutes for a key or signals of various switches can be input to the body system control unit 12020. The body system control unit 12020 receives input of these radio waves or signals, and controls a door lock device, a power window device, a lamp, and the like of the vehicle.

The outside-vehicle information detecting unit 12030 detects information outside the vehicle on which the vehicle control system 12000 is mounted. For example, a distance measuring device 12031 is connected to the outside-vehicle information detecting unit 12030. The distance measuring device 12031 includes the above-described distance measuring device 1000. The outside-vehicle information detecting unit 12030 causes the distance measuring device 12031 to measure a distance to an object (subject S) outside the vehicle, and acquires distance data obtained by the measurement. The outside-vehicle information detecting unit 12030 may perform object detection processing of a person, a vehicle, an obstacle, a sign, or the like on the basis of the acquired distance data.

The in-vehicle information detecting unit 12040 detects information inside the vehicle. For example, a driver state detecting section 12041 that detects a state of a driver is connected to the in-vehicle information detecting unit 12040. The driver state detecting section 12041 includes, for example, a camera that captures an image of the driver, and the in-vehicle information detecting unit 12040 may calculate the degree of fatigue or the degree of concentration of the driver or may determine whether or not the driver is dozing off on the basis of the detection information input from the driver state detecting section 12041.

The microcomputer 12051 can calculate a control target value of the driving force generation device, the steering mechanism, or the braking device on the basis of the information inside and outside the vehicle acquired by the outside-vehicle information detecting unit 12030 or the in-vehicle information detecting unit 12040, and output a control command to the driving system control unit 12010. For example, the microcomputer 12051 can perform cooperative control for the purpose of implementing functions of an advanced driver assistance system (ADAS) including collision avoidance or impact mitigation of the vehicle, follow-up traveling based on an inter-vehicle distance, vehicle speed maintenance traveling, vehicle collision warning, vehicle lane departure warning, or the like.

Furthermore, the microcomputer 12051 controls the driving force generation device, the steering mechanism, the braking device, or the like on the basis of the information around the vehicle acquired by the outside-vehicle information detecting unit 12030 or the in-vehicle information detecting unit 12040, thereby performing cooperative control for the purpose of automated driving or the like in which the vehicle autonomously travels without depending on the operation of the driver.

Furthermore, the microcomputer 12051 can output a control command to the body system control unit 12020 on the basis of the vehicle exterior information acquired by the outside-vehicle information detecting unit 12030. For example, the microcomputer 12051 can perform cooperative control for the purpose of preventing glare, such as switching from a high beam to a low beam, by controlling the head lamp according to the position of a preceding vehicle or an oncoming vehicle detected by the outside-vehicle information detecting unit 12030.

The sound/image output section 12052 transmits an output signal of at least one of a sound or an image to an output device capable of visually or audibly notifying an occupant of the vehicle or the outside of the vehicle of information. In the example of FIG. 58, an audio speaker 12061, a display section 12062, and an instrument panel 12063 are illustrated as the output device. The display section 12062 may include, for example, at least one of an on-board display or a head-up display.

Figure 59:
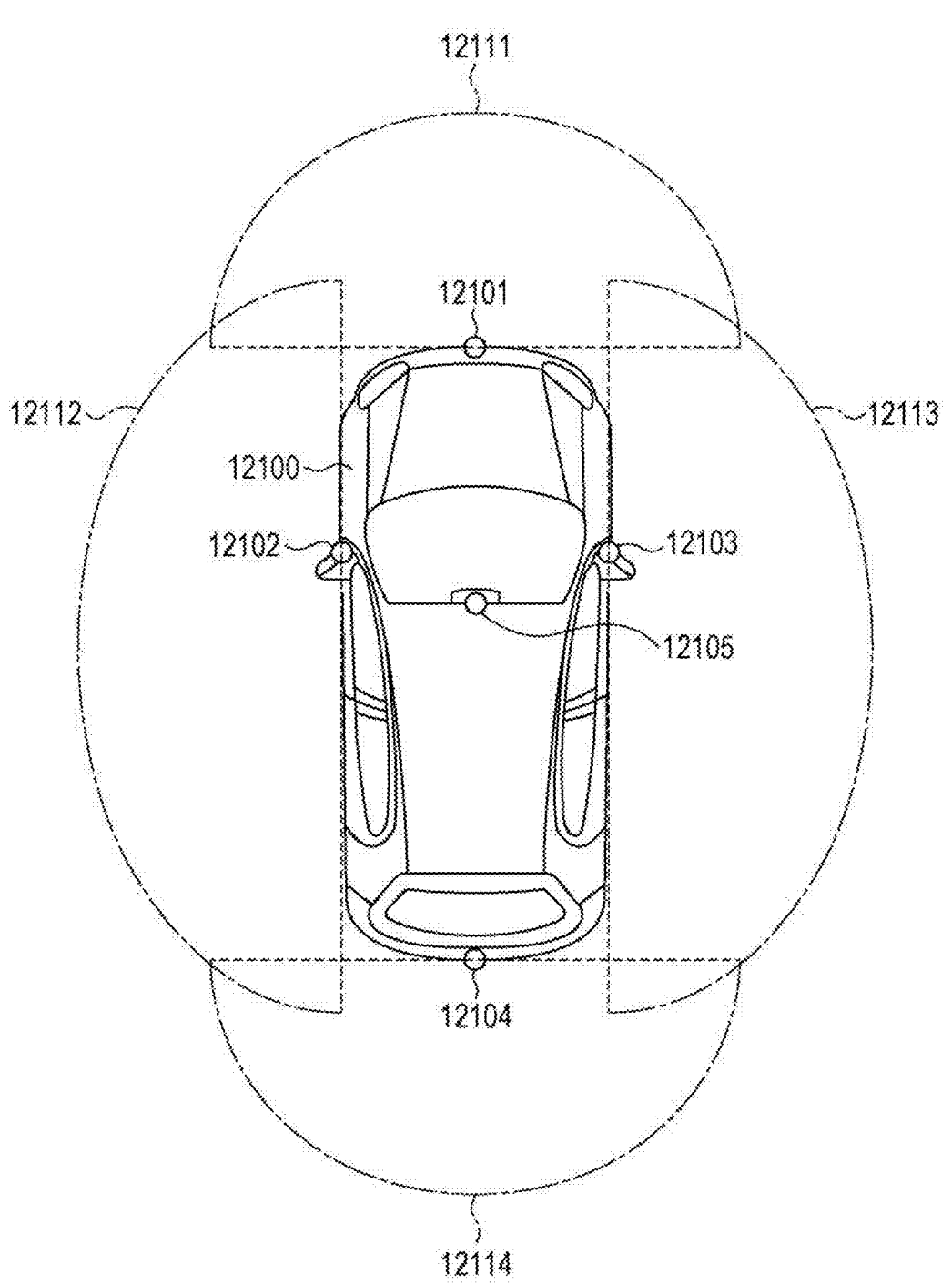
FIG. 59 is an explanatory view illustrating an example of installation positions of a distance measuring device.

FIG. 59 is a view illustrating an example of an installation position of the distance measuring device 12031.

In FIG. 59, a vehicle 12100 includes distance measuring devices 12101, 12102, 12103, 12104, and 12105 as the distance measuring device 12031.

The distance measuring devices 12101, 12102, 12103, 12104, and 12105 are provided, for example, at positions such as a front nose, side mirrors, a rear bumper, a back door, and an upper portion of a windshield in a vehicle interior of the vehicle 12100. The distance measuring device 12101 provided at the front nose and the distance measuring device 12105 provided at the upper portion of the windshield in the vehicle interior mainly acquire data in front of the vehicle 12100. The distance measuring devices 12102 and 12103 provided at the side mirrors mainly acquire data on the sides of the vehicle 12100. The distance measuring device 12104 provided on the rear bumper or the back door mainly acquires data behind the vehicle 12100. The data in front of the vehicle acquired by the distance measuring devices 12101 and 12105 is mainly used for detecting a preceding vehicle, a pedestrian, an obstacle, a traffic light, a traffic sign, or the like.

Note that FIG. 59 illustrates an example of detection ranges of the distance measuring devices 12101 to 12104. A detection range 12111 indicates a detection range of the distance measuring device 12101 provided on the front nose, detection ranges 12112 and 12113 indicate detection ranges of the distance measuring devices 12102 and 12103 provided on the side mirrors, respectively, and a detection range 12114 indicates a detection range of the distance measuring device 12104 provided on the rear bumper or the back door.

For example, the microcomputer 12051 obtains a distance to each three-dimensional object in the detection ranges 12111 to 12114 and a temporal change of the distance (relative speed with respect to the vehicle 12100) on the basis of the distance data obtained from the distance measuring devices 12101 to 12104, thereby extracting, as a preceding vehicle, a three-dimensional object traveling at a predetermined speed (for example, 0 km/h or more) in substantially the same direction as the vehicle 12100, in particular, the closest three-dimensional object on a traveling path of the vehicle 12100. Furthermore, the microcomputer 12051 can set an inter-vehicle distance to be secured in advance in front of the preceding vehicle, and can perform automatic brake control (including follow-up stop control), automatic acceleration control (including follow-up start control), and the like. In this way, it is possible to perform cooperative control for the purpose of automated driving or the like in which the vehicle autonomously travels without depending on the operation of the driver.

For example, on the basis of the distance data obtained from the distance measuring devices 12101 to 12104, the microcomputer 12051 can classify three-dimensional object data regarding three-dimensional objects into two-wheeled vehicles, ordinary vehicles, large vehicles, pedestrians, and other three-dimensional objects such as utility poles, extract the three-dimensional object data, and use the three-dimensional object data for automatic avoidance of obstacles. For example, the microcomputer 12051 identifies obstacles around the vehicle 12100 as obstacles that can be visually recognized by the driver of the vehicle 12100 and obstacles that are difficult to visually recognize. Then, the microcomputer 12051 determines a collision risk indicating a risk of collision with each obstacle, and when the collision risk is a setting value or more and there is a possibility of collision, the microcomputer can perform driving assistance for collision avoidance by outputting an alarm to the driver via the audio speaker 12061 or the display section 12062 or performing forced deceleration or avoidance steering via the driving system control unit 12010.

An example of a mobile body control system to which the technology according to the present disclosure can be applied has been described above. The technology according to the present disclosure can be applied to the distance measuring device 12031 among the configurations described above.

The specific numerical values, shapes, materials (including compositions), and the like described in the present specification are merely examples, and the present technology is not limited thereto.

Furthermore, the present technology can also have the following configurations.

(1) A surface emitting laser including:

first and second multilayer film reflectors;

a plurality of active layers laminated together between the first and second multilayer film reflectors; and a tunnel junction disposed between first and second active layers adjacent to each other in a lamination direction among the plurality of active layers, in which the tunnel junction includes an n-type semiconductor layer and a p-type semiconductor layer laminated together, and the p-type semiconductor layer includes first and second p-type semiconductor regions laminated together.

(2) The surface emitting laser according to (1), in which the first p-type semiconductor region is disposed between the n-type semiconductor layer and the second p-type semiconductor region.

(3) The surface emitting laser according to (1) or (2), in which the first p-type semiconductor region is in contact with the n-type semiconductor layer.

(4) The surface emitting laser according to any one of (1) to (3), in which the second p-type semiconductor region is in contact with the first p-type semiconductor region.

(5) The surface emitting laser according to any one of (1) to (4), in which carrier concentrations of the first p-type semiconductor region and the second p-type semiconductor region are different from each other.

(6) The surface emitting laser according to any one of (1) to (5), in which band gaps of the first p-type semiconductor region and the second p-type semiconductor region are different from each other.

(7) The surface emitting laser according to any one of (1) to (6), in which a carrier concentration of the second p-type semiconductor region is higher than a carrier concentration of the first p-type semiconductor region.

(8) The surface emitting laser according to any one of (1) to (7), in which a band gap of the first p-type semiconductor region is smaller than a band gap of the second p-type semiconductor region.

(9) The surface emitting laser according to any one of (1) to (18), further including a composition gradient layer disposed between the first active layer and the tunnel junction and/or between the second active layer and the tunnel junction.

(10) The surface emitting laser according to (9), further including a spacer layer disposed between an active layer and the composition gradient layer, the active layer having the composition gradient layer disposed between the tunnel junction and one of the first and second active layers.

(11) The surface emitting laser according to any one of (1) to (10), in which the plurality of active layers is at least three active layers including the first and second active layers, the tunnel junction is disposed between two adjacent active layers of each set of a plurality of sets of two adjacent active layers among the plurality of active layers, and a composition gradient layer is disposed between at least one tunnel junction among a plurality of the tunnel junctions and at least one of the two adjacent active layers sandwiching the one tunnel junction.

(12) The surface emitting laser according to any one of (1) to (11), in which the first p-type semiconductor region is formed by a GaAs compound semiconductor, an AlGaAs-based compound semiconductor, or an InGaAs-based compound semiconductor.

(13) The surface emitting laser according to any one of (1) to (12), in which the second p-type semiconductor region is formed by a GaAs compound semiconductor, an AlGaInAs-based compound semiconductor, or an AlGaAs-based compound semiconductor.

(14) The surface emitting laser according to any one of claims (1) to (13), in which Al compositions of the first p-type semiconductor region and the second p-type semiconductor region are different from each other.

(15) The surface emitting laser according to any one of (1) to (14), in which an Al composition of the second p-type semiconductor region is higher than an Al composition of the first p-type semiconductor region.

(16) The surface emitting laser according to any one of (1) to (15), in which the first p-type semiconductor region and/or the second p-type semiconductor region is doped with at least one of C, Zn, Mg, or Be.

(17) A surface emitting laser including:

first and second multilayer film reflectors;

a plurality of active layers laminated together between the first and second multilayer film reflectors;

a tunnel junction disposed between adjacent first and second active layers among the plurality of active layers; and a composition gradient layer disposed between the first active layer and the tunnel junction and/or between the second active layer and the tunnel junction.

(18) The surface emitting laser according to (17), further including: a spacer layer disposed between an active layer and the composition gradient layer, the active layer having the composition gradient layer disposed between the tunnel junction and one of the first and second active layers.

(19) The surface emitting laser according to (17) or (18), in which the plurality of active layers is at least three active layers including the first and second active layers, the tunnel junction is disposed between two adjacent active layers of each set of a plurality of sets of two adjacent active layers among the plurality of active layers, and a composition gradient layer is disposed between at least one tunnel junction among a plurality of the tunnel junctions and at least one of the two adjacent active layers sandwiching the one tunnel junction.

(20) The surface emitting laser according to any one of (17) to (19), in which the tunnel junction includes an n-type semiconductor layer and a p-type semiconductor layer laminated together, and the p-type semiconductor layer includes first and second p-type semiconductor regions laminated together.

(21) The surface emitting laser according to (20), in which the first p-type semiconductor region is disposed between the n-type semiconductor layer and the second p-type semiconductor region.

(22) The surface emitting laser according to (20) or (21), in which the first p-type semiconductor region is in contact with the n-type semiconductor layer.

(23) The surface emitting laser according to any one of (20) to (22), in which the second p-type semiconductor region is in contact with the first p-type semiconductor region.

(24) The surface emitting laser according to any one of (20) to (23), in which carrier concentrations of the first p-type semiconductor region and the second p-type semiconductor region are different from each other.

(25) The surface emitting laser according to any one of (20) to (24), in which band gaps of the first p-type semiconductor region and the second p-type semiconductor region are different from each other.

(26) The surface emitting laser according to any one of (20) to (25), in which a carrier concentration of the second p-type semiconductor region is higher than a carrier concentration of the first p-type semiconductor region.

(27) The surface emitting laser according to any one of (20) to (26), in which a band gap of the first p-type semiconductor region is smaller than a band gap of the second p-type semiconductor region.

(28) The surface emitting laser according to any one of (20) to (27), in which the first p-type semiconductor region is formed by a GaAs compound semiconductor, an AlGaAs-based compound semiconductor, or an InGaAs-based compound semiconductor.

(29) The surface emitting laser according to any one of (20) to (28), in which the second p-type semiconductor region is formed by a GaAs compound semiconductor, an AlGaInAs-based compound semiconductor, or an AlGaAs-based compound semiconductor.

(30) The surface emitting laser according to any one of (20) to (29), in which Al compositions of the first p-type semiconductor region and the second p-type semiconductor region are different from each other.

(31) The surface emitting laser according to any one of (20) to (30), in which an Al composition of the second p-type semiconductor region is higher than an Al composition of the first p-type semiconductor region.

(32) The surface emitting laser according to any one of (20) to (31), in which the first p-type semiconductor region and/or the second p-type semiconductor region is doped with at least one of C, Zn, Mg, or Be.

(33) A surface emitting laser array in which the surface emitting lasers according to any one of (1) to (32) are two-dimensionally arranged.

(34) An electronic device including the surface emitting laser according to (1) to (32).

(35) An electronic device including the surface emitting laser array according to (33).

REFERENCE SIGNS LIST 100, 100-1 to 100-13, 200, 200-1 to 200-16 Surface emitting laser
101 Substrate
102 First multilayer film reflector
104, 104-1 First active layer
105 First spacer layer (spacer layer)
106, 106-1 First composition gradient layer (composition gradient layer)
107 Tunnel junction
107-1 First tunnel junction (tunnel junction)
107-2 Second tunnel junction (tunnel junction)
107-3 Third tunnel junction (tunnel junction)
107-4 Fourth tunnel junction (tunnel junction)
107a p-type semiconductor layer
107a1 First p-type semiconductor region 107a2 Second p-type semiconductor region
107b n-type semiconductor layer
108, 108-2 Second composition gradient layer (composition gradient layer)
109 Second spacer layer (spacer layer)
110, 104-2 Second active layer
112 Second multilayer film reflector

The invention claimed is:

1. A surface emitting laser comprising:
first and second multilayer film reflectors;
a plurality of active layers laminated together between the first and second multilayer film reflectors; and
a tunnel junction disposed between first and second active layers adjacent to each other in a lamination direction among the plurality of active layers,
wherein the tunnel junction includes an n-type semiconductor layer and a p-type semiconductor layer laminated together, and
the p-type semiconductor layer includes first and second p-type semiconductor regions laminated together.

2. The surface emitting laser according to claim 1, wherein the first p-type semiconductor region is disposed between the n-type semiconductor layer and the second p-type semiconductor region.

3. The surface emitting laser according to claim 1, wherein the first p-type semiconductor region is in contact with the n-type semiconductor layer.

4. The surface emitting laser according to claim 1, wherein the second p-type semiconductor region is in contact with the first p-type semiconductor region.

5. The surface emitting laser according to claim 1, wherein carrier concentrations of the first p-type semiconductor region and the second p-type semiconductor region are different from each other.

6. The surface emitting laser according to claim 1, wherein band gaps of the first p-type semiconductor region and the second p-type semiconductor region are different from each other.

7. The surface emitting laser according to claim 2, wherein a carrier concentration of the second p-type semiconductor region is higher than a carrier concentration of the first p-type semiconductor region.

8. The surface emitting laser according to claim 2, wherein a band gap of the first p-type semiconductor region is smaller than a band gap of the second p-type semiconductor region.

9. The surface emitting laser according to claim 1, further comprising a composition gradient layer disposed between the first active layer and the tunnel junction and/or between the second active layer and the tunnel junction.

10. The surface emitting laser according to claim 9, further comprising a spacer layer disposed between an active layer and the composition gradient layer, the active layer having the composition gradient layer disposed between the tunnel junction and one of the first and second active layers.

11. The surface emitting laser according to claim 1,
wherein the plurality of active layers is at least three active layers including the first and second active layers,
the tunnel junction is disposed between two adjacent active layers of each set of a plurality of sets of two adjacent active layers among the plurality of active layers, and
a composition gradient layer is disposed between at least one tunnel junction among a plurality of the tunnel junctions and at least one of the two adjacent active layers sandwiching the one tunnel junction.

12. The surface emitting laser according to claim 2, wherein the first p-type semiconductor region is formed by a GaAs compound semiconductor, an AlGaAs-based compound semiconductor, or an InGaAs-based compound semiconductor.

13. The surface emitting laser according to claim 2, wherein the second p-type semiconductor region is formed by a GaAs compound semiconductor, an AlGaInAs-based compound semiconductor, or an AlGaAs-based compound semiconductor.

14. The surface emitting laser according to claim 1, wherein Al compositions of the first p-type semiconductor region and the second p-type semiconductor region are different from each other.

15. The surface emitting laser according to claim 2, wherein an Al composition of the second p-type semiconductor region is higher than an Al composition of the first p-type semiconductor region.

16. The surface emitting laser according to claim 1, wherein the first p-type semiconductor region and/or the second p-type semiconductor region is doped with at least one of C, Zn, Mg, or Be.

* * * * *